(12) United States Patent
Suzuki

(10) Patent No.: US 11,545,649 B2
(45) Date of Patent: Jan. 3, 2023

(54) DISPLAY DEVICE AND ELECTRONIC APPARATUS WITH RELATIVE MISALIGNMENT BETWEEN PIXEL AND COLOR FILTER

(71) Applicant: Sony Group Corporation, Tokyo (JP)

(72) Inventor: Masaki Suzuki, Tokyo (JP)

(73) Assignee: Sony Group Corporation, Tokyo (JP)

( * ) Notice: Subject to any disclaimer, the term of this patent is extended or adjusted under 35 U.S.C. 154(b) by 33 days.

(21) Appl. No.: 17/036,568

(22) Filed: Sep. 29, 2020

(65) Prior Publication Data

US 2021/0028404 A1    Jan. 28, 2021

Related U.S. Application Data

(63) Continuation of application No. 16/079,269, filed as application No. PCT/JP2017/005961 on Feb. 17, 2017, now Pat. No. 10,826,022.

(30) Foreign Application Priority Data

Mar. 31, 2016  (JP) .............................. JP2016-069878

(51) Int. Cl.
*H01L 51/52* (2006.01)
*H01L 27/32* (2006.01)

(52) U.S. Cl.
CPC ........ *H01L 51/5271* (2013.01); *H01L 27/322* (2013.01); *H01L 27/3209* (2013.01); *H01L 51/5275* (2013.01)

(58) Field of Classification Search
CPC ............. H01L 51/5271; H01L 51/5275; H01L 27/3209; H01L 27/322; H05B 33/23; H05B 33/22; H05B 33/12; H05B 33/24
(Continued)

(56) References Cited

U.S. PATENT DOCUMENTS

| 6,617,784 B1 | 9/2003 | Abe et al. |
| 2004/0165097 A1 | 8/2004 | Drowley et al. |

(Continued)

FOREIGN PATENT DOCUMENTS

| JP | 07-205322 A | 8/1995 |
| JP | 2004-213909 A | 7/2004 |

(Continued)

*Primary Examiner* — Matthew E. Gordon
(74) *Attorney, Agent, or Firm* — Michael Best & Friedrich LLP

(57) ABSTRACT

[Object] To make it possible to improve light extraction efficiency while realizing a desired viewing angle characteristic for each pixel.
[Solution] Provided is a display device, including: a plurality of light emitting sections formed on a substrate; and reflectors provided above the light emitting sections with respect to the plurality of light emitting sections positioned in at least a partial region of a display surface, lower surfaces of the reflectors reflecting part of emission light from the light emitting sections. The light emitting sections and the reflectors are arranged in a state in which centers of the reflectors are shifted from centers of luminescence surfaces of the light emitting sections in a plane perpendicular to a stacking direction so that light emitted in a direction other than a desired direction among the emission light from the light emitting sections is reflected.

14 Claims, 27 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2013/0214301 A1 | 8/2013 | Yamada et al. | |
| 2016/0035803 A1 | 2/2016 | Kim et al. | |
| 2017/0179437 A1* | 6/2017 | Kim | ................... H01L 51/5271 |
| 2019/0379005 A1* | 12/2019 | Im | ...................... H01L 51/5271 |

FOREIGN PATENT DOCUMENTS

| | | |
|---|---|---|
| JP | 2004-259607 A | 9/2004 |
| JP | 2005-087707 A | 4/2005 |
| JP | 2009-272069 A | 11/2009 |
| JP | 2011-228229 A | 11/2011 |
| JP | 2015-015114 A | 1/2015 |
| WO | WO-2012043611 A1 | 4/2012 |

* cited by examiner

DISPLAY DEVICE AND ELECTRONIC APPARATUS WITH RELATIVE MISALIGNMENT BETWEEN PIXEL AND COLOR FILTER

CROSS REFERENCE TO RELATED APPLICATION

This application is a Continuation Application of application Ser. No. 16/079,269, filed Aug. 23, 2019, which is a 371 Nationalization of PCT/JP2017/005961, filed Feb. 17, 2017 and claims the benefit of Japanese Priority Patent Application JP 2016-069878 filed on Mar. 31, 2016, the entire contents of which are incorporated herein by reference.

TECHNICAL FIELD

The present disclosure relates to a display device and an electronic apparatus.

BACKGROUND ART

In display devices, various techniques for improving light extraction efficiency have been developed for the purpose of increasing brightness. For example, a display device in which light from a plurality of light emitting elements formed on a thin film transistor (TFT) substrate is emitted via an opposite substrate arranged on a side opposite to the TFT substrate, and a layer having a recursive reflection structure is formed between the TFT substrate and the light emitting element for each pixel is disclosed in Patent Literature 1. According to the display device disclosed in Patent Literature 1, light emitted from the light emitting element toward the TFT substrate side is reflected toward the opposite substrate side by the recursive reflection structure, and thus it is possible to improve the light extraction efficiency and realize high luminance.

CITATION LIST

Patent Literature

Patent Literature 1: JP 2015-15114A

DISCLOSURE OF INVENTION

Technical Problem

Here, in the display device, there is also a demand to control a viewing angle, that is, a direction of an emitted light beam for each pixel while realizing high luminance. In the technique described in Patent Literature 1, such viewing angle control is not particularly mentioned. In view of the above circumstances, there has been a demand for a technique for improving light extraction efficiency while realizing a desired viewing angle characteristic for each pixel.

In this regard, the present disclosure proposes a display device and an electronic apparatus which are novel and improved and capable of improving light extraction efficiency while realizing a desired viewing angle characteristic for each pixel.

Solution to Problem

According to the present disclosure, there is provided a display device, including: a plurality of light emitting sections formed on a substrate; and reflectors provided above the light emitting sections with respect to the plurality of light emitting sections positioned in at least a partial region of a display surface, lower surfaces of the reflectors reflecting part of emission light from the light emitting sections. The light emitting sections and the reflectors are arranged in a state in which centers of the reflectors are shifted from centers of luminescence surfaces of the light emitting sections in a plane perpendicular to a stacking direction so that light emitted in a direction other than a desired direction among the emission light from the light emitting sections is reflected.

In addition, according to the present disclosure, there is provided an electronic apparatus, including: a display device configured to perform display on a basis of an image signal. The display device includes a plurality of light emitting sections formed on a substrate, and reflectors provided above the light emitting sections with respect to the plurality of light emitting sections positioned in at least a partial region of a display surface, lower surfaces of the reflectors reflecting part of emission light from the light emitting sections, and the light emitting sections and the reflectors are arranged in a state in which centers of the reflectors are shifted from centers of luminescence surfaces of the light emitting sections in a plane perpendicular to a stacking direction so that light emitted in a direction other than a desired direction among the emission light from the light emitting sections is reflected.

According to the present disclosure, for each light emitting section (for example, a light emitting element in the case of an organic EL display) (that is, for each pixel), the reflector is installed above the light emitting section to reflect light emitted in a direction other than a desired direction among the emission light from the light emitting section. Therefore, in the pixel including the light emitting section, only the light from the region in which the reflector is not installed is emitted, that is, light is emitted only in a desired direction. Therefore, it is possible to realize a desired viewing angle characteristic for each pixel. Further, the light reflected by the reflector among the emission light from the light emitting section is reflected again by the luminescence surface of the light emitting section (or the interface between lower layers) and finally emitted from the region in which the reflector is not installed. Therefore, it is possible to suppress a decrease in the light extraction efficiency. As described above, according to the present disclosure, it is possible to improve light extraction efficiency while realizing a desired viewing angle characteristic for each pixel.

Advantageous Effects of Invention

As described above, according to the present disclosure, it is possible to improve light extraction efficiency while realizing a desired viewing angle characteristic for each pixel. Note that the effects described above are not necessarily limitative. With or in the place of the above effects, there may be achieved any one of the effects described in this specification or other effects that may be grasped from this specification.

MODE(S) FOR CARRYING OUT THE INVENTION

Figure 1:
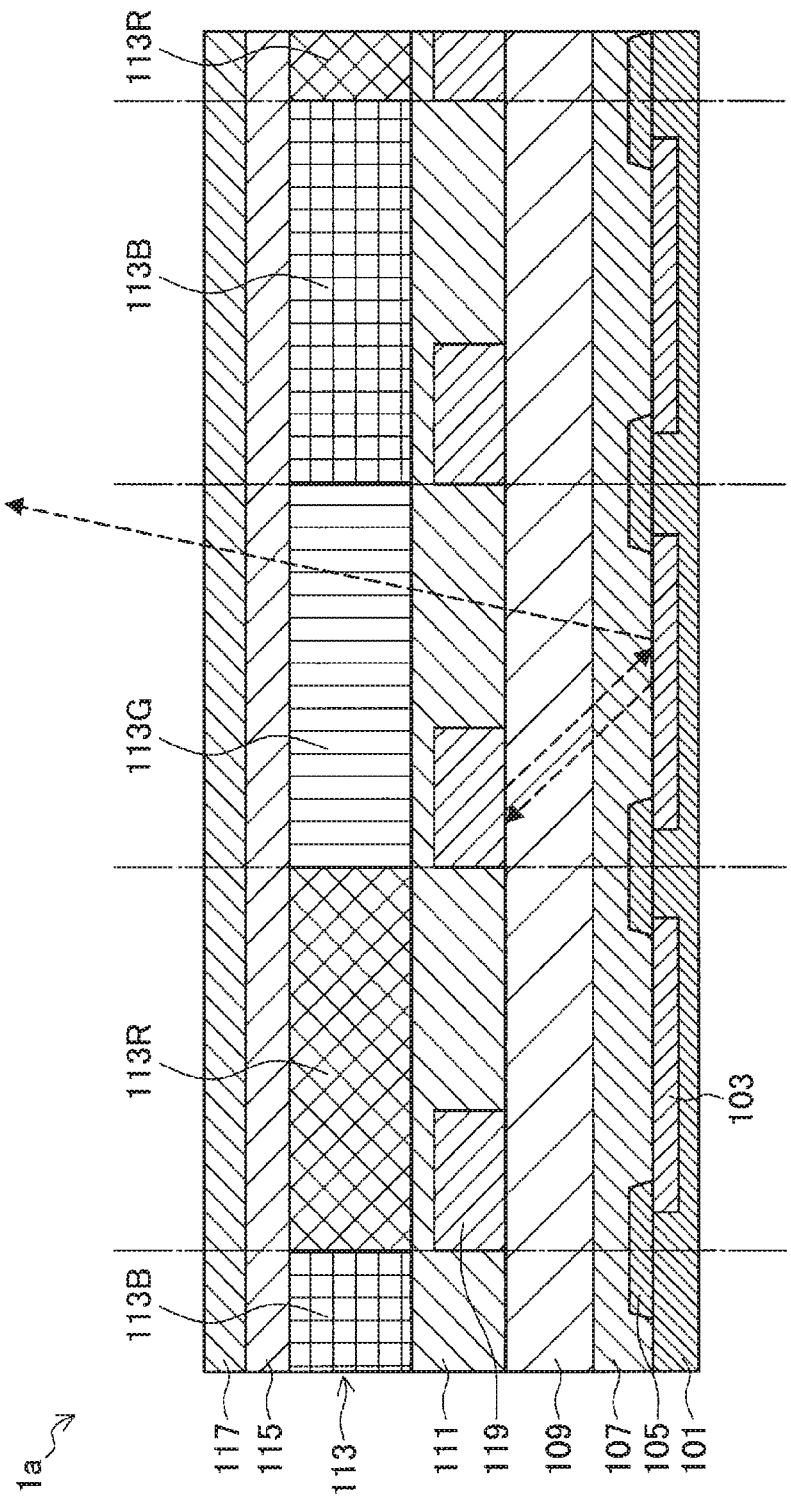
FIG. 1 is a cross-sectional view showing a configuration example of a display device according to a first embodiment.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Further, the description will proceed in the following order.
1. First embodiment
1-1. Configuration of display device
1-2. Modified example
2. Second embodiment
2-1. Background to second embodiment
2-2. Configuration of display device
2-3. Modified examples
2-3-1. First modified example
2-3-2. Second modified example
2-3-3. Third to fifth modified examples
3. Third embodiment
3-1. Configuration of display device
3-2. Modified example
4. Amount of misalignment of CF
5. Modified example
5-1. Method of causing relative misalignment between light emitting element and CF
5-2. Other methods of setting amount of misalignment L of CF
6. Specific configuration example of display device
7. Application examples
8. Supplement Further, hereinafter, an embodiment in which a display device is organic electro-luminescence (EL) display (OELD) will be described as an example of the present disclosure. However, the present disclosure is not limited to this example, and the display device that is an object of the present disclosure may be various display devices as long as they are display devices that can achieve color display using color filters (CFs), such as a liquid crystal display, a plasma display, and an electronic paper device.

1. FIRST EMBODIMENT 1-1. Configuration of Display Device

The configuration of a display device according to a first embodiment of the present disclosure will now be described with reference to FIG. 1. FIG. 1 is a cross-sectional view showing a configuration example of a display device according to the first embodiment. FIG. 1 shows a schematic partial cross-sectional view of a display device according to the first embodiment.

Referring to FIG. 1, a display device 1*a* according to the first embodiment mainly includes a first substrate 101, a plurality of light emitting elements 103 each of which includes an OLED formed on the first substrate 101 and emits white light, and a CF layer 113 in which CFs of some colors are formed to correspond to the light emitting elements 103 on the light emitting elements 103. Further, a second substrate 117 containing a material transparent to the light from the light emitting element 103 is placed on the CF layer 113. Although not shown, on the first substrate 11, thin film transistors (TFTs) for driving the light emitting elements 103 are provided to correspond to the light emitting elements 103. An arbitrary light emitting element 103 is selectively driven by the TFT, then light from the driven light emitting element 103 passes through the corresponding CF, and the color of the light is converted appropriately and the converted light is emitted from the upper side via the second substrate 117; thereby, desired images, characters, etc. are displayed.

Note that, in the following description, the stacking direction of the layers in the display device 1*a* is referred to also as an up and down direction. In this event, the side on which the first substrate 101 is placed is defined as an up side, and the side on which the second substrate 117 is placed is defined as a down side. Further, a plane perpendicular to the up and down direction is referred to also as a horizontal plane.

Thus, the display device 1*a* shown in FIG. 1 is a top emission display device capable of color display that is driven by an active matrix system. However, the first embodiment is not limited to this example, and the display device according to the first embodiment may be a display device that is driven by another system such as a passive matrix system, or may be a bottom emission display device that emits light via the first substrate 101.

Note that the display device 1*a* may be mounted on various electronic apparatuses having a display function. Specifically, the display device 1*a* may be used as, for example, a monitor device that is incorporated in a television device, an electronic book, a smartphone, a personal digital assistant (PDA), a notebook personal computer (PC), a video camera, a game apparatus, or the like. Alternatively, the display device 1*a* may be used for an EVF of a digital camera, an HMD, or the like.

As illustrated in FIG. 1, in further detail, a display device 1*a* is configured such that a light emitting element 103, a first member 107, a protection film 109, a planarizing film 111, and a CF layer 113 are stacked on a first substrate 101 in the described order. As described above, the display device 1*a* is a display device of a so-called on-chip color filter (OCCF) scheme in which the CF layer 113 is formed over the first substrate 101 on which the light emitting element 103 is formed. In this configuration, a second substrate 117 is bonded to the CF layer 113 of the uppermost layer with a sealing resin film 115 interposed therebetween, so that the display device 1*a* is manufactured.

Further, on the first substrate 101, a pixel defining film 105 defining a pixel region is formed between the adjacent light emitting elements 103. The pixel defining film 105 is formed to have an opening exposing the light emitting element 103 in a portion corresponding to the light emitting element 103. The surface exposed in the opening of the light emitting element 103 corresponds to a luminescence surface of the light emitting element 103. Further, the first member 107 is stacked to bury the opening of the pixel defining film 105. In other words, emission light from the light emitting element 103 passes through the first member 107, the protection film 109, the planarizing film 111, the CF layer 113, the sealing resin film 115, and the second substrate 117 and is emitted toward the outside.

The CF layer 113 is formed so that a CF of each color having a predetermined area is positioned above each light emitting element 103. In the illustrated example, the CF layer 113 is provided such that a red CF 113R, a green CF 113G, and a blue CF 113B each having a prescribed area are continuously distributed in an in-plane direction. Note that, in the following description, in a case where there is no need to particularly distinguish the CF 113R, the CF 113G, and the CF 113B, one or a plurality of these may be written as simply a CF 113*a*.

One pixel is formed by a combination of one light emitting element 103 and one CF 113*a*. Note that, in practice, in the display device 1*a*, one pixel may include sub-pixels of four colors, namely, a pixel in which the CF 113R is provided (that is, a red pixel), a pixel in which the CF 113G is provided (that is, a green pixel), a pixel in which the CF 113B is provided (that is, a blue pixel), and a pixel in which the CF 113*a* is not provided (that is, a white pixel). However, in the present specification, also a combination of one light emitting element 103 and one CF 113*a* is referred to as simply a pixel, for convenience of description. In FIG. 1, for the sake of description, a boundary between pixels is indicated by an alternate long and short dash line. Further, in the display device 1, sub-pixels of four colors may be arranged in what is called a delta arrangement (see also FIG. 6 described later).

In the first embodiment, as illustrated in the drawing, in each pixel, a CF 113*a* corresponding to the light emitting element 103 is arranged such that the center of the luminescence surface of the light emitting element 103 in a horizontal surface substantially coincides with the center of the CF 113*a*.

Further, in the display device 1*a*, a reflector 119 that reflects the emission light from the light emitting element 103 therebelow is formed above the light emitting element 103 for each pixel. In the illustrated example, the reflector 119 is formed below the CF layer 113, specifically in the planarizing film 111. Specifically, the display device 1*a* has a configuration in which, after the protection film 109 is formed, the reflector 119 is formed on the protection film 109 and the planarizing film 111 is formed thereon. Here, in the first embodiment, the reflector 119 may be formed above the light emitting element 103, and an arrangement position of the reflector 119 in a stacking direction is not limited to this example. The arrangement position of the reflector 119 in the stacking direction, that is, a layer in which the reflector 119 is formed may appropriately be decided in consideration of compatibility between a material of the reflector 119 and a material of each layer constituting the display device 1*a*, an ease of manufacturing, a function of the reflector 119 to be described later, or the like. Here, if the function of the reflector 119 to be described later is considered, in order to more efficiently reflect the emission light from the light emitting element 103, it is preferable that the reflector 119 is formed at a position closer to the light emitting element 103 in the stacking direction.

A reflective surface (that is, a lower surface) of the reflector 119 has a recursive structure and has a function of reflecting incident light toward an incident direction. In the first embodiment, as a recursive structure of the reflector 119, a so-called prism type in which a plurality of corner cube prisms (CCP) are regularly arranged is used. In a case in which the recursive structure is the prism type, for example, the reflector 119 can be formed by appropriately processing a surface of a metallic film in a shape of a prism through a transfer technique, an etching technique or the like. Here, the first embodiment is not limited to this example, and a so-called bead type in which a plurality of beads are dispersedly arranged may be used as the recursive structure of the reflector 119. In a case in which the recursive structure is the prism type, for example, the reflector 119 is formed by a method of processing a resist material in a spherical shape or a hemispherical shape through a photoresist technique or dispersedly arranging appropriate particles in a resin film or the like. Further, the reflector 119 may be formed at the same time in a series of processes for forming respective layers on the first substrate 101, or the separately prepared reflector 119 may be boded onto the first substrate 101.

Here, in the first embodiment, in order to reflect light emitted in a direction other than a desired direction among the emission light from the light emitting element 103, the light emitting element 103 and the reflector 119 are arranged so that the center of the reflector 119 deviates from the center of the luminescence surface of the light emitting element 103 in the horizontal surface. According to this configuration, light entering a region in which the reflector 119 is not formed (that is, a desired direction in which light is desired to be extracted) among the emission light from the light emitting element 103 is directly emitted from the second substrate 117 to the outside without change. On the other hand, light entering a region in which the reflector 119 is formed among the emission light from the light emitting element 103 is reflected by the lower surface of the reflector 119. In this case, since the reflective surface of the reflector 119 has the recursive structure as described above, the light reflected by the reflector 119 heads off the light emitting element 103. Then, the light is reflected toward the region in which the reflector 119 is not formed in the surface of the light emitting element 103 (or an interface between lower layers) and is emitted to the outside from the second substrate 117 without change. In FIG. 1, a locus of the light beam performing such a behavior is simulatively indicated by a broken arrow.

As described above, according to the first embodiment, since the reflector 119 is formed in each pixel, the emission light from the pixel is emitted only from the region in which the reflector 119 is not formed. In other words, appropriately adjusting the arrangement position of the reflector 119 in the horizontal surface with respect to the luminescence surface of the light emitting element 103, it is possible to control a light emission direction from each pixel, that is, a viewing angle in each pixel. Further, at this time, since the reflective surface of the reflector 119 has the recursive structure, the light blocked and reflected by the reflector 119 among the emission light from the light emitting element 103 is reflected toward the direction of the light emitting element 103 and is emitted to the outside from the region in which the reflector 119 is not formed. Therefore, it is possible to suppress the decrease in the light extraction efficiency by forming the reflector 119. As described above, according to the display device 1a of the first embodiment, it is possible to improve the light extraction efficiency while realizing a desired viewing angle characteristic for each pixel.

In the first embodiment, the arrangement position of the reflector 119 in the horizontal surface in each pixel (that is, an amount of misalignment and a misalignment direction of the center of the reflector 119 with respect to the center of the luminescence surface of the light emitting element 103 in the horizontal surface) may be decided in accordance with the viewing angle required for pixel. At this time, the amount of misalignment and the misalignment direction of the center of the reflector 119 with respect to the center of the luminescence surface of the light emitting element 103 in the horizontal surface may have a distribution in the display surface. The viewing angle required for each pixel differs depending on a use application of the display device 1a, but it is generally considered that a pixel closer to an outer edge of the display surface is required to have a larger viewing angle in the outer edge direction. Therefore, preferably, the amount of misalignment of the center of the reflector 119 with respect to the center of the luminescence surface of the light emitting element 103 in the horizontal surface may be set to increase as it is closer to the outer edge of the display surface. Further, the misalignment direction of the center of the reflector 119 with respect to the center of the luminescence surface of the light emitting element 103 in the horizontal surface can be set to be a direction opposite to a direction from the center of the display surface toward the pixel since it is possible to obtain the viewing angle with respect to a direction opposite to the misalignment direction in a pixel in which the misalignment.

The configuration of the display device 1a according to the first embodiment has been described above. Further, in the above-described embodiment, the reflective surface of the reflector 119 has the recursive structure, but the first embodiment is not limited to this example. The reflective surface of the reflector 119 may be a mirror or a scatterer. In a case in which the reflective surface of the reflector 119 is a mirror or a scatterer, a proportion of light returning to the light emitting element 103 among the light reflected by the reflector 119 decreases as compared with the case in which the recursive structure is used. Accordingly, the effect of improving the light extraction efficiency is reduced, but as compared to the case in which a structure with low reflectance (for example, a light absorber or the like) is used in place of the reflector 119, an effect in that a constant light extraction efficiency is improved can be obtained.

Here, in this specification, partial cross-sectional views similar to FIG. 1 are schematically illustrated in FIGS. 2 and 4 and FIGS. 7 to 17 to be described later, and configurations of display devices according to other embodiments and modified examples of respective embodiments will be described. Here, cross-sectional structures illustrated in FIGS. 1, 2, and 4 and FIGS. 7 to 17 are those which are schematically illustrated by simplifying an actual configuration. An example of a further detailed structure of the display device according to embodiments and modified examples of the present disclosure will be described later with reference to FIG. 25.

1-2. Modified Example

A modified example of the first embodiment will be described. In the above-described embodiment, the display device 1a is a display device of an OCCF scheme in which the CF layer 113 is formed over the first substrate 101 on which the light emitting element 103 is formed. Here, the first embodiment is not limited to this example. The display device according to the first embodiment may be a display device of a so-called facing CF scheme which is manufactured by bonding a second substrate with a CF layer formed thereon to a first substrate on which a light emitting element is formed so that the CF layer faces the light emitting element.

Figure 2:
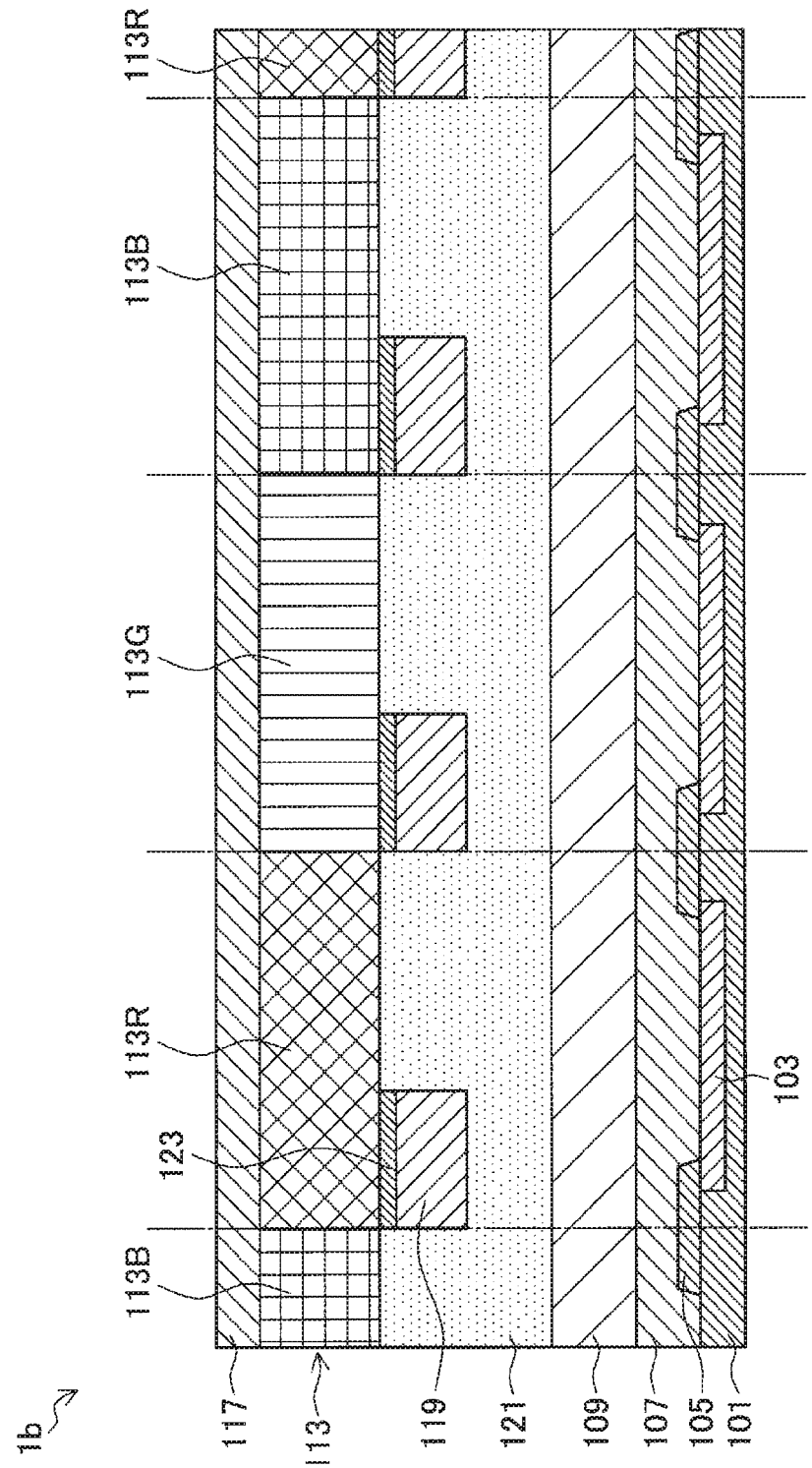
FIG. 2 is a cross-sectional view illustrating a configuration example of a display device of a facing CF scheme which is a modification example of the first embodiment.

A configuration of a display device of a facing CF scheme which is a modified example of the first embodiment will be described with reference to FIG. 2. FIG. 2 is a cross-sectional view illustrating a configuration example of a display device of a facing CF scheme which is a modified example of the first embodiment. Further, a display device 1b according to the present modified example differs from the display device 1a according to the first embodiment in a configuration in which a configuration above the protection film 109 is different due to a difference in manufacturing method and is similar in the other configuration to the display device 1a according to the first embodiment. Therefore, in the following description of the display device 1b according to the present modified example, different portions from the display device 1a described above will be mainly described, and detailed description of portions duplicating the display device 1a will be omitted.

Referring to FIG. 2, in the display device 1b according to the present modified example, a light emitting element 103, a first member 107, and a protection film 109 are stacked on a first substrate 101 in the described order. Further, a CF layer 113 and a reflector 119 are formed on a second substrate 117. Further, in the present modified example, an adhesive layer 123 for causing the CF layer 113 and the reflector 119 to adhere to each other is formed between the CF layer 113 and the reflector 119. Then, the second substrate 117 is bonded to the first substrate 101 via a sealing material 121 made of, for example, epoxy resin so that each of the light emitting elements 103 faces the CF 113a and the reflector 119 of each color, so that the display device 1b is manufactured.

Here, in a case in which the layer in which the reflector 119 is formed (the CF layer 113 in the case of the display device 1b) and the reflector 119 are formed of a similar material, adhesion therebetween is considered to be good, and thus the adhesive layer 123 need not be necessarily formed. At this time, if the layer in which the reflector 119 is formed and the process of forming the reflector 119 are similar, it is possible to consecutively form the components, and thus there are advantages in that excellent adhesion can be obtained, and the manufacturing process can be simplified. For example, as will be described below in detail (6. Specific configuration example of display device), the CF layer 113 can be formed by processing a resist material through a photoresist technique. Therefore, in a case in which the reflective surface of the reflector 119 is the recursive structure of the bead type, and the recursive structure is formed of a resist material, the CF layer 113 and the reflector 119 can be formed by a similar process using a similar material if the reflector 119 can be formed on the CF layer 113 as in the display device 1b. Therefore, in this case, the adhesive layer 123 need not be necessarily formed.

On the other hand, as described above, since the reflector 119 can have various configurations in the first embodiment, materials thereof are also various. Therefore, in a case in which the layer in which the reflector 119 is formed and the reflector 119 are made of different materials, the adhesion therebetween is unlikely to be necessarily excellent due to the compatibility of the materials. Therefore, in this case, it is preferable that the adhesive layer 123 be formed between both components as in the display device 1b. In the illustrated example, since the adhesive layer 123 is formed, it is possible to cause the CF layer 113 and the reflector 119 to adhere to each other suitably. In other words, whether or not the adhesive layer 123 is formed between the reflector 119 and the layer in which the reflector 119 is formed may be appropriately selected in consideration of materials of both components, a forming process, and the like.

The configuration of the display device 1b according to the present modified example has been described above. Similarly to the display device 1a according to the first embodiment, in the display device 1b having the above-described configuration, the reflector 119 is formed for each pixel to reflect the light emitted in the direction other than the desired direction among the emission light from the light emitting element 103. Therefore, similarly to the display device 1a, it is possible to obtain an effect in that it is possible to improve the light extraction efficiency while realizing a desired viewing angle characteristic for each pixel.

Here, in the facing CF scheme, since the display device 1b is manufactured by boding the second substrate 117 in which the CF layer 113 is formed to the first substrate 101 in which the light emitting element 103 is formed, there is a limit in the accuracy of alignment with the luminescence surface of each light emitting element 103 and each CF in the CF layer 113. On the other hand, as in the display device 1a, in the OCCF scheme, since the CF layer 113 is formed directly above the first substrate in which the light emitting element 103 is formed, it is possible to perform alignment between the luminescence surface of each light emitting element 103 and each CF of the CF layer 113 with a high degree of accuracy as compared with the facing CF scheme.

Further, as described above, in the display device 1a which is the OCCF scheme, the reflector 119 can be formed above the protection film 109, whereas in the display device 1b which is the facing CF scheme, the reflector 119 is formed directly below the CF layer 113. Therefore, in the case of the display device 1a, it is possible to further reduce a distance between the light emitting element 103 and the reflector 119. Therefore, it is possible to further increase the proportion at which the emission light from the light emitting element 103 is reflected by the reflector 119, further reduce a path until the emission light from the light emitting element 103 is reflected by the reflector 119 and returns to the light emitting element 103, and suppress attenuation in the emission light in the path.

On the other hand, since many organic EL displays are manufactured by the facing CF scheme, if the reflector 119 is considered to be newly added without substantially changing the current process, there is a possibility that the display device 1b which is of the facing CF scheme can be more simply implemented than the display device 1a which is the OCCF scheme.

In the first embodiment, the configuration of either the display device 1a or the display device 1b to be applied may be appropriately decided in consideration of the advantages when the facing CF scheme and the OCCF scheme described above are employed, respectively.

2. SECOND EMBODIMENT

2-1. Background to Second Embodiment

Before a second embodiment of the present disclosure is described, the background that the inventors invented the second embodiment will be described in order to facilitate understanding the second embodiment.

In recent years, display devices having a relatively small area display surface (for convenience, hereinafter referred to simply as small display devices) such as HMDs or EVFs of digital camera are increasingly mounted on electronic apparatuses. In such an electronic apparatus, a light beam from a display surface of the display device is caused to form an image on an eyeball of a user via an optical system of a lens, a mirror, a diffraction grating, etc. On the other hand, these days, the demand for further reduction in the weight and size of the electronic apparatus in order to reduce the burden on the user is great. To achieve reduction in the weight and size of the electronic apparatus, also the mounted optical system is required to achieve even more downsizing.

Figure 3:
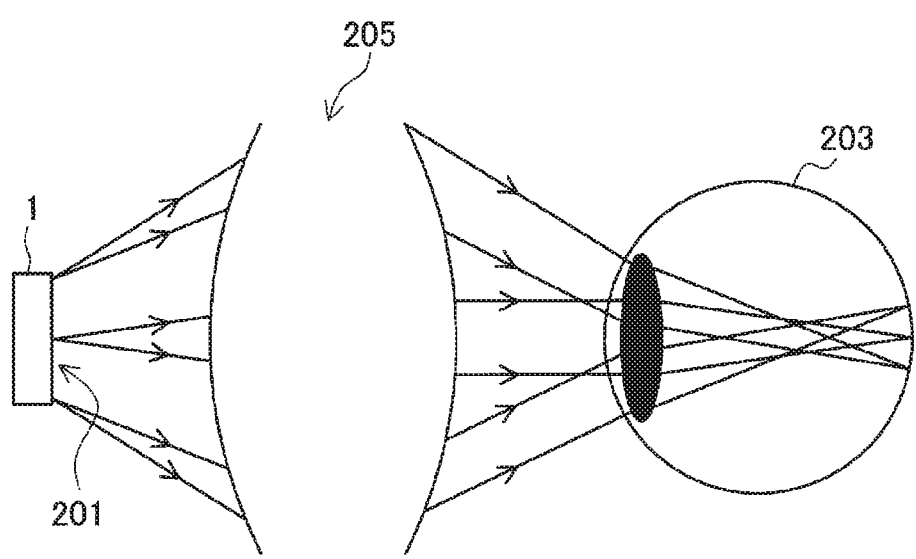
FIG. 3 is a diagram simulatively showing a locus of a light beam from a small-sized display device in an electronic apparatus to an eyeball of a user in a case where an optical system is downsized.

FIG. 3 is a diagram simulatively showing the locus of a light beam from a small-sized display device in an electronic apparatus to an eyeball of a user in a case where an optical system is downsized. As shown in FIG. 3, to achieve reduction in the weight and size of the electronic apparatus, it is necessary to downsize an optical system 205 and make narrower the distance between the optical system 205 and a display device 1. Further, since the optical system 205 cannot be made a complicated configuration, it is difficult to supplement the viewing angle characteristics of the display device 1 by modifying the configuration of the optical system 205. Therefore, a light beam with a wider angle (that is, a light beam with a wider viewing angle) among the light beams emitted from a display surface 201 of the display device 1 is guided to an eyeball 203 of a user while keeping almost the same characteristics as those when the light beam is emitted from the display surface 201 of the display device 1. For the above reasons, in a case where it is attempted to downsize the optical system 205 in an electronic apparatus in which the small-sized display device 1 is used, it is required that, in order to provide high quality display to the user, the display device 1 be able to emit a light beam having desired characteristics even at a wider viewing angle, that is, have more excellent wide viewing angle characteristics.

Here, as the display devices 1a and 1b described above, a display device of a system in which a pixel is formed by providing a CF on a white light emitting element and color display is performed by performing color conversion based on the CF on a pixel basis is commonly known. If it is attempted to achieve a wide viewing angle in a display device of such a system, the occurrence of what is called color mixing in which light from one light emitting element is incident on the CF of an adjacent pixel and light emission of a desired color is not obtained is a problem.

In this regard, various methods to suppress color mixing have been proposed until now. For example, there is known a method in which the distance between a light emitting element and a CF (facing gap) is set small as compared to the pixel size. Alternatively, there is known a method in which the area of a luminescence surface of a light emitting element is set much smaller than the area of a CF (the area in a plane perpendicular to the stacking direction).

However, these methods have the following disadvantages. For example, if it is attempted to obtain a structure of a narrow facing gap in a case where the display device is an organic EL display, it is necessary that an electrode layer, a protection layer, and a CF bonding layer be made thin films; hence, there is a concern that the luminescence characteristics and the protectiveness of the OLED will be greatly reduced. Further, reducing the area of the luminescence surface of the light emitting element leads to reducing the aperture ratio; hence, there is a concern that the luminance will be greatly reduced.

As described hereinabove, it is desired for a small-sized display device, such as one mounted on an electronic apparatus, to achieve even more improvement in wide viewing angle characteristics; however, in methods for achieving a wide viewing angle while suppressing color mixing that have been commonly proposed until now, there has been a concern that other characteristics will be reduced. In view of the circumstances mentioned above, the present inventors conducted extensive studies on technology for the display devices 1a and 1b according to the first embodiment described above that can suppress the occurrence of color mixing and can further improve wide viewing angle characteristics without causing reduction in other characteristics like those described above, such as a reduction in luminance; and consequently have conceived the second embodiment. In other words, in the second embodiment of the present disclosure, it is possible to provide a display device capable of obtaining an effect in that a wide viewing angle characteristic is further improved, and the occurrence of color mixing is further suppressed in addition to the effects obtained by the display devices 1a and 1b according to the first embodiment described above.

2-2. Configuration of Display Device

Figure 4:
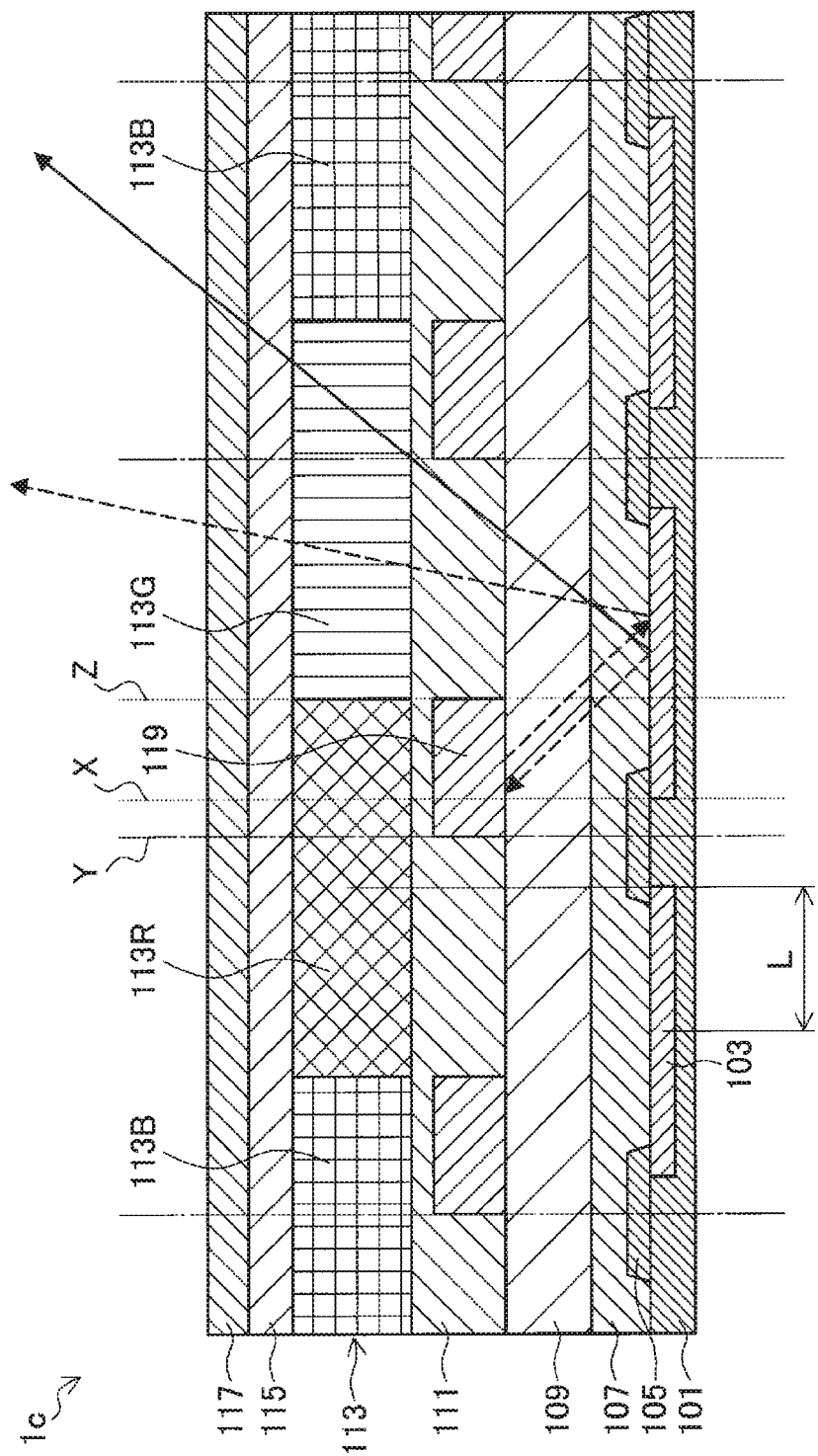
FIG. 4 is a cross-sectional view showing a configuration example of a display device according to a second embodiment.

A configuration of a display device according to the second embodiment of the present disclosure will be described with reference to FIG. 4. FIG. 4 is a cross-sectional view illustrating a configuration example of the display device according to the second embodiment. Further, a display device 1c according to the second embodiment differs from the display device 1a according to the first embodiment described above in that a configuration of the CF layer 113 is different and is similar in the other configurations to the display device 1a according to the first embodiment. Therefore, in the following description of the display device 1c according to the second embodiment, different portions from the display device 1a described above will be mainly described, and detailed description of portions duplicating the display device 1a will be omitted.

Referring to FIG. 4, the display device 1c according to the second embodiment is a display device of an OCCF scheme in which a light emitting element 103, a first member 107, a protection film. 109, a planarizing film 111, and a CF layer 113 are stacked on the first substrate 101 in the described order, similar to the display device 1a according to the first embodiment. In this configuration, a second substrate 117 is bonded to the CF layer 113 of the uppermost layer via a sealing resin film 115, so that a display device 1c is manufactured.

In the display device 1c, a configuration of the CF layer 113 differs from that in the display device 1a. Specifically, in the display device 1a, in each pixel, the CF 113a corresponding to the light emitting element 103 is arranged so that the center of the luminescence surface of the light emitting element 103 in the horizontal surface substantially coincides with the center of the CF 113a. On the other hand, in the display device 1c according to the present embodiment, a light emitting element 103 and the CF 113a corresponding to the light emitting element 103 are arranged such that the positions of the center of the luminescence surface of the light emitting element 103 and the center of the CF 113a are relatively shifted by a prescribed distance L in the horizontal plane, in at least a partial region in the display surface. In the illustrated example, the center of the CF 113a corresponding to the light emitting element 103 is placed to be shifted relative to the center of the luminescence surface of the light emitting element 103 in the right direction of the drawing sheet.

Note that, in the following description, the relative misalignment in the horizontal plane between the center of the luminescence surface of a light emitting element 103 and the center of the CF 113a corresponding to the light emitting element 103 is referred to also as simply a relative misalignment between the light emitting element 103 and the CF 113a. Further, the amount of relative misalignment L and the misalignment direction of the CF 113a to the center of the luminescence surface of the light emitting element 103 in the horizontal plane in the relative misalignment between the light emitting element 103 and the CF 113a are referred to also as simply the amount of misalignment L of the CF 113a and the misalignment direction of the CF 113a, respectively.

In the display device 1c, since the CF layer 113 is formed as described above, it is possible to obtain a wider viewing angle for each pixel. For example, a case in which green light is desired to be obtained as the light from the pixel to which the light emitting element 103 of interest now belongs is considered, if the light emitted from the light emitting element 103 in a relatively wide viewing angle direction as indicated by a solid arrow in the drawing is considered, in a case in which relative misalignment does not occur between the light emitting element 103 and the CF 113a as in the first embodiment, the light emitted at the angle is considered to pass through a blue CF 113B of an adjacent pixel instead of a green CF 113E through which it is desired to pass originally. In other words, color mixing occurs, and the desired green light is unable to be obtained. On the other hand, as illustrated in FIG. 4, in the configuration according to the second embodiment, a relative position of the CF 113a to the light emitting element 103 is shifted by the amount of misalignment L in the horizontal surface, and thus the light emitted from the light emitting element 103 at the above angle passes through the CF 113G and is emitted from the display device 1. Therefore, the desired green light can be obtained. As described above, in the configuration according to the second embodiment, the green pixel including the light emitting element 103 of interest is regarded as having a wider viewing angle in a right direction on a page plane which is a direction in which the CF 113G is shifted.

Thus, in the second embodiment, a relative misalignment between the light emitting element 103 and the CF 113a is created for a pixel, and thereby the viewing angle characteristics of the pixel in the misalignment direction of the CF 113a can be improved.

Here, the viewing angle characteristics required of pixels vary in accordance with the position in the display surface of the display device 1c. Therefore, in the second embodiment, the amount of misalignment L and the misalignment direction of the CF 113a in each pixel are set such that a desired viewing angle is obtained in the pixel in accordance with the position of the light emitting element 103 (that is, the position of the pixel) in the display surface. That is, in the second embodiment, each of the amount of misalignment and the misalignment direction of the CF 113a has a distribution in the display surface.

Figure 5:
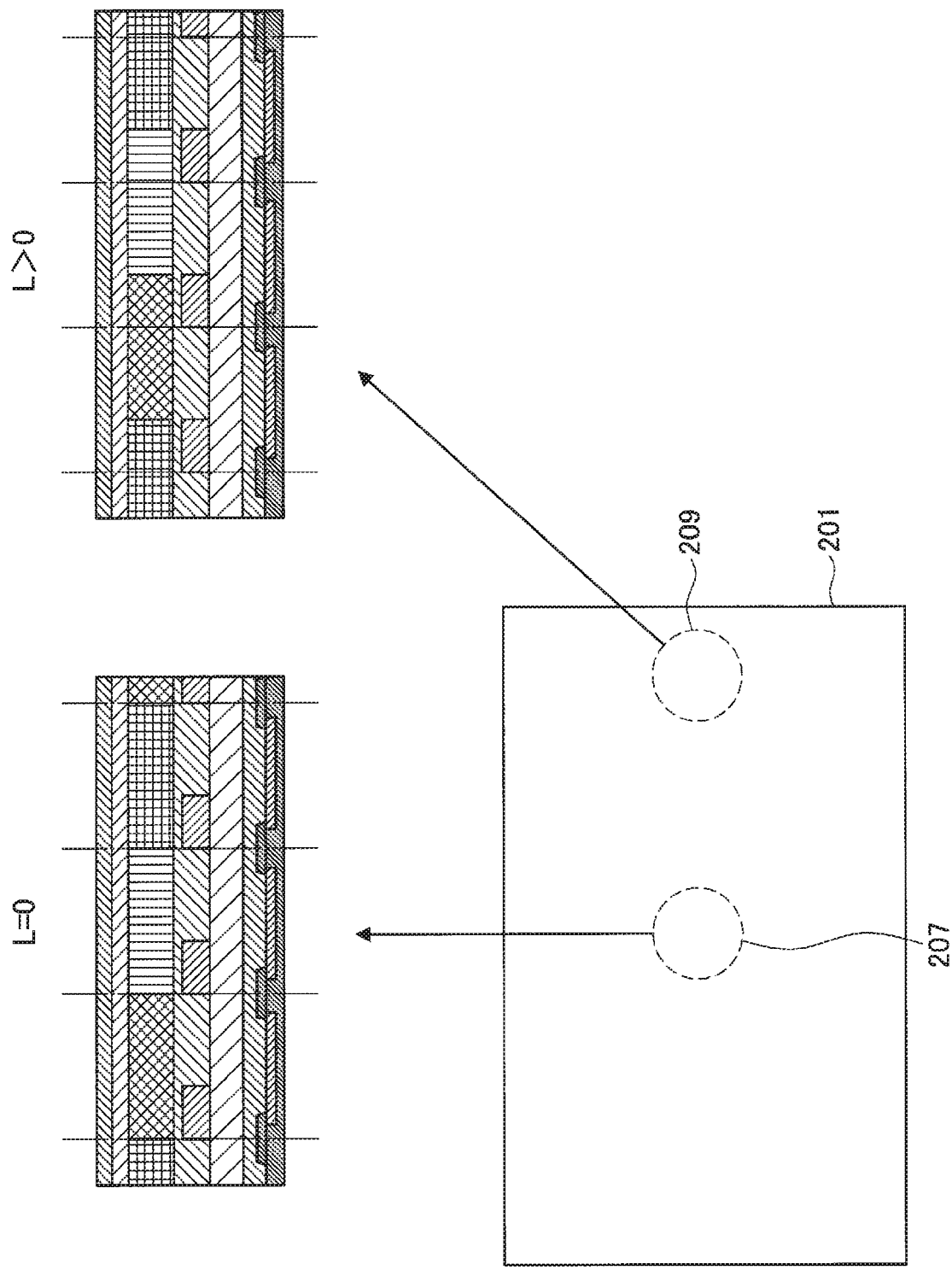
FIG. 5 is a diagram for describing distributions of amounts of misalignment L and misalignment directions of CFs in a display surface of a display device.

FIG. 5 is a diagram for describing distributions of amounts of misalignment L and misalignment directions of CFs 113a in the display surface of the display device 1c. Here, a case where, when mounted on an electronic apparatus, the display device 1c is installed such that the display surface 201 faces the optical system 205 with a relatively narrow distance, as shown in FIG. 3, is envisaged. In this case, as shown in FIG. 5, for emission light from a pixel placed in region 207 that is substantially near the center in the display surface 201 of the display device 1c, it is sufficient that emission light in a direction substantially perpendicular to the luminescence surface of the light emitting element 103 be incident on the optical system 205; hence, the emission light from a pixel placed in region 207 does not need to have considerably wide viewing angle characteristics. Therefore, in a pixel placed in region 207, the light emitting element 103 and the CF 113a are arranged such that a relative misalignment between the light emitting element 103 and the CF 113a is not created (that is, the amount of misalignment L is set to L=0), like in the configuration according to the first embodiment.

On the other hand, for emission light from a pixel placed in region 209 that is near the outer periphery in the display surface 201 of the display device 1c, it is necessary that light emitted toward the outer edge of the display surface 201 be incident on the optical system 205; hence, the emission light from a pixel placed in region 209 needs to have wider viewing angle characteristics toward the outer edge of the display surface 201 (in the illustrated example, in the right direction of the drawing sheet). Therefore, in a pixel placed in region 209, the light emitting element 103 and the CF 113a are arranged such that a relative misalignment between the light emitting element 103 and the CF 113a is created by a prescribed amount of misalignment L>0), like in the configuration described with reference to FIG. 4. Further, in this event, the misalignment direction of the CF 113a is set to a direction from the center of the display surface 201 to the place where the pixel is located. Thereby, in a pixel placed in region 209, wider viewing angle characteristics are obtained toward the outer edge of the display surface 201.

FIG. 5 shows only the configuration of pixels in region 207 that is substantially near the center in the display surface 201 and region 209 that is near the outer periphery; however, in the second embodiment, pixels are provided in a gradational manner in accordance with the position in the display surface 201, that is, in such a manner that the amount of misalignment L of the CF 113a becomes larger as the position shifts from the center of the display surface 201 toward the outer edge. For example, the inside of the display surface 201 is divided into a plurality of regions, and the amount of misalignment L is set for each region in accordance with the position in the display surface 201 of the region. Further, also the misalignment direction of the CF 113a is set for each region. Here, in the second embodiment, the misalignment direction of the CF 113a is set simply to either one of the horizontal direction and the vertical direction of the display surface 201. By this configuration, the distribution of misalignment directions of CFs 113a in the plane of the display surface 201 can be managed more easily; thus, the design is not complicated.

Note that, in the above example, an arrangement of the display device 1c and the optical system 205 like that shown in FIG. 3 is envisaged, and hence pixels are provided such that the amount of misalignment L of the CF 113a becomes larger as the position shifts from the center of the display surface 201 toward the outer edge; but the second embodiment is not limited to this example. The way of division of regions, and the amount of misalignment L and the misalignment direction of the CF 113a in each region (that is, the distributions of amounts of misalignment 1, and misalignment directions of CFs 113a in pixels in accordance with the position in the display surface 201) may be set such that a desired viewing angle is obtained for each pixel in the display surface 201, in accordance with the positional relationship between the display device 1c and the optical system 205 in the electronic apparatus, as appropriate. Specifically, the misalignment direction of the CF 113a may be set to a direction in which a viewing angle is intended to be obtained in the horizontal plane (that is, the inclination direction from the direction perpendicular to the luminescence surface to the direction of a desired viewing angle). A specific method for setting the amount of misalignment L of the CF 113a is described in detail later in (4. With regard to amount of misalignment of CF) below.

Figure 6:
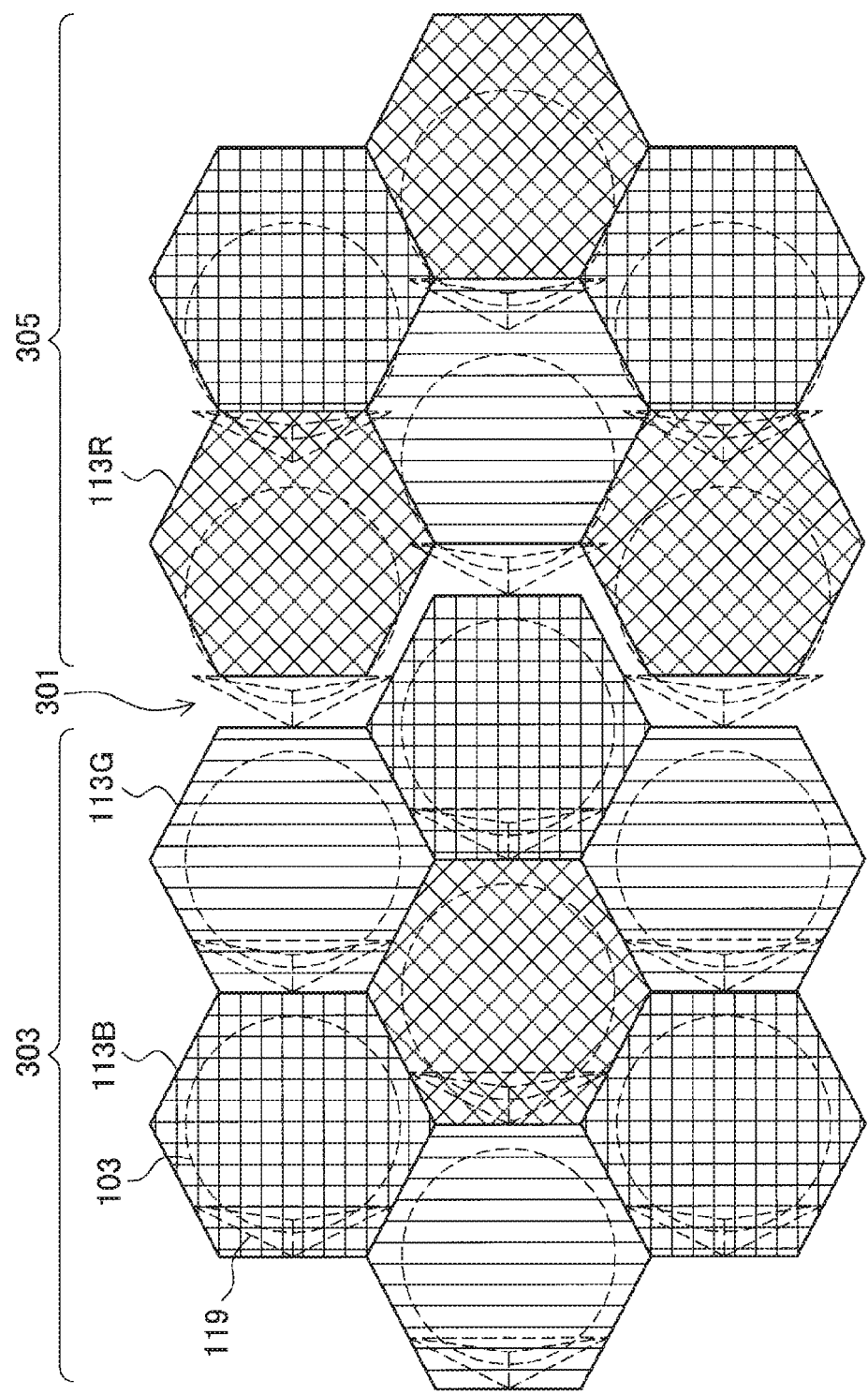
FIG. 6 is a diagram for describing a transition region in which the amount of misalignment L and/or the misalignment direction of the CF changes.

In order for the amount of misalignment L and/or the misalignment direction of the CF 113a to be changed between regions, a transition region in which the amount of misalignment L and/or the misalignment direction of the CF 113a changes may be provided between regions. FIG. 6 is a diagram for describing a transition region in which the amount of misalignment L and/or the misalignment direction of the CF 113a changes. FIG. 6 schematically shows the configuration of, in the display device 1c, near the boundary between two regions between which the amount of misalignment L of the CF 113a is different. FIG. 6 is a top view, and an arrangement of the CF 113a and an arrangement of the light emitting element 103 and the reflector 119 are schematically indicated by broken lines. Further, in FIG. 6, a prism type having a three-dimensional prism shape of a right triangular pyramid is illustrated as an example of the reflector 119.

In FIG. 6, region 303 in which the amount of misalignment L of the CF 113a is 0, region 305 in which the amount of misalignment L of the CF 113a adjacent to region 303 is not zero but a predetermined nonzero value, and transition region 301 formed between regions 303 and 305 are illustrated as examples. As illustrated in the drawing, transition region 301 is formed as a region in which the CF 113a is not formed in the CF layer 113. Accordingly, in region 305, the center of the CF 113a is arranged to be shifted from the center of the luminescence surface of the light emitting element 103 in the horizontal surface by the amount of misalignment L>0 in the direction in which an interval is formed between the CFs 113a in the CF layer 113. Similar transition region 301 is formed between other regions (not illustrated), and thus it is possible to change the amount of misalignment L and/or the misalignment direction for each region.

Note that, in the above example, the inside of the display surface 201 is divided into a plurality of regions, and the amount of misalignment L and the misalignment direction are set for each region in accordance with the position in the display surface 201 of the region; however, the second embodiment is not limited to this example. For example, the amount of misalignment L and the misalignment direction may be set not on a region basis but on a pixel basis, and the amount of misalignment L and the misalignment direction may be changed in a continuous manner between pixels in accordance with the position in the display surface 201 of the pixel. Also in this case, the amount of misalignment L and the misalignment direction of the CF 113a in each pixel may be set in accordance with the positional relationship between the display device 1c and the optical system 205 in the electronic apparatus in such a manner that a desired viewing angle is obtained for each pixel in the display surface 201, as appropriate.

Here, in a case in which relative misalignment is caused between the light emitting element 103 and the CF 113a for a certain pixel, it is concerned that in the pixel, the CF 113a of an adjacent pixel different from a desired color exists immediately above the light emitting element 103 in a direction (the left direction on the paper plane in the example illustrated in FIG. 4) opposite to the misalignment direction of the CF 113a, and thus the light emitted in the front direction does not pass through the CF 113a of the desired color, and the color mixing is likely to occur more easily. In this regard, in the second embodiment, the misalignment direction of the center of the reflector 119 with respect to the center of the luminescence surface of the light emitting element 103 in the horizontal surface is set to the direction opposite to the misalignment direction of the CF 113a In other words, the reflector 119 is arranged on a side opposite to the direction in which the CF 113a is shifted with respect to the luminescence surface of the light emitting element 103 in the horizontal surface. Accordingly, the light emitted from the light emitting element 103 in a direction opposite to the direction in which the viewing angle is desired to be obtained is reflected by the reflector 119 and directed toward the luminescence surface of the light emitting element 103. Then, the light is reflected again in the direction in which the reflector 119 is not formed in the luminescence surface (or the interface between the lower layers), that is, the direction in which a desired viewing angle is desired to be obtained which is the misalignment direction of the CF 113a and is emitted from the second substrate 117 to the outside as light of a desired color with a desired viewing angle. In FIG. 4, a locus of the light beam performing such a behavior is simulatively indicated by a broken line arrow.

Specifically, an installation position of the reflector 119 in an in-plane direction within a pixel is set, for example, so that an end on a side far from the center of the light emitting element 103 corresponding to itself (an end in the left direction on the paper plane in FIG. 4) is positioned between an end of the light emitting element 103 corresponding to itself (a position indicated by a dotted line X in FIG. 4) and the center of a region between adjacent pixels (a position indicated by an alternate long and short dash line Y in FIG. 4). This is one in which the fact that the emission light from the light emitting element 103 in the adjacent pixel is not reflected by the reflector 119 is considered. Further, the installation position of the reflector 119 in the in-plane direction within the pixel is set, for example, so that an end on a side closer to the center of the light emitting element 103 corresponding to itself (an end in the right direction on the page plane in FIG. 4) does not enter its own pixel side further than the boundary with the CF 113a of the adjacent pixel (a position indicated by a dotted line Z in FIG. 4). This is one in which the fact that the emission light directed directly toward the CF 113a corresponding to the light emitting element 103 from the light emitting element 103 is not reflected by the reflector 119 formed corresponding to itself is considered. Since the reflector 119 is installed as described above, it is possible to suitably reflect the emission light from the light emitting element 103 corresponding to the light emitting element 103 without leaking to the adjacent pixel without disturbing the emission light directly from the light emitting element 103 of an adjacent pixel corresponding to itself or the emission light directed directly toward the CF 113a corresponding to itself from the light emitting element 103 corresponding to itself (that is, without degrading the light extraction efficiency more than necessary).

Further, in order to effectively cause the function of the reflector 119 to be fulfilled, in the second embodiment, it is preferable that the light emitting element 103, the CF 113a, and the reflector 119 are arranged so that the distribution of the amount of misalignment of the center of the reflector 119 in the display surface with respect to the center of the luminescence surface of the light emitting element 103 in the horizontal surface is proportional to the distribution of the amount of misalignment of the CF 113a in the display surface, and the distribution of the misalignment direction of the center of the reflector 119 in the display surface with respect to the center of the luminescence surface of the light emitting element 103 in the horizontal surface is a direction opposite to the distribution of the misalignment direction of the CF 113a in the display surface.

As described above, according to the second embodiment, by causing the relative misalignment to occur between the light emitting element 103 and the CF 113a, it is possible to obtain a wide viewing angle characteristic while suppressing the occurrence of the color mixing for each pixel. Further, since the reflector 119 is installed, the light which is emitted from the light emitting element 103 in a direction opposite to the direction in which the viewing angle is desired to be obtained can be guided toward the direction in which the viewing angle is desired to be obtained, it is possible to improve the light extraction efficiency of a desired color while suppressing the occurrence of the color mixing. In other words, according to the second embodiment, since the relative misalignment is caused between the light emitting element 103 and the CF 113a for each pixel, and the reflector 119 is formed for each pixel as well, it is possible to obtain a wider viewing angle characteristic in a desired direction, suppress the occurrence of the color mixture, and improve the light extraction efficiency.

Further, in the second embodiment, since an improvement in viewing angle characteristics can be achieved by a relative misalignment between the light emitting element 103 and the CF 113a, there is no need to employ configurations that have been proposed until now for an improvement in viewing angle characteristics, such as those described in (2-1. Background with which second embodiment is conceived) above (for example, the narrowing of the facing gap and the downsizing of the area of the luminescence surface). Hence, the viewing angle characteristics can be improved without reducing the luminescence characteristics or the protectiveness of the light emitting element 103 (OLED), or causing a reduction in luminance.

Further, a relative misalignment between the light emitting element 103 and the CF 113a can be obtained by merely changing the configuration of CFs 113a during the formation of the CF layer 113, and therefore the display device 1c according to the second embodiment can be fabricated easily without increasing the number of manufacturing steps. Thus, desired effects can be obtained without increasing the production cost.

Further, in general, in a case where color shifting or color mixing has occurred, color correction processing may be performed by a driving circuit. According to the second embodiment, such color correction processing does not need to be performed because the occurrence of color shifting and color mixing can be suppressed favorably while the viewing angle characteristics are improved. Therefore, a driving circuit can be obtained more simply, and thus the circuit scale of the driving circuit can be made smaller.

Note that, although in the second embodiment described hereinabove the misalignment direction of the CF 113a is set to only either one of the horizontal direction and the vertical direction of the display surface 201, the second embodiment is not limited to this example. For example, the misalignment direction of the CF 113a may be a two-dimensional arbitrary direction in the horizontal plane. By this configuration the misalignment direction of the CF 113a can be set more finely for each pixel, and thus the adjustment of the viewing angle on a pixel basis can be performed more strictly.

The configuration of the display device 1c according to the second embodiment has been described above.

2-3. Modified Examples

Several modified examples of the second embodiment be described.

2-3-1. First Modified Example

Figure 7:
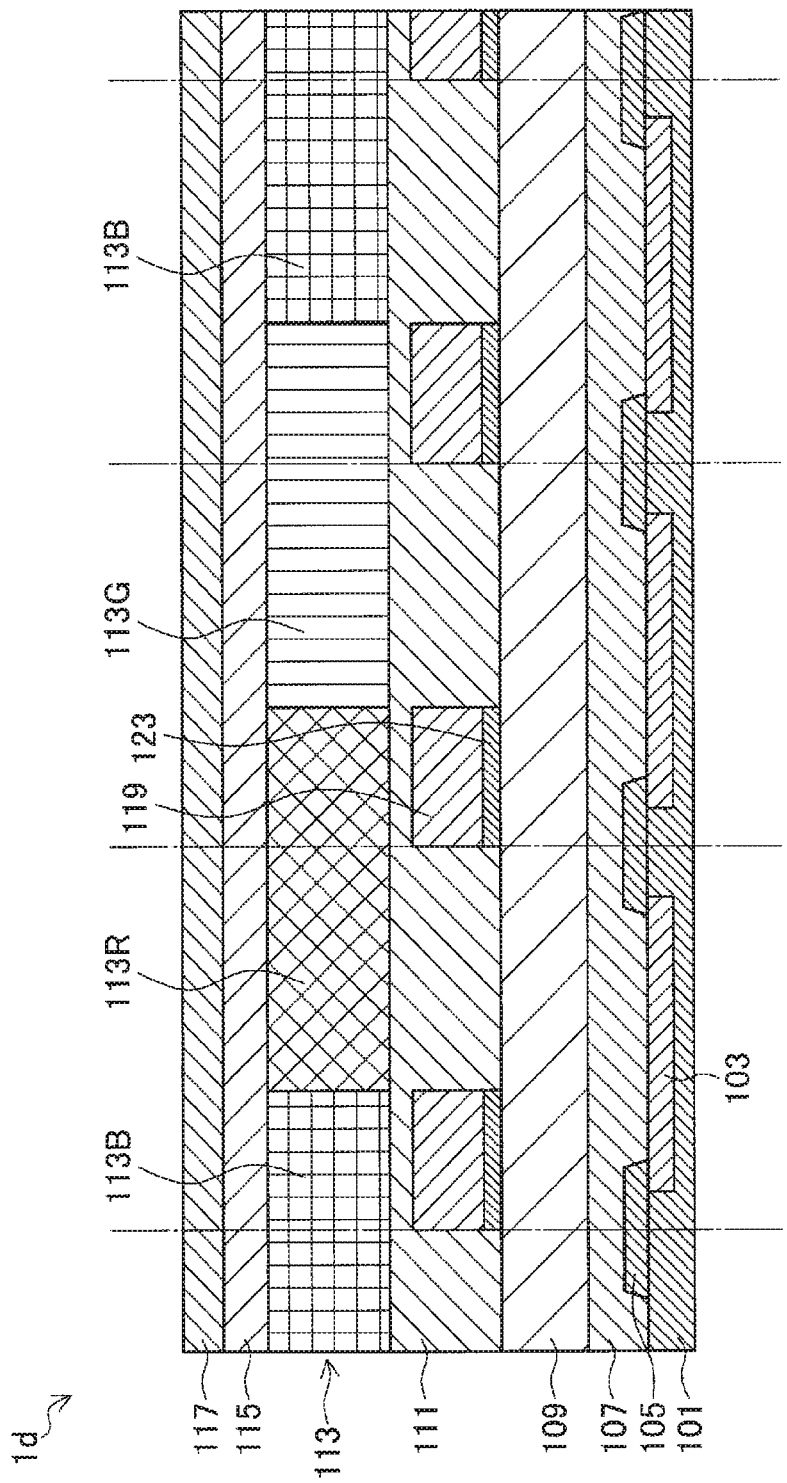
FIG. 7 is a cross-sectional view illustrating a configuration example of a display device according to a first modified example of the second embodiment.

FIG. 7 is a cross-sectional view illustrating a configuration example of a display device according to a first modified example of the second embodiment. Referring to FIG. 7, a display device 1d according to the first modified example differs from the display device 1c according to the second embodiment in that an adhesive layer 123 is formed between the protection film 109 and the reflector 119. Further, the display device 1d according to the first modified example has a configuration similar to that of the display device 1c except that the adhesive layer 123 is formed between the protection film 109 and the reflector 119. Therefore, in the description of the display device 1d, detailed description of portions duplicating the display device 1c will be omitted.

In the above-described embodiment, the display device 1c includes the reflector 119 formed on the protection film 109, similarly to the display device 1a according to the first embodiment. Here, depending on a material of the protection film 109 and a material of the reflector 119, it is concerned that adhesion between the protection film 109 and the reflector 119 may decrease. Therefore, in the second embodiment, when the reflector 119 is formed on the protection film 109 as in the first modified example, the adhesive layer 123 may be formed between the protection film 109 and the reflector 119. Since the adhesive layer 123 is formed, it is possible to connect the protection film 109 and the reflector 119 more suitably, and thus a more stable display device 1d can be obtained.

2-3-2. Second Modified Example

Figure 8:
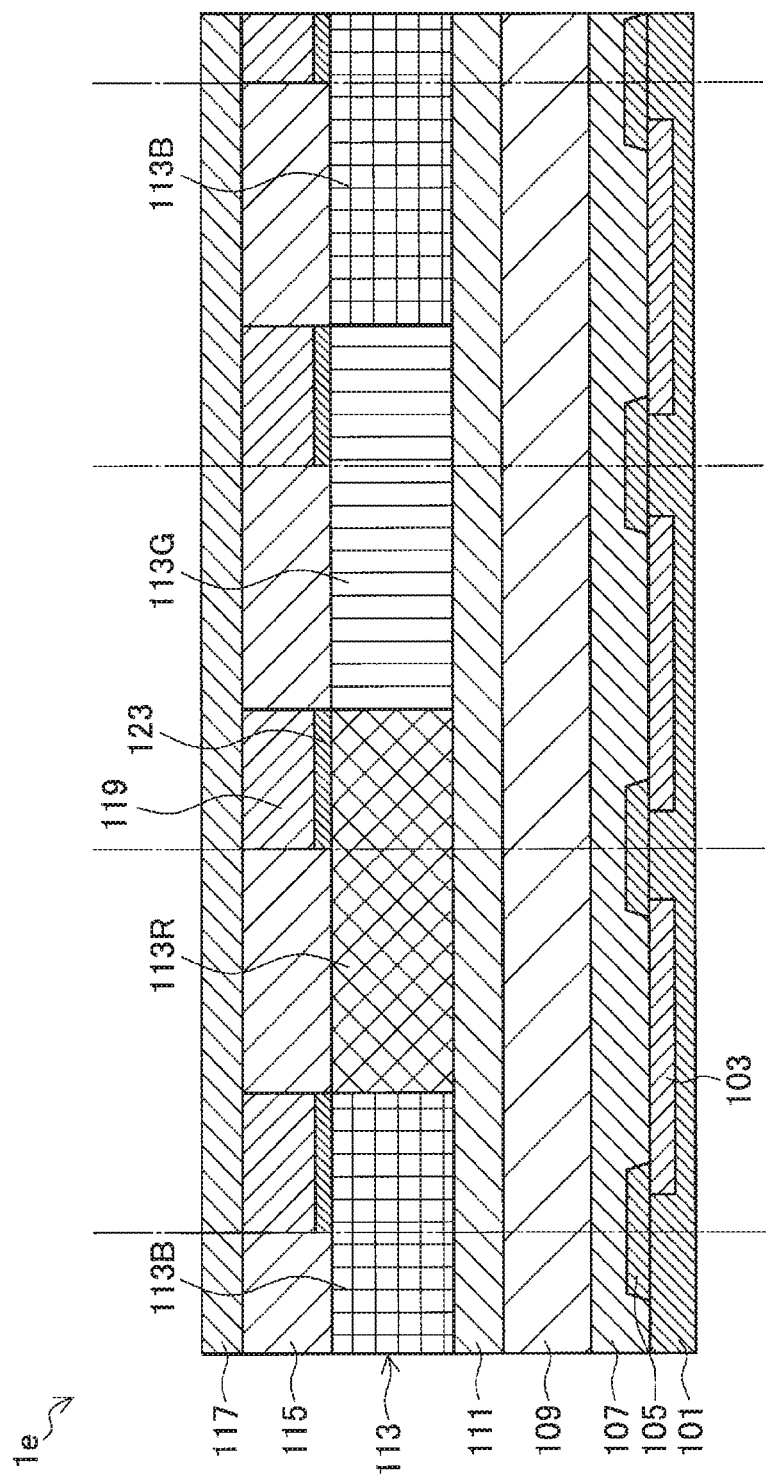
FIG. 8 is a cross-sectional view illustrating a configuration example of a display device according to a second modified example of the second embodiment.

FIG. 8 is a cross-sectional view illustrating a configuration example of a display device according to a second modified example of the second embodiment. Referring to FIG. 8, a display device 1e according to the second modified example differs from the display device 1c according to the second embodiment described above in that an arrangement position of the reflector 119 in the stacking direction is different. Further, the display device 1e according to the second modified example has a configuration similar to that of the display device 1c except that the arrangement position of the reflector 119 in the stacking direction is different. Therefore, in the description of the display device 1e, detailed description of portions duplicating the display device 1c will be omitted.

Specifically, in the display device 1e, a reflector 119 is formed on the CF layer 113 after the CF layer 113 is formed. At this time, in the present modified example, the adhesive layer 123 is formed between the CF layer 113 and the reflector 119. Since the adhesive layer 123, it is possible to cause the CF layer 113 and the reflector 119 to adhere to each other more suitably, and thus a more stable display device 1e can be obtained. Here, in a case in which it is possible to cause the CF layer 113 and the reflector 119 to adhere to each other more suitably due to compatibility of the material of the CF layer 113 and the material of the reflector 119 or a case in which the CF layer 113 and the reflector 119 can be consecutively formed by a similar process using a similar process, the adhesive layer 123 need not be necessarily formed.

The second substrate 117 is bonded to the first substrate 101 in the state in which the reflector 119 is formed on the CF layer 113 via the sealing resin film 115, so that the display device 1e is manufactured.

Similarly to the second modified example, in the second embodiment, the arrangement position of the reflector 119 in the stacking direction is not limited. The reflector 119 may be formed above the light emitting element 103 or may be formed at an arbitrary position in the stacking direction.

2-3-3. Third to Fifth Modified Examples

The display devices 1c, 1d, and 1e according the second embodiment described above and the first and second modified examples are the display devices of the OCCF scheme. Here, the second embodiment is not limited to this example, and the display device according to the second embodiment may be a display device of a facing CF scheme.

Figure 9:
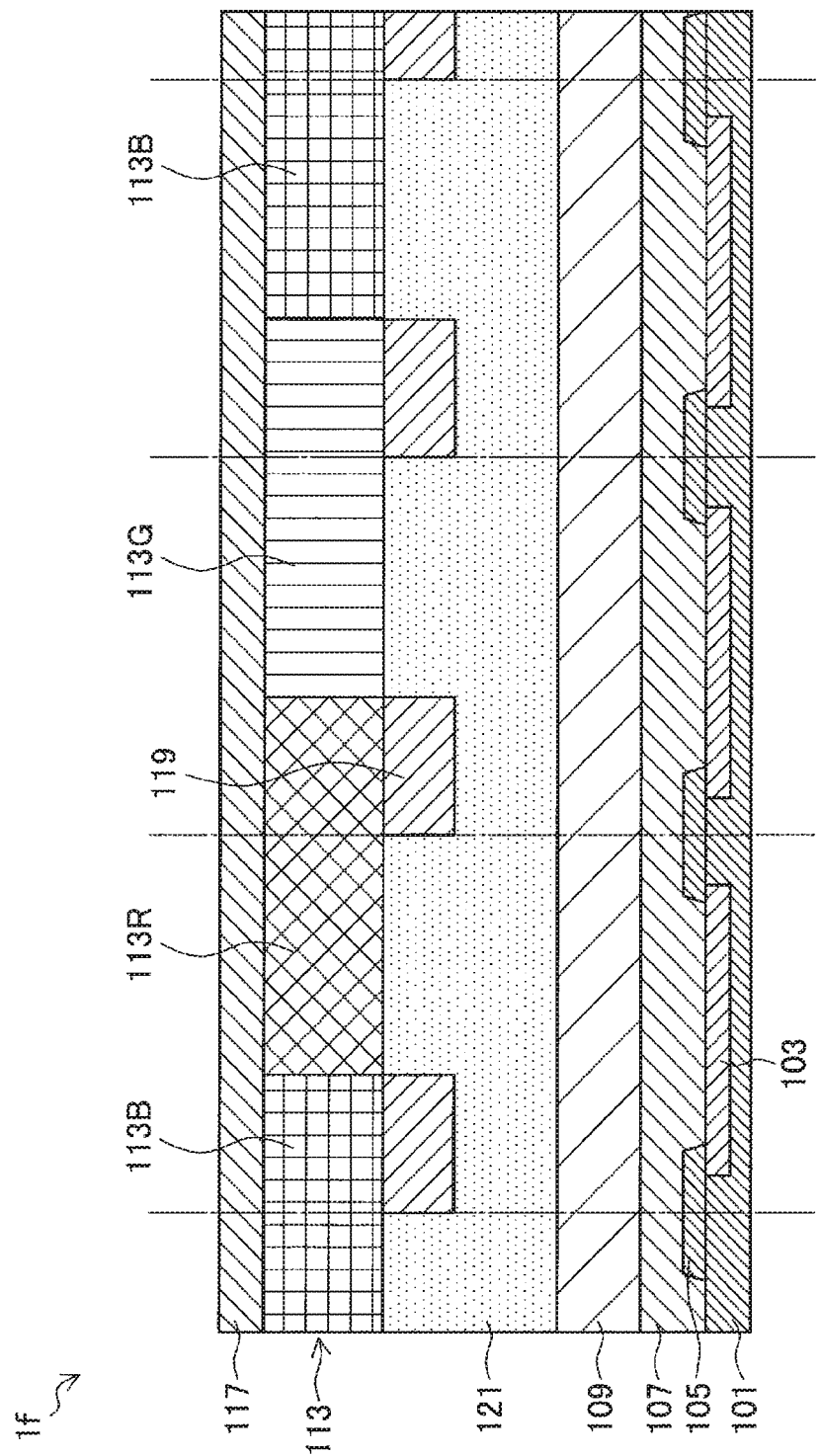
FIG. 9 is a cross-sectional view illustrating a configuration example of a display device of a facing CF scheme which is a third modification example of the second embodiment.
Figure 10:
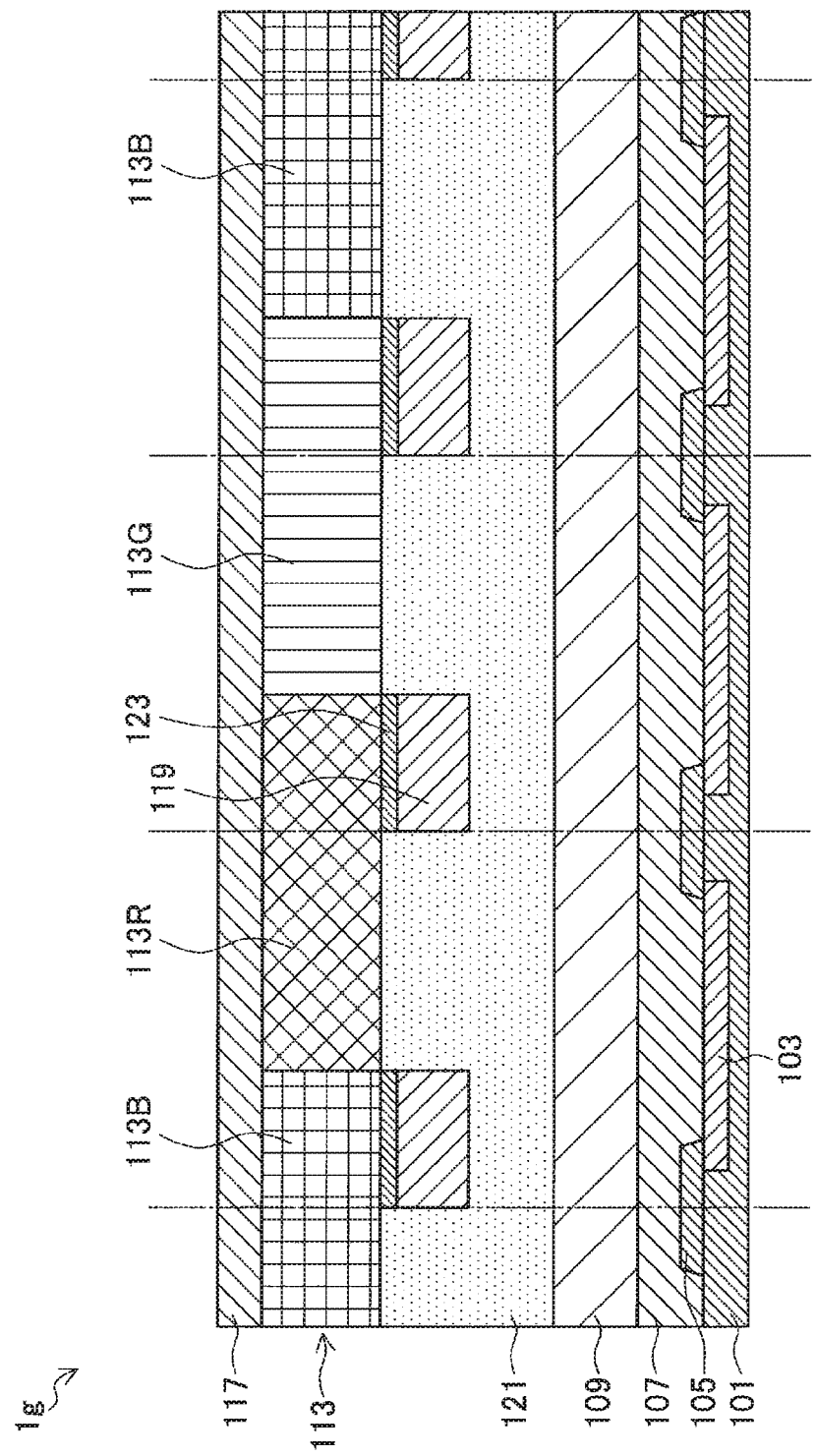
FIG. 10 is a cross-sectional view illustrating a configuration example of a display device of a facing CF scheme which is a fourth modification example of the second embodiment.
Figure 11:
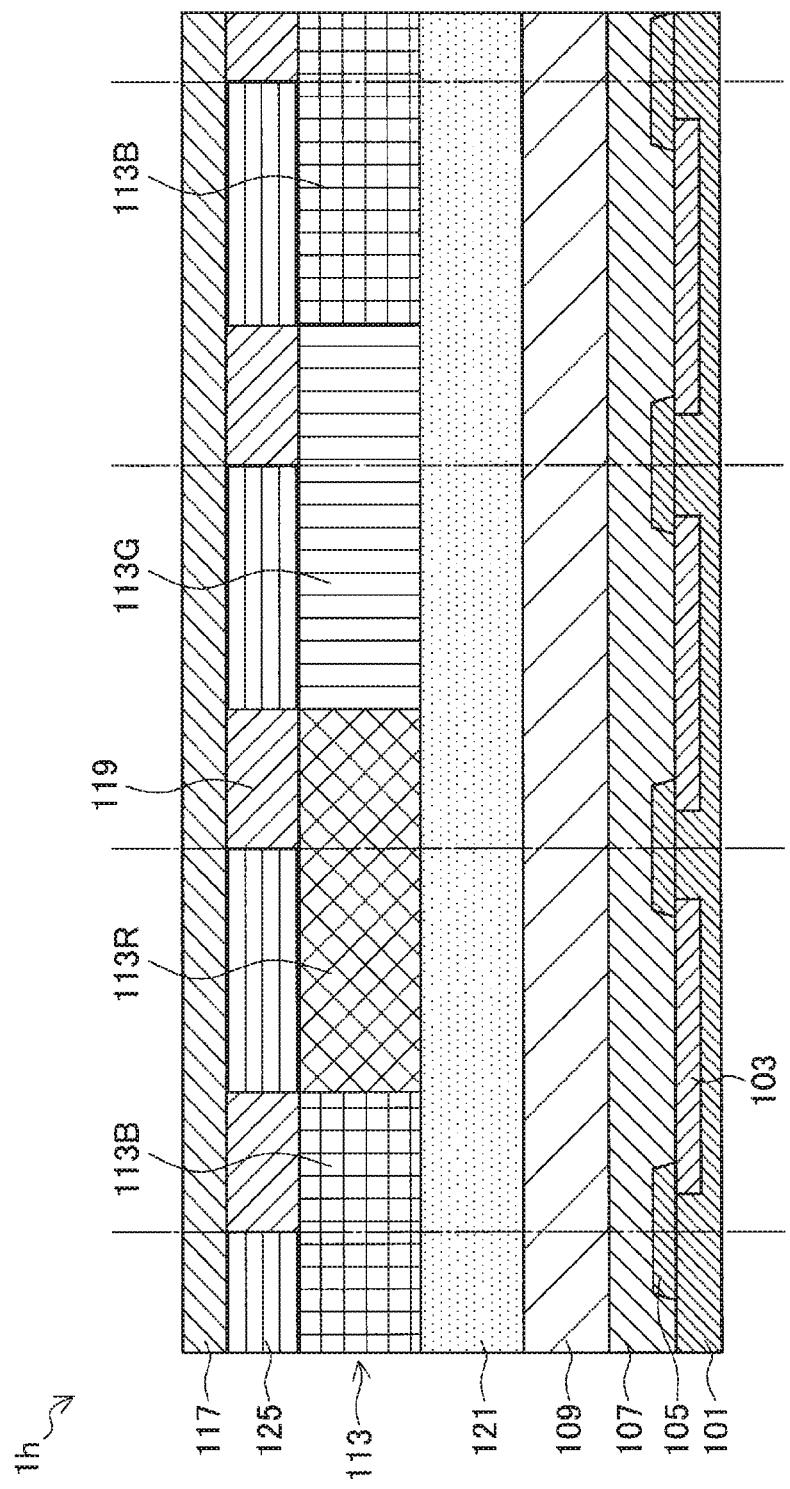
FIG. 11 is a cross-sectional view illustrating a configuration example of a display device of a facing CF scheme which is a fifth modification example of the second embodiment.

Configurations of display devices of facing CF scheme which are third to fifth modified examples of the second embodiment will be described with reference to FIGS. 9 to 11. FIGS. 9 to 11 are cross-sectional views illustrating configuration examples of display devices of the facing CF scheme which are the third to fifth modified example of the second embodiment.

First, referring to FIG. 9, the configuration of the display device in accordance with the third modified example will be described. Here, a display device 1f according to the third modified example differs from the display device 1c according to the second embodiment illustrated in FIG. 4 in that a configuration above the protection film 109 is different due to the difference in the manufacturing method and is similar in the other configuration to the display device 1c according to the second embodiment. Therefore, in the description of the display device 1f according to the third modified example, different portions from the display device 1c described above will be mainly described, and detailed description of portions duplicating the display device 1c will be omitted.

Referring to FIG. 9, in the display device 1f according to the third modified example, a light emitting element 103, a first member 107, and a protection film 109 are stacked on the first substrate 101 in the described order. Further, a CF layer 113 and a reflector 119 are formed on a second substrate 117. At this time, for example, the reflector 119 can be consecutively formed by a similar photolithography technique using a similar resist material to the CF layer 113. Further, the second substrate 117 is bonded to the first substrate 101 via a sealing material 121 so that each of the light emitting elements 103 faces the CF 113a and the reflector 119 of each color, so that the display device 1f is manufactured.

Next, a configuration of a display device according to the fourth modified example will be described with reference to FIG. 10. Referring to FIG. 10, a display device 1g according to the fourth modified example differs from the display device 1f according to the third modified example illustrated in FIG. 9 in that an adhesive layer 123 is formed between the protection film 109 and the reflector 119. Further, the display device 1d according to the fourth modified example has a configuration similar to that of the display device 1f except that the adhesive layer 123 is formed between the protection film 109 and the reflector 119. Therefore, in the description of the display device 1g, detailed description of portions duplicating the display device 1f will be omitted.

Since the adhesive layer 123 is formed, it is possible to cause the CF layer 113 and the reflector 119 to adhere to each other excellently, and the stability of the display device 1g can be enhanced. In a case in which the reflector 119 is formed of a material different from a material of the CF layer 113 and/or by a different process after the CF layer 113 is formed, adhesion between the reflector 119 and the CF layer 113 may not be necessarily be excellent, and thus it is preferable to form the adhesive layer 123.

Next, a configuration of a display device according to the fifth modified example will be described with reference to FIG. 11. Referring to FIG. 11, a display device 1h according to the fifth modified example differs from the display device 1f according to the third modified example in that an arrangement position of the reflector 119 in the stacking direction is different. Further, the display device 1h according to the fifth modified example has a configuration similar to that of the display device 1f except that the arrangement position of the reflector 119 in the stacking direction is different. Therefore, in the description of the display device 1h, detailed description of portions duplicating with display device 1f will be omitted.

Specifically, as illustrated in FIG. 11, in the display device 1h, a reflector 119 is formed immediately above the CF layer 113. More specifically, in the display device 1h, the reflector 119 is formed on the second substrate 117, a planarizing film 125 is formed thereon, and then the CF layer 113 is formed. Further, the second substrate 117 is bonded to the first substrate 101 in which the light emitting element 103, the first member 107, and the protection film 109 are stacked in the described order such that each of the light emitting elements 103 faces the CF 113a and the reflector 119 of each color, so that the display device 1h is manufactured.

The configurations of the display devices 1d, 1e, 1f, 1g, and 1h according to the first to fifth modified examples of the second embodiment has been described above. The display devices 1d, 1e, 1f, 1g, and 1h having the above-described configurations have both the configuration in which there is relative misalignment between the light emitting element 103 and the CF 113a for each pixel, similarly to the display device 1c according to the second embodiment and the configuration in which the reflector 119 is formed for each pixel. Therefore, similarly to the display device 1c, it is possible to obtain a wide viewing angle characteristic in a desired direction for each pixel, suppress the occurrence of the color mixing, and improve the light extraction efficiency

3. THIRD EMBODIMENT

3-1. Configuration of Display Device

Figure 12:
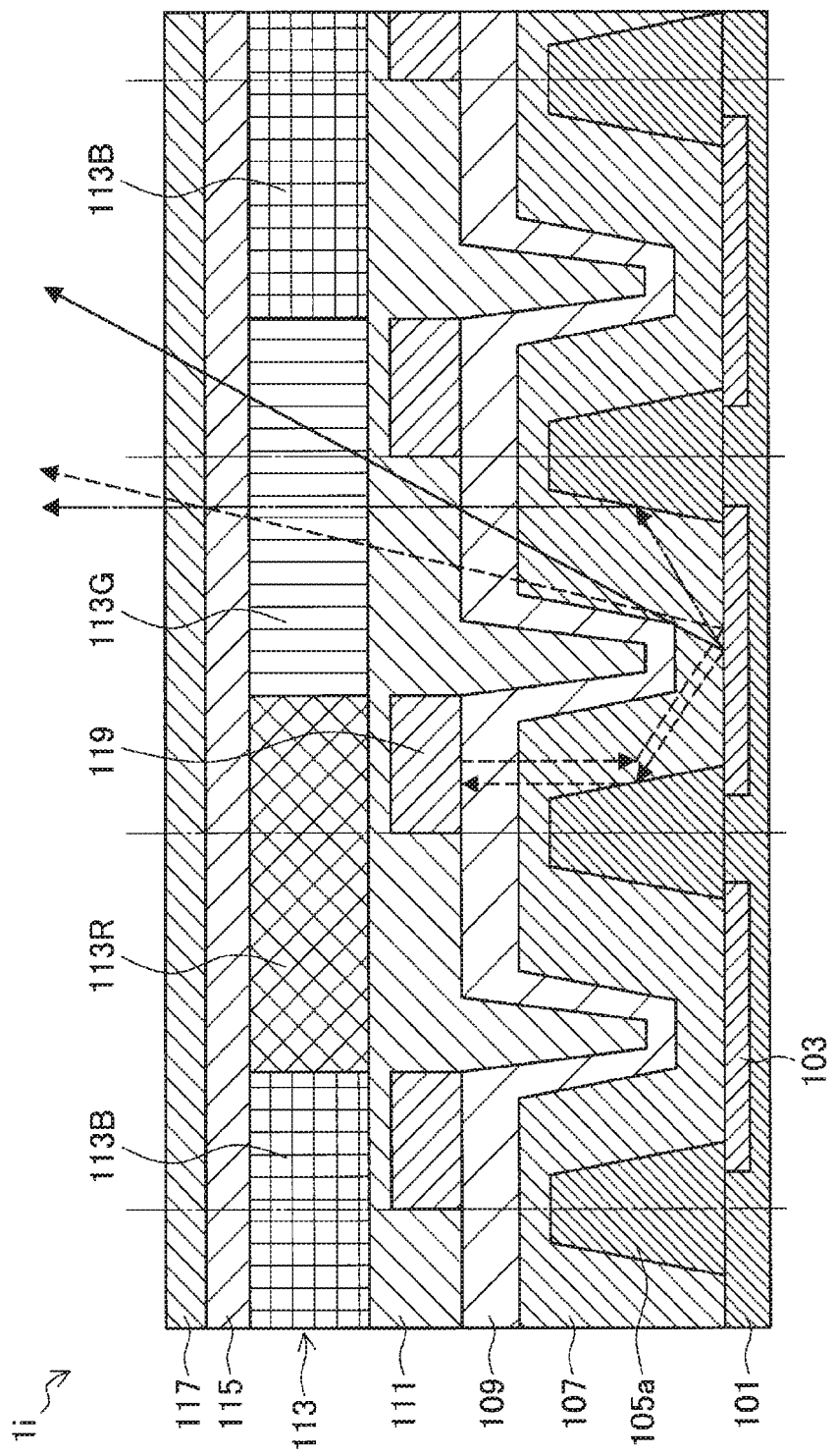
FIG. 12 is a cross-sectional view showing a configuration example of a display device according to a third embodiment.

A configuration of a display device according to a third embodiment of the present disclosure will be described with reference to FIG. 12. FIG. 12 is a cross-sectional view illustrating a configuration example of the display device according to the third embodiment.

Referring to FIG. 12, a display device 1i according to the third embodiment differs from the display device 1c according to the second embodiment illustrated in FIG. 4 described above in that a shape of a pixel defining film 105a is different. Specifically, in the display device 1i, the pixel defining film 105a is formed to have a relatively large film thickness. Further, a side wall of the opening formed corresponding to the light emitting element 103 of the pixel defining film 105a has a tapered shape in which an area of the opening in the horizontal surface increases as it goes upward.

The display device 1i has a configuration similar to that of the display device 1c described above except that the shape of the pixel defining film 105a is different. Therefore, in the following description of the display device 1i, portions different from the display device 1c will be mainly described, and detailed description of portions duplicating the display device 1c will be omitted.

Specifically, similarly to the display device 1c, in the display device 1i, a first member 107 is formed to bury the opening (that is, a region immediately above the light emitting element 103) formed in the pixel defining film 105a. Thereafter, a protection film 109 is formed, and a reflector 119 is formed on the protection film 109. Then, a planarizing film 111 and a CF layer 113 are formed thereon. A second substrate 117 is bonded to the CF layer 113 of the uppermost layer via a sealing resin film 115 in the first substrate 101 on which the respective layers are formed, so that the display device 1a is manufactured. As described above, the display device 1i is a display device of the OCCF scheme.

Here, in the display device 1i, a material of the pixel defining film 105a and a material of the first member 107 are selected so that a refractive index of the first member 107 is larger than a refractive index of the pixel defining film 105a. Accordingly, at least part of light propagated through the first member 107 is reflected on the surface of the pixel defining film 105a facing the first member 107. In other words, the surface of the pixel defining film 105a facing the first member 107 functions as a light reflecting section (reflector).

At this time, as described above, the side wall of the opening formed above the light emitting element 103 of the pixel defining film 105a has a tapered shape in which the area of the opening gradually increases as it goes upward, and thus the light directed toward the side wall of the opening of the pixel defining film 105a among the emission light from the light emitting element 103 is reflected upward, passes through the desired CF 113a, and is emitted to the outside from the second substrate 117. In FIG. 12, a locus of such a light beam is simulatively indicated by an arrow of an alternate long and two short dashes line. As described above, according to the third embodiment, it is possible to further improve the light extraction efficiency since the reflector is formed.

Further, in the display device 1i, the relative misalignment is caused between the light emitting element 103 and the CF 113a for each pixel similarly to the second embodiment, and the reflector 119 is formed above the light emitting element 103 at a position corresponding to a direction opposite to the misalignment direction of the CF 113a with respect to the luminescence surface of the light emitting element 103 in the horizontal surface. Accordingly, the light directed toward the side wall of the opening of the pixel defining film 105a in the direction in which the reflector 119 is formed (that is, the direction opposite to the misalignment direction of the CF 113a) among the emission light from the light emitting element 103 is reflected upward and is reflected by the lower surface of the reflector 119. Therefore, the incidence of light onto the CF 113a of an adjacent pixel different from a desired color, that is, the occurrence of the color mixing is prevented. Further, since the reflector 119 has the recursive structure, the light reflected by the lower surface of the reflector 119 advances toward the luminescence surface of the light emitting element 103 via the side wall of the opening of the pixel defining film 105a, is reflected again by the luminescence surface (the interface between the lower layers), reflected again toward the direction in which the reflector 119 is not formed, that is, the direction in which a desired viewing angle is desired to be obtained which is the misalignment direction of the CF 113a, and emitted to the outside from the second substrate 117 as light of a desired color with a desired viewing angle. In FIG. 12, a locus of a light beam performing such a behavior is simulatively indicated by a broken arrow.

The configuration of the display device 1i according to the third embodiment has been described above. As described above, according to the third embodiment, the reflector that reflects the emission light from the light emitting element 103 upward is added to the configuration of the display device 1c according to the second embodiment. Therefore, according to the third embodiment, in addition to the effect obtained by the second embodiment, it is also possible to obtain the effect of further improving the light extraction efficiency.

3-2. Modified Examples

Several modified examples of the third embodiment will be described. Here, display devices 1j, 1k, 1l, 1m, and 1n according to first to fifth modified examples of the third embodiment which will be described below have configurations in which the reflector is added to the configurations of the display device 1d, 1e, 1f, 1g, and 1h according to the first to fifth modified examples of the second embodiment, respectively. Since the display devices 1j, 1k, 1l, 1m, and 1n have configurations similar to the display devices 1d, 1e, 1f, 1g, and 1h except that the reflector is added, in the following description of the display devices 1j, 1k, 1l, 1m, and 1n, detailed description of the configurations will be omitted.

Figure 13:
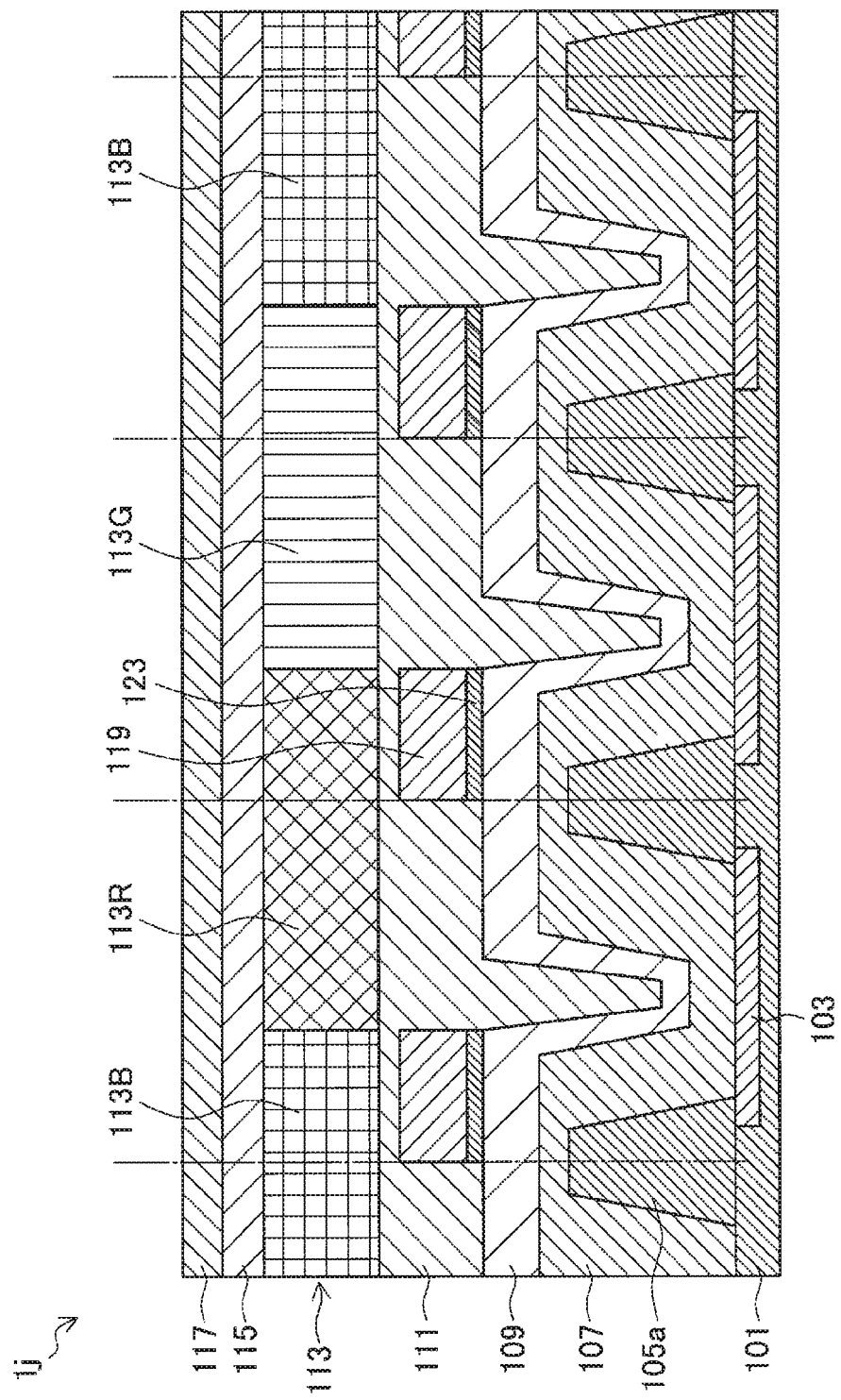
FIG. 13 is a cross-sectional view illustrating a configuration example of a display device according to a first modified example of the third embodiment.

FIG. 13 is a cross-sectional view illustrating a configuration example of the display device according to the first modified example of the third embodiment. Referring to FIG. 13, the display device 1j according to the first modified example has a configuration in which the reflector is added to the configuration of the display device 1d according to the first modified example of the second embodiment. At the same time, in the display device 1j, in addition to the configuration of the display device 1i according to the third embodiment described above, an adhesive layer 123 is formed between the protection film 109 and the reflector 119.

In the above-described embodiment, the display device 1i has a configuration in which the reflector 119 is formed on the protection film 109 similarly to the display device 1c according to the second embodiment. Here, depending on a material of the protection film 109 and a material of the reflector 119, it is concerned that the adhesion between the protection film 109 and the reflector 119 may decrease. Therefore, in the third embodiment, when the reflector 119 is formed on the protection film 109 as in the first modified example, the adhesive layer 123 may be formed between the protection film 109 and the reflector 119. Since the adhesive layer 123 is formed, it is possible to connect the protection film 109 and the reflector 119 more suitably, and thus a more stable display device 1j can be obtained.

Figure 14:
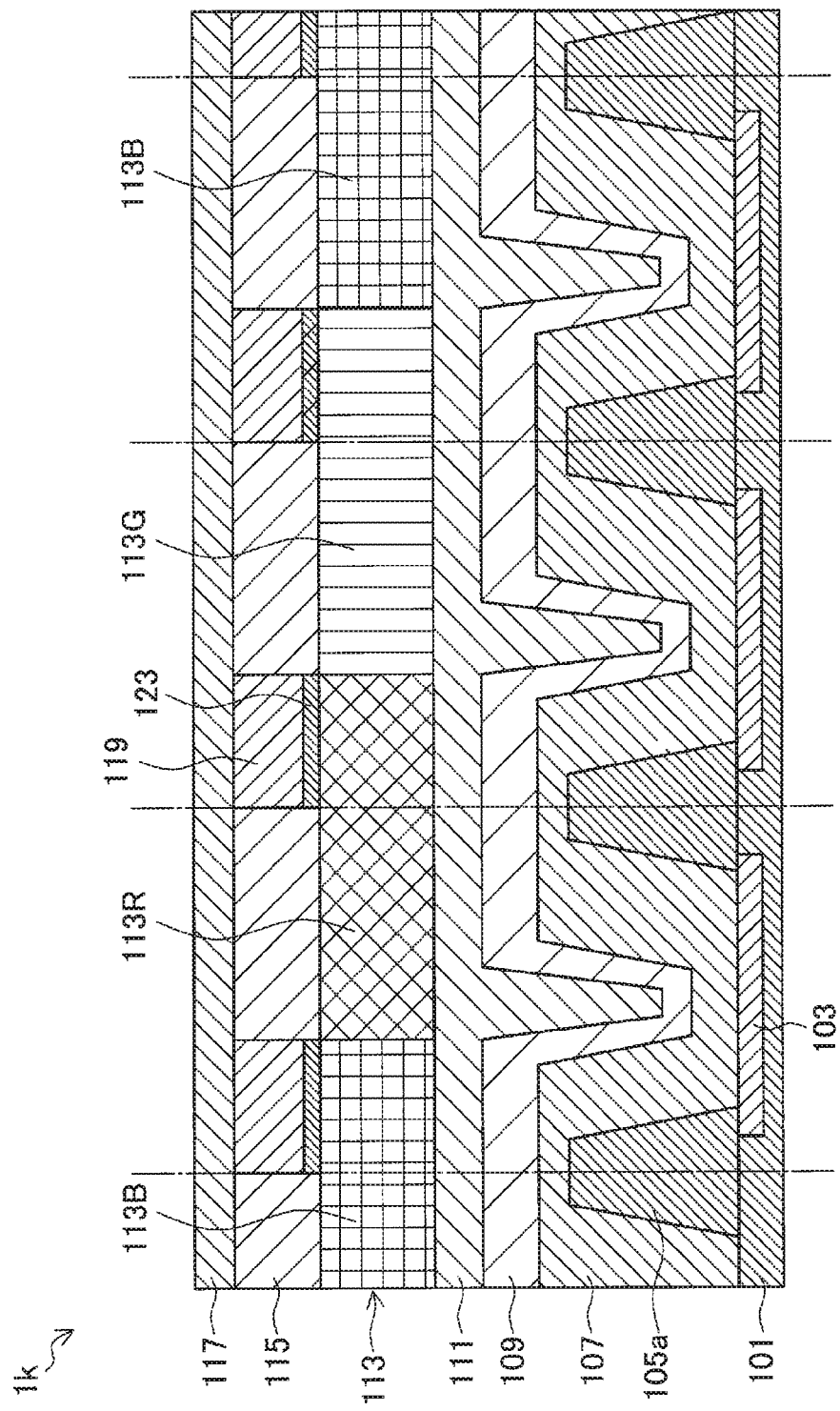
FIG. 14 is a cross-sectional view illustrating a configuration example of a display device according to a second modified example of the third embodiment.

FIG. 14 is a cross-sectional view illustrating a configuration example of the display device according to the second modified example of the third embodiment. Referring to FIG. 14, the display device 1k according to the second modified example has a configuration in which the reflector is added to the configuration of the display device 1e according to the second modified example of the second embodiment. At the same time, in the display device 1k, in addition to the configuration of the display device 1i in accordance with the above third embodiment, the reflector 119 is formed above the CF layer 113. As in the second modified example, in the third embodiment, the arrangement position of the reflector 119 in the stacking direction is not limited, and the reflector 119 may be formed at an arbitrary position in the stacking direction as long as the reflector 119 is formed above the light emitting element 103.

Figure 15:
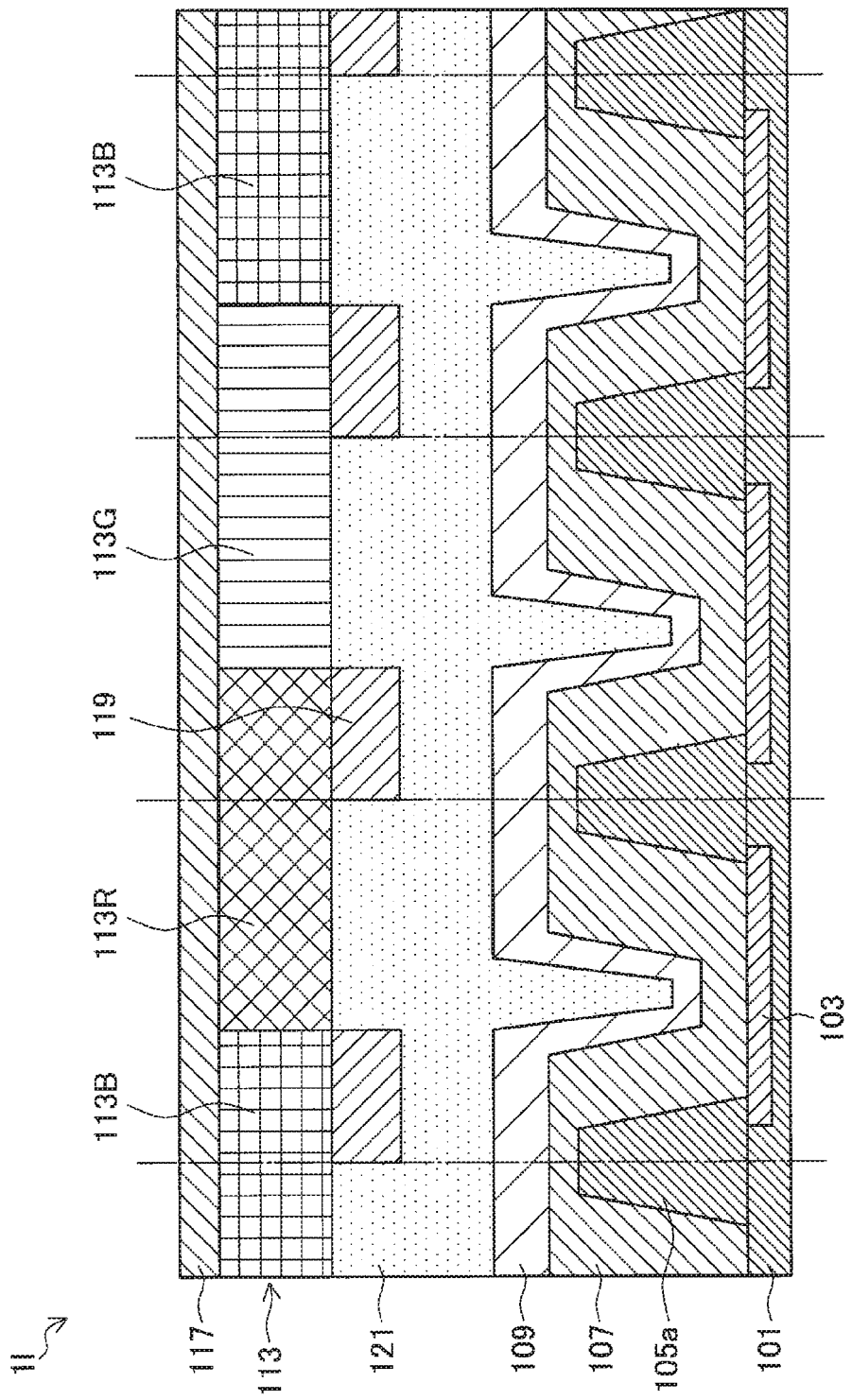
FIG. 15 is a cross-sectional view illustrating a configuration example of a display device according to a third modified example of the third embodiment.
Figure 16:
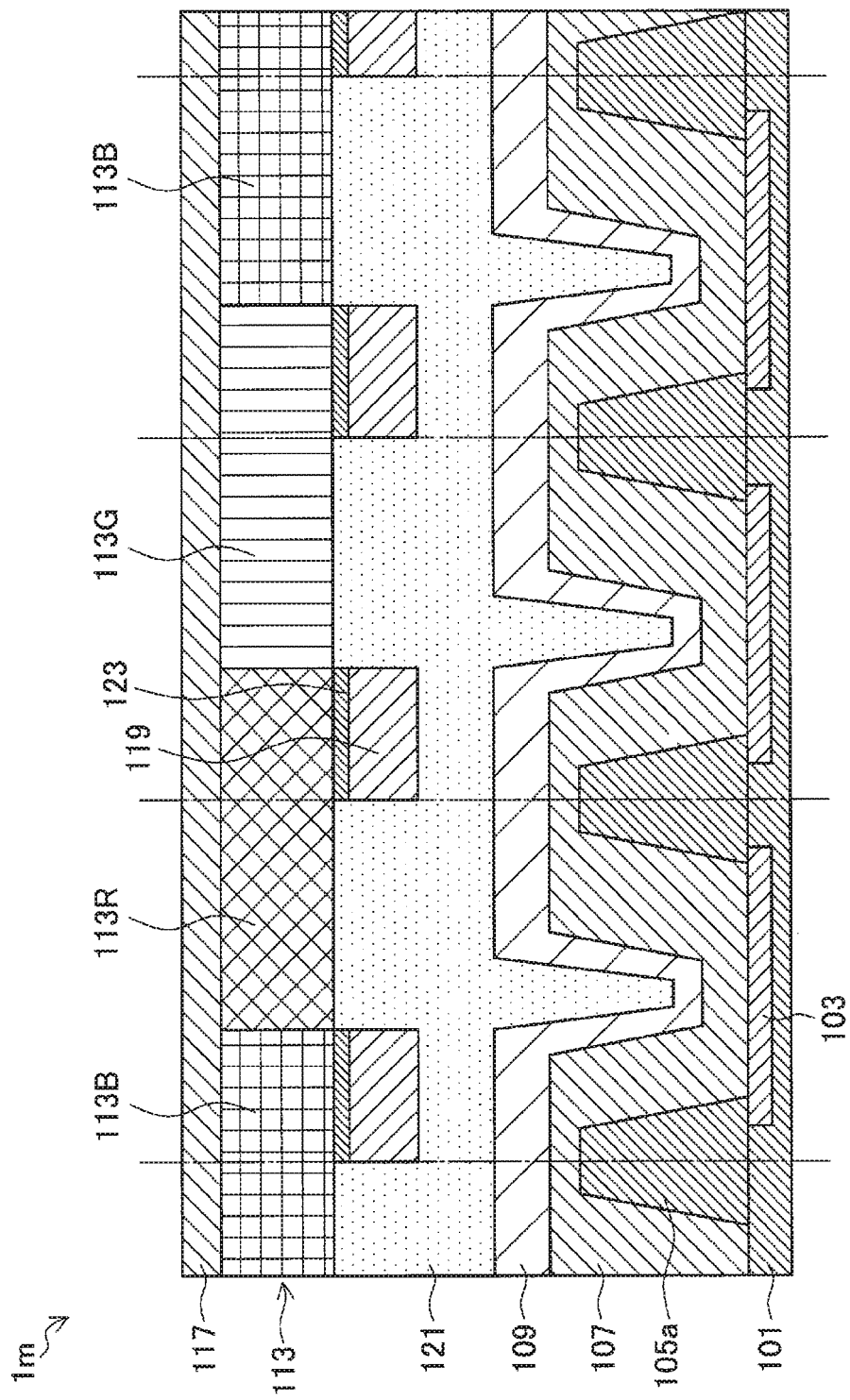
FIG. 16 is a cross-sectional view illustrating a configuration example of a display device according to a fourth modified example of the third embodiment.
Figure 17:
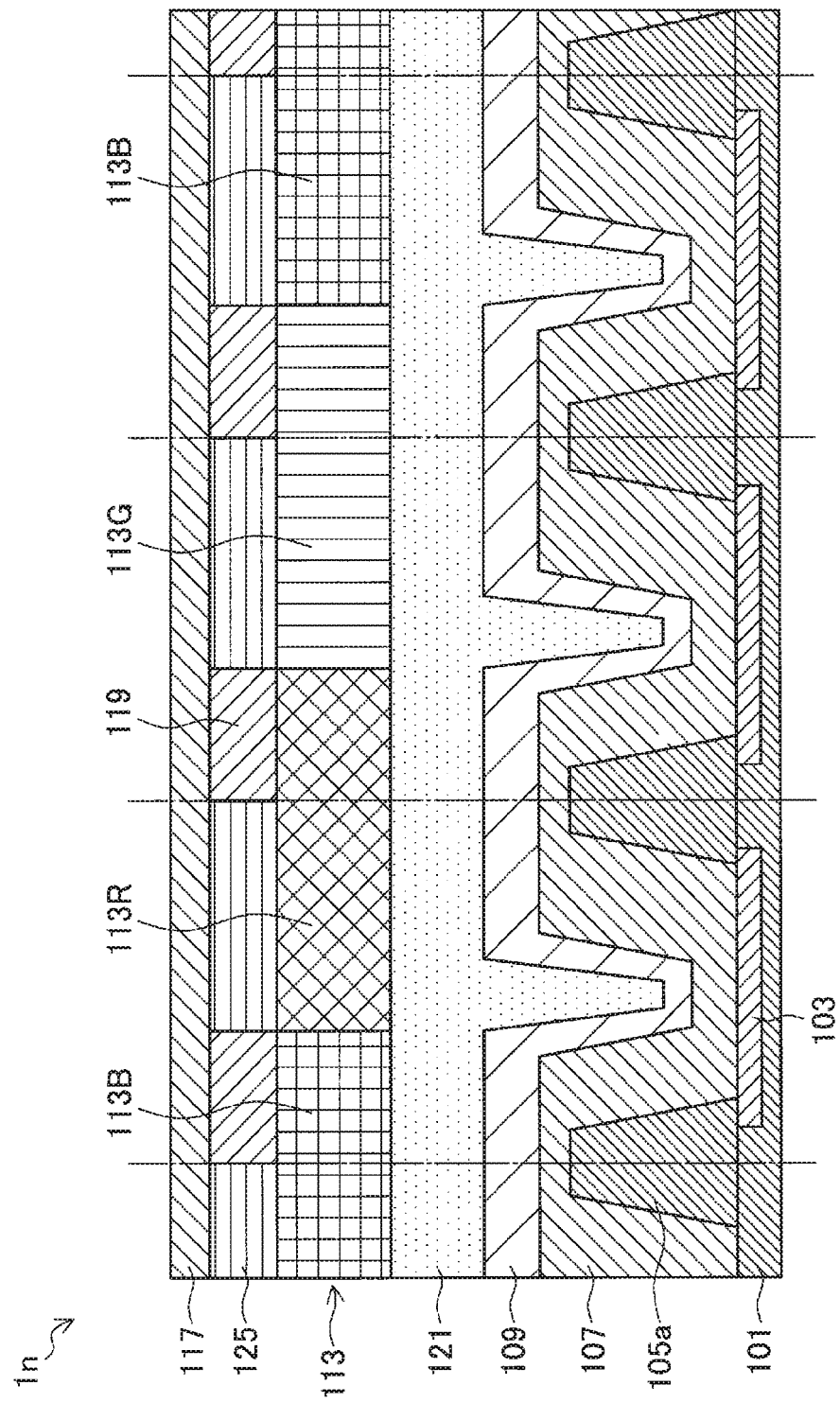
FIG. 17 is a cross-sectional view illustrating a configuration example of a display device according to a fifth modified example of the third embodiment.

FIGS. 15 to 17 are cross-sectional views illustrating configuration examples of display devices according to third to the fifth modified examples of the third embodiment, respectively. Referring to FIGS. 15 to 17, the display devices 1l, 1m, and 1n according to the third to fifth modified examples have configurations in which the reflector is added to the configurations of the display devices 1f, 1g, and 1h according to the third to fifth modified examples of the second embodiment.

Here, the display devices 1i, and 1k according to the third embodiment and the first and second modified examples thereof are the display devices of the OCCF scheme. On the other hand, the display devices 1l, 1m, and 1n according to the third to fifth modified examples illustrated in FIGS. 15 to 17 are the display devices of the facing CF scheme. As described above, the display device according to the third embodiment may be a display device of any of the OCCF scheme and the facing CF scheme.

4. WITH REGARD TO AMOUNT OF MISALIGNMENT OF CF

As described above, in the second and third embodiments, the configuration in which the center of the luminescence surface of the light emitting element 103 in the horizontal surface and the center of the CF 113a are shifted from each other by a predetermined amount of misalignment L is provided. Here, a method for setting the amount of misalignment L will be described. In the second and third embodiments, the amount of misalignment L of the CF 113a in a pixel is set in accordance with the viewing angle required of the pixel. In the following, with a focus on one pixel, a method for setting the amount of misalignment L of the CF 113a in the pixel in a case where the viewing angle required of the pixel is $\theta_0$ is described with reference to FIG. 18 to FIG. 21. FIG. 18 to FIG. 21 are diagrams for describing a method for setting the amount of misalignment L of the CF 113a. Each of FIG. 18 to FIG. 21 simulatively shows the luminescence section 127 of one light emitting element 103, one CF 113a provided to correspond to the light emitting element 103 (in the illustrated example, a CF 113R), and the display surface 201 of the display device according to the second and third embodiments.

As shown in FIG. 18 to FIG. 21, a case where the viewing angle of the focused-on pixel is $\theta_0$ means a case where, when emission light from the luminescence section 127 passes through the CF 113R and other medium layers (the first member 107, the protection film 109, the planarizing film 111, etc. described with reference to FIG. 4 or the like) and is emitted from the display surface 201, light is emitted in a direction at an angle of $\theta_0$ from the direction perpendicular to the display surface 201. Here, it is assumed that the medium layers other than the CF 113R contain a uniform material, for the sake of simplicity; if the refractive index of this material is denoted by $n_1$, the refractive index of the CF 113R is denoted by $n_2$, and the refractive index of an air layer on the outside of the display surface 201 is denoted by $n_0$, the emission angle $\theta_1$ of emission light from the luminescence section 127 (the angle of emission light with respect to the direction perpendicular to the luminescence surface of the luminescence section 127) when emission light from the display surface 201 has an angle of $\theta_0$ can be expressed by Mathematical Formula (1) below from the law of refraction.

[Math. 1]

$$\theta_1 = \arcsin\left(\frac{n_0 \sin(\theta_0)}{n_1}\right) \tag{1}$$

In other words, if light emitted from the luminescence section 127 at an emission angle of $\theta_1$ passes through the CF 113R and the other medium layers and travels, light with a viewing angle of $\theta_0$ is emitted from the display surface 101. Therefore, the amount of misalignment L of the CF 113R for obtaining light with a viewing angle of $\theta_0$ on the display surface 101 may be set as a such a value that light emitted from the luminescence section 127 at an emission angle of $\theta_1$ passes through the CF 113R and the other medium layers. Here, medium layers such as the first member 107 and the protection film 109 exist immediately above the luminescence section 127 in the display device according to the second and third embodiments as described with reference to FIG. 4, and emission light from the luminescence section 127 necessarily passes through these medium layers because of the structure; hence, there is no need to consider conditions for emission light from the luminescence section 127 to pass through these medium layers. Therefore, in the end, the amount of misalignment L of the CF 113R for obtaining light with a viewing angle of $\theta_0$ on the display surface 201 may be set as such a value that emission light with an emission angle of $\theta_1$ from the luminescence section 127 passes through the CF 113R. Thus, in the second and third embodiments, the amount of misalignment L of the CF 113R is set as such a value that emission light with an emission angle of $\theta_1$ from the luminescence section 127 is incident on the lower surface of the CF 113R.

Figure 18:
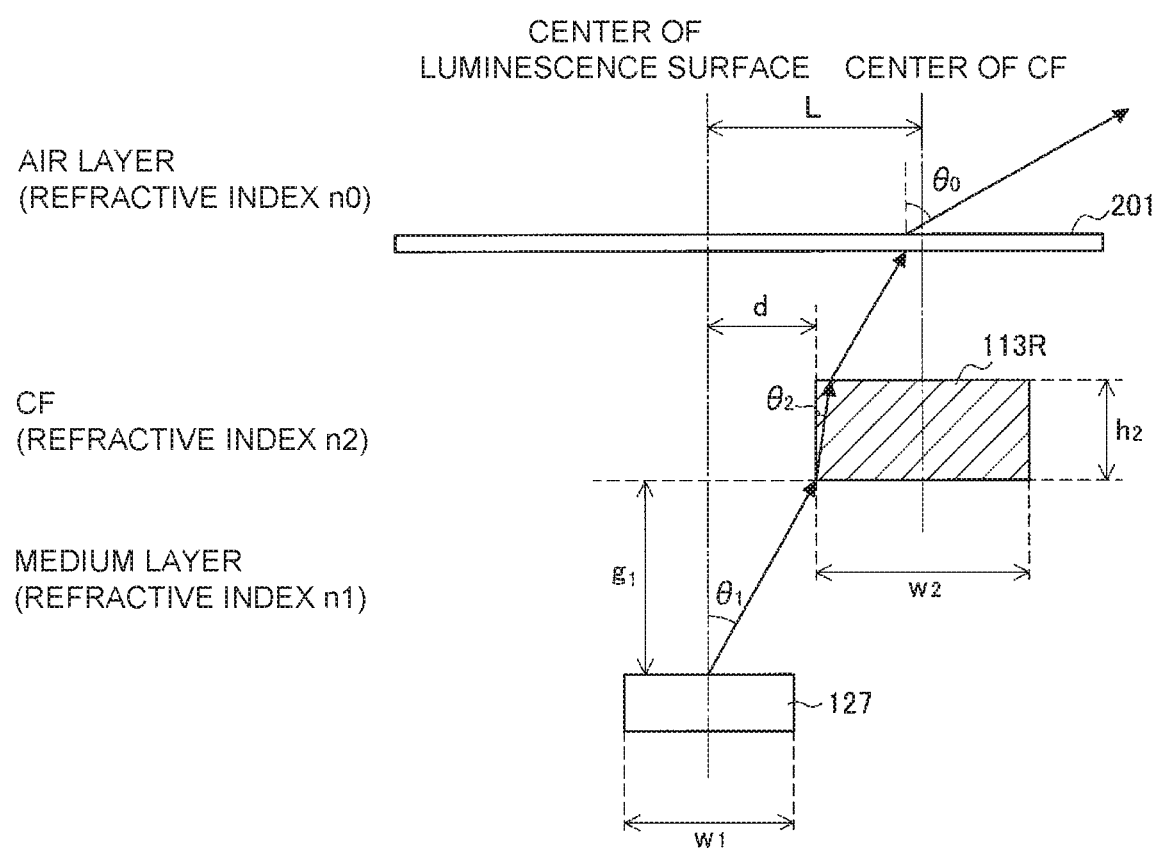
FIG. 18 is a diagram for describing a method for setting the amount of misalignment L of the CF.

First, it is assumed that light is emitted from one point of the center of the luminescence surface of the luminescence section 127, for the sake of simplicity; and the range of the amount of misalignment L of the CF 113R in this case is set. In this event, the case where the value of the amount of misalignment L of the CF 113R is largest is a case where emission light from the center of the luminescence surface of the luminescence section 127 is incident on an end of the lower surface of the CF 113R on a side near to the luminescence section 127. FIG. 18 shows the positional relationship between the luminescence section 127 and the CF 113R and the locus of a light beam in such a case where emission light from the center of the luminescence surface of the luminescence section 127 is incident on an end of the lower surface of the CF 113R on a side near to the luminescence section 127 (in the illustrated example, the left end). When the luminescence section 127 and the CF 113R are in the positional relationship shown in FIG. 18, the amount of misalignment L of the CF 113R can be expressed by Mathematical Formula (2) below from geometric consideration.

[Math. 2]

$$L = d + \frac{w_2}{2} \quad (2)$$
$$= g_1 \tan(\theta_1) + \frac{w_2}{2}$$

Here, the width of the CF 113R is denoted by $w_2$, the distance in the stacking direction from the surface of the luminescence section 127 to the lower surface of the CF 113R is denoted by $g_1$, and the distance in the horizontal plane from the luminescence position in the luminescence section 127 to the position where emission light is incident on the CF 113R is denoted by d.

Figure 19:
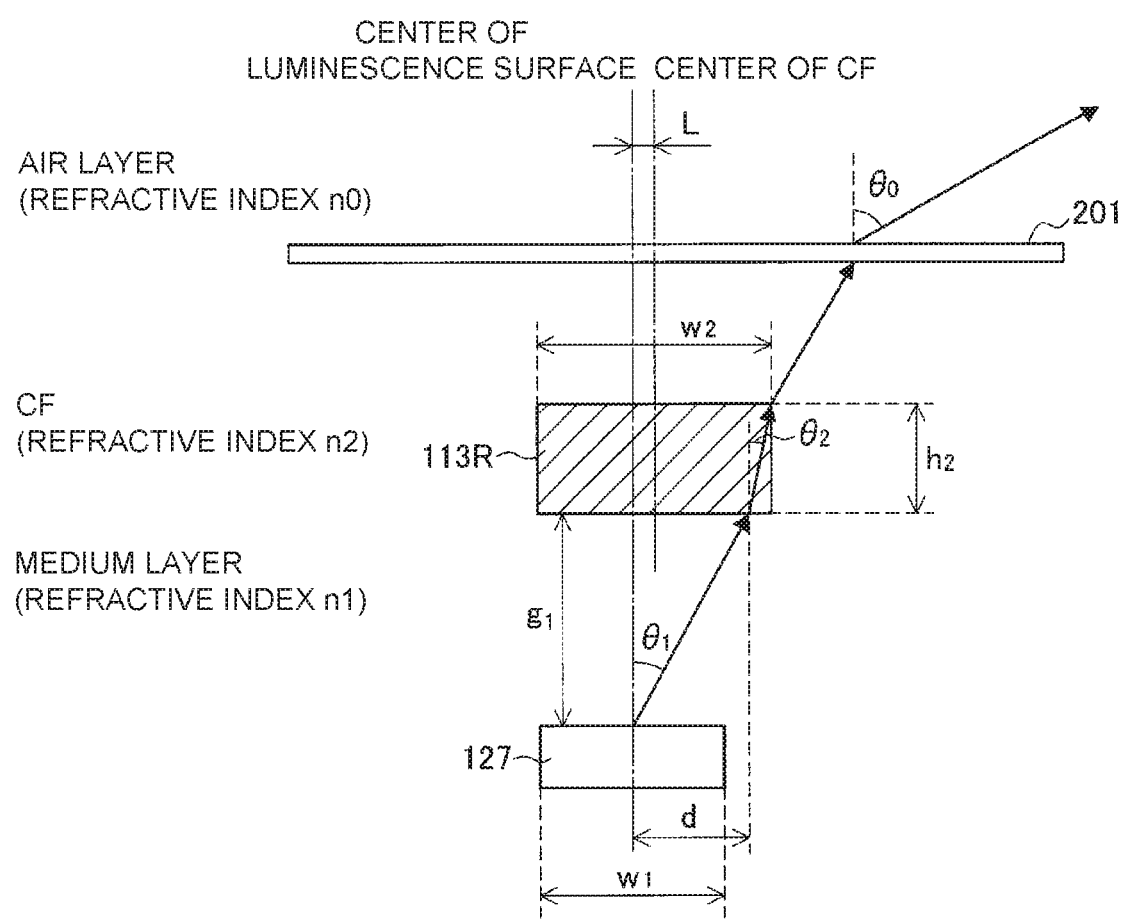
FIG. 19 is a diagram for describing a method for setting the amount of misalignment L of the CF.

On the other hand, in a case where it is assumed that light is emitted from one point of the center of the luminescence surface of the luminescence section 127, the case where the value of the amount of misalignment L of the CF 113R is smallest is a case where emission light from the center of the luminescence surface of the luminescence section 127 is incident on an end of the lower surface of the CF 113R on a side far from the luminescence section 127. FIG. 19 shows the positional relationship between the luminescence section 127 and the CF 113R and the locus of a light beam in such a case where emission light from the center of the luminescence surface of the luminescence section 127 is incident on an end of the lower surface of the CF 113R on a side far from the luminescence section 127 (in the illustrated example, the right end). When the luminescence section 127 and the CF 113R are in the positional relationship shown in FIG. 19, the amount of misalignment L of the CF 113R can be expressed by Mathematical Formula (3) below from geometric consideration.

[Math. 3]

$$L = d - \frac{w_2}{2} \quad (3)$$
$$= g_1 \tan(\theta_1) - \frac{w_2}{2}$$

From the above consideration, in a case where it is assumed that light is emitted from one point of the center of the luminescence surface of the luminescence section 127, if the amount of misalignment L of the CF 113R is set so as to satisfy Mathematical Formula (4) below, a viewing angle of $\theta_0$ can be obtained for emission light from the display surface 201.

[Math. 4]

$$g_1 \tan(\theta_1) - \frac{w_2}{2} \le L \le g_1 \tan(\theta_1) + \frac{w_2}{2} \quad (4)$$

Figure 20:
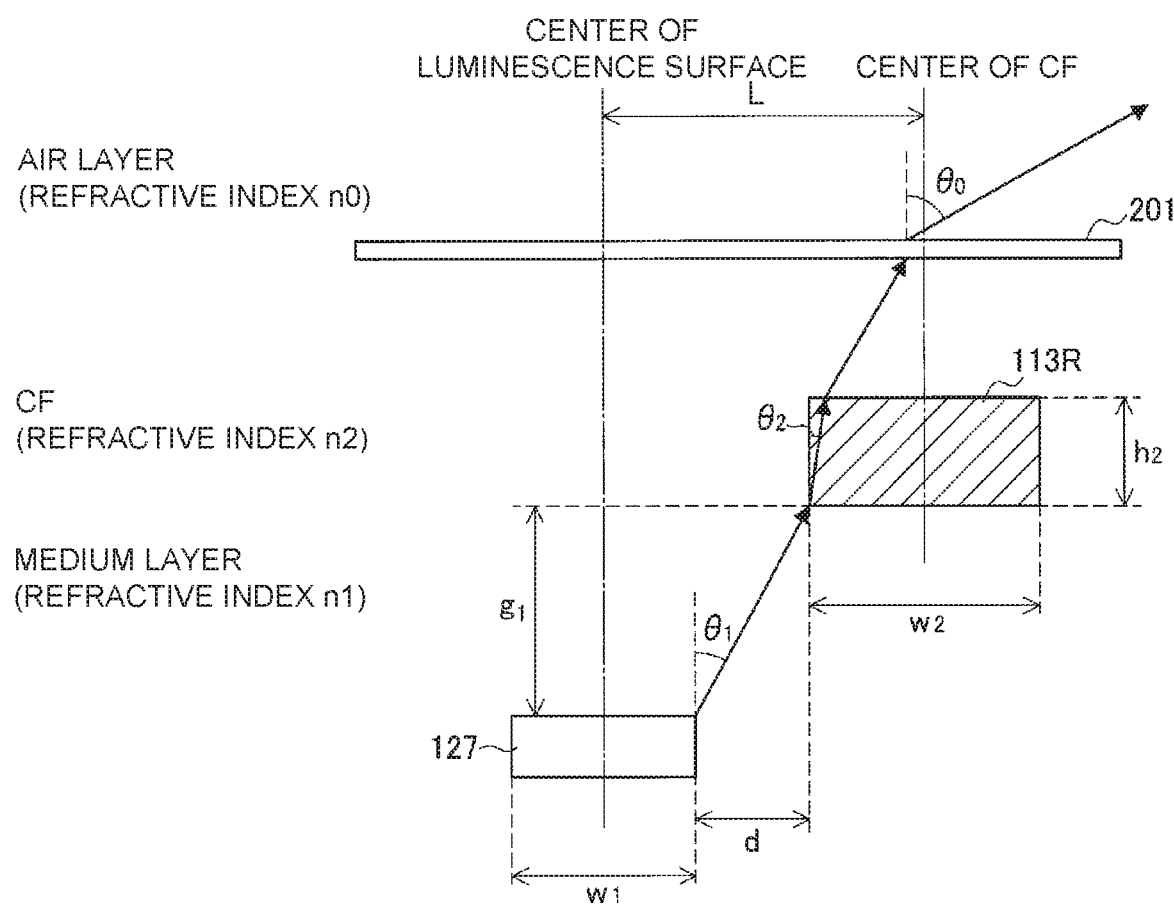
FIG. 20 is a diagram for describing a method for setting the amount of misalignment L of the CF.

However, in practice, light may be emitted from the luminescence section 127 also from areas other than the center of the luminescence surface of the luminescence section 127. Thus, next, the range of the amount of misalignment L of the CF 113R is set more finely by further taking into account luminescence positions in the luminescence surface of the luminescence section 127. In a case where luminescence positions in the luminescence surface of the luminescence section 127 are taken into account, the case where the value of the amount of misalignment L of the CF 113R is largest is a case where emission light from a luminescence position of the luminescence surface of the luminescence section 127 nearest to the CF 113R is incident on the lower surface of the CF 113R. FIG. 20 shows the positional relationship between the luminescence section 127 and the CF 113R and the locus of a light beam in such a case where emission light from a luminescence position of the luminescence surface of the luminescence section 127 nearest to the CF 113R (in the illustrated example, the right end) is incident on the lower surface of the CF 113R. Note that FIG. 20 shows, as an example, the positional relationship between the luminescence section 127 and the CF 113R and the locus of a light beam in a case where emission light from the luminescence section 127 is incident on an end of the lower surface of the CF 113R on a side near to the luminescence section 127 (in the illustrated example, the left end), like in the case shown in FIG. 8. When the luminescence section 127 and the CF 113R are in the positional relationship shown in FIG. 20, the amount of misalignment L of the CF 113R can be expressed by Mathematical Formula (5) below from geometric consideration. Here, the width of the luminescence section 127 is denoted by $w_1$.

[Math. 5]

$$L = d + \frac{w_2}{2} + \frac{w_1}{2} \quad (5)$$
$$= g_1 \tan(\theta_1) + \frac{w_2}{2} + \frac{w_1}{2}$$

Figure 21:
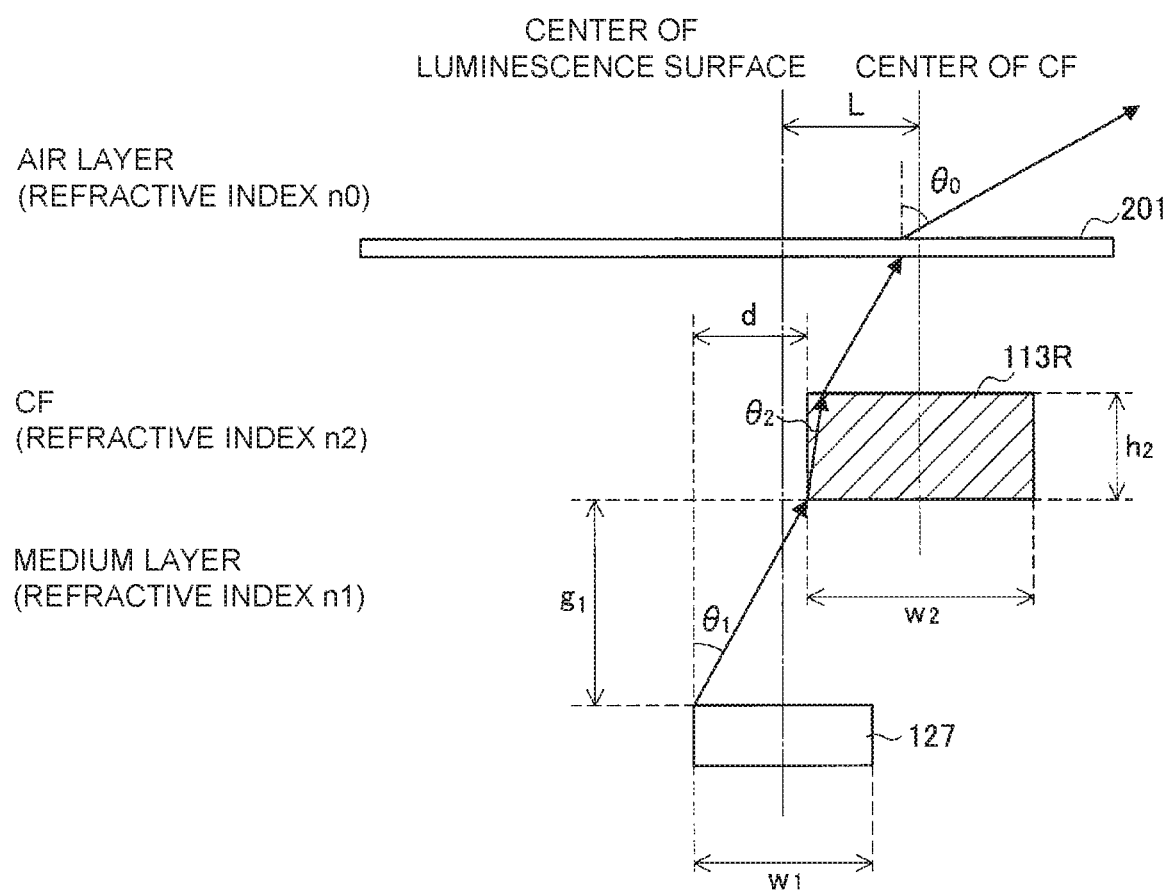
FIG. 21 is a diagram for describing a method for setting the amount of misalignment L of the CF.

On the other hand, in a case where luminescence positions in the luminescence surface of the luminescence section 127 are taken into account, the case where the value of the amount of misalignment L of the CF 113R is smallest is a case where emission light from a luminescence position of the luminescence surface of the luminescence section 127 farthest from the CF 113R is incident on the lower surface of the CF 113R. FIG. 21 shows the positional relationship between the luminescence section 127 and the CF 113R and the locus of a light beam in such a case where emission light from a luminescence position of the luminescence surface of the luminescence section 127 farthest from the CF 113R (in the illustrated example, the left end) is incident on the lower surface of the CF 113R. Note that FIG. 21 shows, as an example, the positional relationship between the luminescence section 127 and the CF 113R and the locus of a light beam in a case where emission light from the luminescence section 127 is incident on an end of the lower surface of the CF 113R on a side near to the luminescence section 127 (in the illustrated example, the left end), like in the case shown in FIG. 18. When the luminescence section 127 and the CF 113R are in the positional relationship shown in FIG. 21, the amount of misalignment L of the CF 113R can be expressed by Mathematical Formula (6) below from geometric consideration.

[Math. 6]

$$L = d + \frac{w_2}{2} - \frac{w_1}{2} \quad (6)$$
$$= g_1 \tan(\theta_1) + \frac{w_2}{2} - \frac{w_1}{2}$$

In FIG. 20 and FIG. 21 above, the case shown in FIG. 18 is envisaged, and the amount of misalignment L of the CF 113R in a case where emission light from the luminescence section 127 is incident on an end of the lower surface of the CF 113R on a side near to the luminescence section 127 is calculated; this similarly applies to the case shown in FIG. 19 where emission light from the luminescence section 127 is incident on an end of the lower surface of the CF 113R on a side far from the luminescence section 127. Therefore, in the end, the range of values that the amount of misalignment L of the CF 113R can take in order to obtain a viewing angle of $\theta_0$ for emission light from the display surface 201 can be expressed by Mathematical Formula (7) below. In other words, if the amount of misalignment L of the CF 113R is set so as to satisfy Mathematical Formula (7) below, a viewing angle of $\theta_0$ can be obtained for emission light from the display surface 201.

[Math. 7]

$$g_1 \tan(\theta_1) - \frac{w_2}{2} - \frac{w_1}{2} \leq L \leq g_1 \tan(\theta_1) + \frac{w_2}{2} + \frac{w_1}{2} \quad (7)$$

Hereinabove, a method for setting the amount of misalignment L of the CF 113R is described. Note that, in the above example, medium layers are treated as a uniform material and the range that the amount of misalignment L of the CF 113a can take is calculated on the assumption that the refractive index of this material is $n_2$, for the sake of simplicity; in a case where it is attempted to find the range of the amount of misalignment L more strictly, the structure of an actual display device like that shown in FIG. 4 or the like may be envisaged, and a similar calculation may be performed while the refractive index of each layer is taken into account.

5. MODIFICATION EXAMPLES

Some additional modification examples of each of the embodiments described hereinabove will now be described.

5-1. Method of Causing Relative Misalignment Between Light Emitting Element and CF In the second and third embodiments described above, in order to cause the relative misalignment between the light emitting element 103 and the CF 113a, the region in which the CF 133a is not formed in the CF layer 113 is formed as transition region 301 in which the amount of misalignment L and the misalignment direction of CF 113a change as described above with reference to FIG. 6. Here, in the second and third embodiments, the method of causing the relative misalignment between the light emitting element 103 and the CF 113a is not limited to the above method, and other methods may be used.

Figure 22:
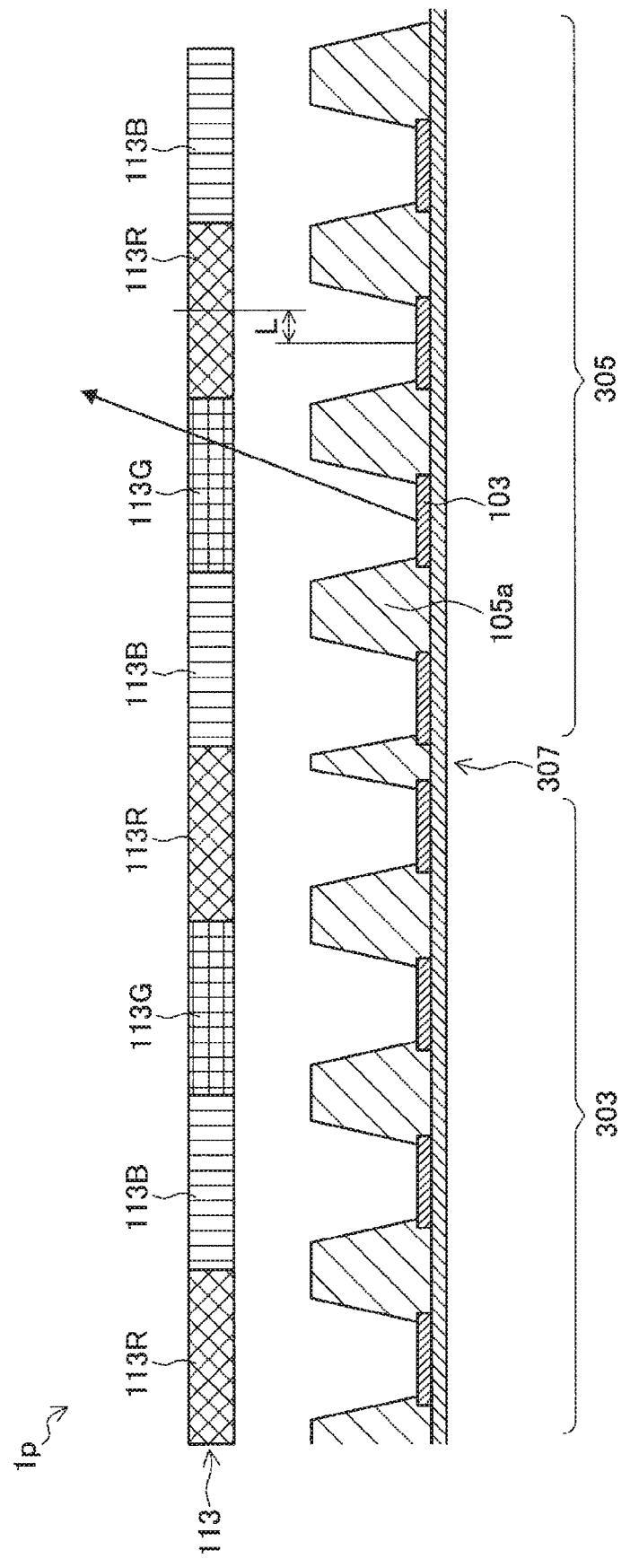
FIG. 22 is a diagram for describing another method for creating a relative misalignment between a light emitting element and a CF.

A modified example in which the relative misalignment between light emitting element 103 and CF 113a is caused by another method will be described with reference to FIG. 22. FIG. 22 is a diagram for explaining another method of causing the relative misalignment between the light emitting element 103 and the CF 113a. Further, in the present modified example, a case in which the method of causing the relative misalignment between the light emitting element 103 and the CF 113a is different from that of the display device 1i according to the third embodiment illustrated in FIG. 12 will be described as an example. In other words, the display device according to the present modified example has a configuration similar to that of the display device 1i except that the method of causing the relative misalignment between the light emitting element 103 and the CF 113a is different. In FIG. 22, a cross section of a display device 1p according to the present modified example is simplified, and only a first substrate 101, a light emitting element 103, a pixel defining film 105a, and a CF layer 113 are illustrated.

In the present modification examples, like in the second and third embodiments, the inside of the display surface of the display device 1p is divided into a plurality of regions, and the amount of misalignment L and the misalignment direction may be set for each region in accordance with the position in the display surface of the region. FIG. 22 shows, as an example, region 303 in which the amount of displacement L of the CF 113a=0, region 305 that is adjacent to region 303 and in which the amount of displacement L of the CF 113a is a prescribed value that is not zero, and a transition region 307 provided between region 303 and region 305, similarly to FIG. 6. As illustrated, in the present modification example, the transition region 307 is formed as a region in which the pitch with which light emitting elements 103 are arranged (that is, the pixel spacing) is narrower than a normal pitch of another region. Further, in the transition region 307, an arrangement pitch is adjusted such that the arrangement pitch of the light emitting element 103 is reduced on the misalignment side. Thereby, in region 305, the center of the CF 113a is placed to be shifted in the horizontal plane from the center of the luminescence surface of the luminescence section 127 by an amount of misalignment L>0 in the direction in which the arrangement pitch of the light emitting element 103 is reduced. Also between not-shown other regions, the amount of misalignment L and/or the misalignment direction can be changed between regions by providing a similar transition region 307.

Figure 23:
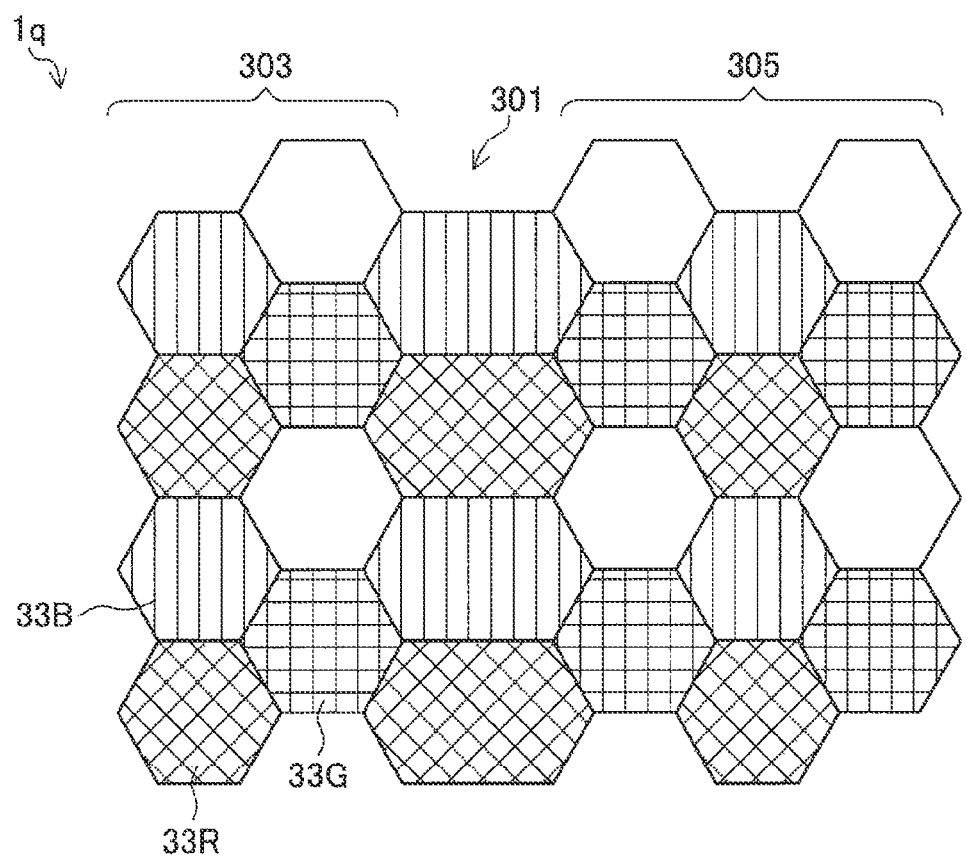
FIG. 23 is a diagram for describing still another method for creating a relative misalignment between a light emitting element and a CF.

Further, another modified example of causing the relative misalignment between light emitting element 103 and CF 113a will be described with reference to FIG. 23. FIG. 23 is a diagram for describing still another method of causing the relative misalignment between the light emitting element 103 and the CF 113a, FIG. 23 schematically illustrates a state in which a configuration near the boundary between two regions which are different in the amount of misalignment L of the CF 113a of the CF layer 113 of the display device 1q according to the present modified example is viewed from above. Further, the display device 1q according to the present modified example has a configuration similar to those of the display devices 1c and 1i according to the second and third embodiments except that the method of causing the relative misalignment between the light emitting element 103 and the CF 113a is different.

In the present modified example, similarly, the display surface of the display device 1q is divided into a plurality of regions, and the amount of misalignment L and misalignment direction can be set for each region in accordance with a position of each region in the display surface. FIG. 23 shows, like in FIG. 22, as an example, region 303 where the amount of displacement L of the CF 113a=0, region 305 that is adjacent to region 303 and in which the amount of displacement L of the CF 113a is a prescribed value that is not zero, and a transition region 301 provided between region 303 and region 305. As illustrated, the transition region 301 is formed as a region in which the area of the CF 113a is larger than the area of a normal CF 113a in another region. Further, the CF 113a located in the transition region 301 is formed such that the area of the CF 113a is increased on the misalignment side. Thereby, in region 305, the center of the CF 113a is placed to be shifted in the horizontal plane from the center of the luminescence surface of the light emitting element 103 by an amount of misalignment L 0 in the direction in which the area of the CF 113a located in the transition region 301 is increased. Also between not-shown other regions, the amount of misalignment L and/or the misalignment direction can be changed between regions by providing a similar transition region 301.

Note that, also in any of the modification examples described above, the amount of misalignment L and the misalignment direction may be set not on a region basis but on a pixel basis, and the amount of misalignment L and the misalignment direction may be changed in a continuous manner between pixels in accordance with the position in the display surface 201 of the pixel, like in the second and third embodiments described above. Further, the misalignment direction of the CF 113a may be only one of the horizontal direction and the vertical direction of the display surface 201, or may be a two-dimensional arbitrary direction in the horizontal plane.

5-2. Other Methods for Setting Amount of Misalignment L Of Cf

As described in (4. With regard to amount of misalignment of CF) above, in the second and third embodiments described above, the amount of misalignment L of the CF 113a is set by prescribing conditions where emission light from the luminescence section 127 is incident on the lower surface of the CF 113R. However, the second and third embodiments are not limited to this example. For example, it is presumed that, depending on the characteristics of emission light from the luminescence section 127, the characteristics of the CF 113a, etc., color conversion will be performed appropriately and light of desired characteristics can be emitted from the display surface 201 even in a case where emission light from the luminescence section 127 is incident on the side surface of the CF 113a. Thus, the amount of misalignment L of the CF 113a may be set taking into account also a case where emission light from the luminescence section 127 is incident on the side surface of the CF 113a.

Figure 24:
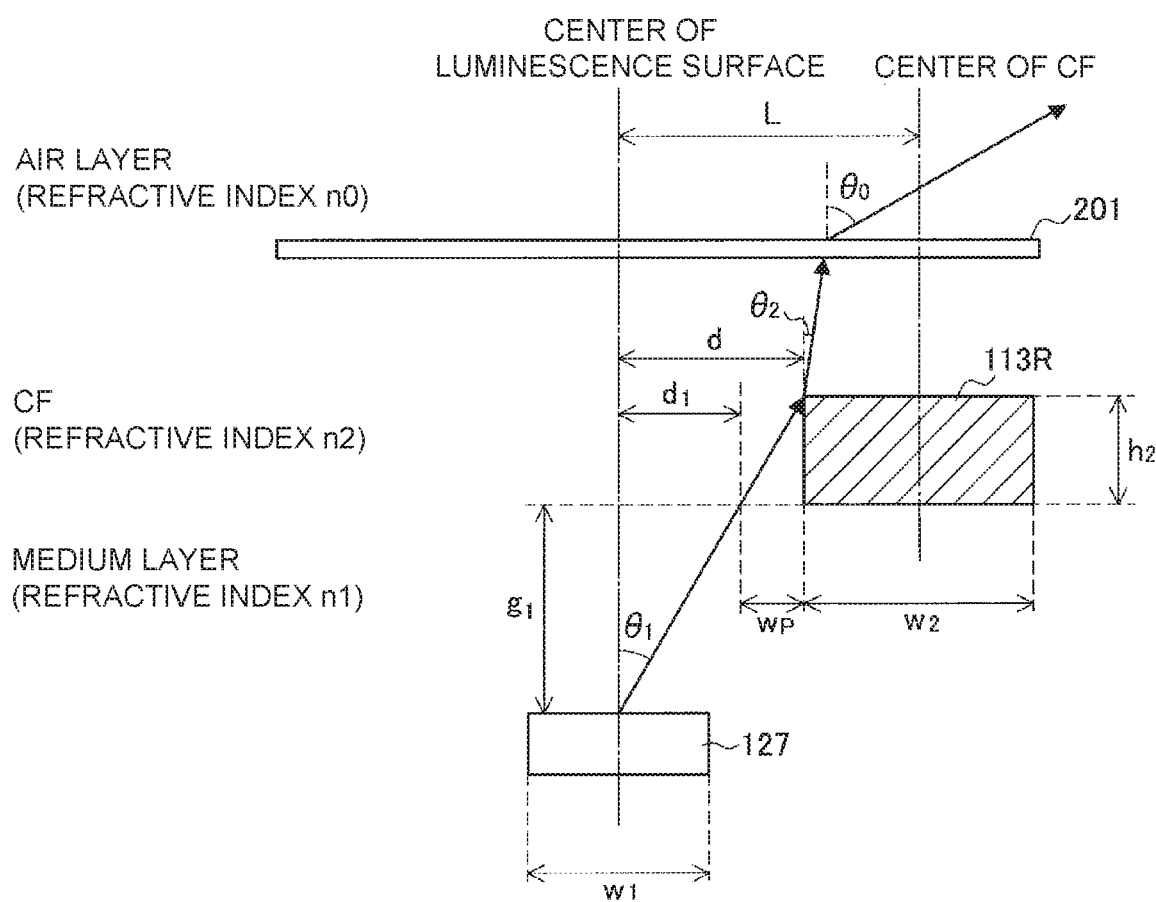
FIG. 24 is a diagram for describing a method for setting the amount of misalignment L of the CF taking into account also a case where emission light from a luminescence section is incident on a side surface of the CF.

Such a modification example in which the amount of misalignment L of the CF 113a is set taking into account also a case where emission light from the luminescence section 127 is incident on the side surface of the CF 113a will now be described with reference to FIG. 24. FIG. 24 is a diagram for describing a method for setting the amount of misalignment L of the CF 113a taking into account also a case where emission light from the luminescence section 127 is incident on the side surface of the CF 113a. Similarly to FIG. 18 to FIG. 21, FIG. 24 simulatively shows the luminescence section 127 of one light emitting element 10 provided in a display device according to the present modification example, one CF 113a provided to correspond to the light emitting element 10 (in the illustrated example, a CF 113R), and the display surface 201 of the display device. Further, medium layers are treated as layers containing a uniform material with a refractive index of $n_2$.

Herein, it is assumed that light is emitted from one point of the center of the luminescence surface of the luminescence section 127, for the sake of simplicity. In this event, in a case where emission light from the luminescence section 127 is incident on the side surface of the CF 113a, the case where the value of the amount of displacement L of the CF 113R is largest is a case where emission light from the luminescence section 127 is incident on the vicinity of the upper end of the side surface of the CF 113a. Herein, a case where emission light from the luminescence section 127 is incident on the upper end of the side surface of the CF 113a is assumed for the sake of simplicity. FIG. 24 shows the positional relationship between the luminescence section 127 and the CF 113R and the locus of a light beam in such a case where emission light from the luminescence section 127 is incident on the upper end of the side surface of the CF 113R. When the luminescence section 127 and the CF 113R are in the positional relationship shown in FIG. 24, the amount of misalignment L of the CF 113R can be expressed by Mathematical Formula (8) below from geometric consideration.

[Math. 8]

$$L = d + \frac{w_2}{2} \tag{8}$$
$$= d_1 + w_p + \frac{w_2}{2}$$
$$= g_1 \tan(\theta_1) + h_2 \tan(\theta_1) + \frac{w_2}{2}$$

Here, the thickness of the CF 113R is denoted by $h_2$; within the distance d in the horizontal plane from the luminescence position in the luminescence section 127 to the position where emission light is incident on the CF 113R, the length of a portion corresponding to the distance $g_1$ in the stacking direction from the surface of the luminescence section 127 to the lower surface of the CF 113R is denoted by $d_1$; and within the distance d, the length of a portion corresponding to the thickness $h_2$ of the CF 113R is denoted by $w_p$.

Thus, the upper limit value of the range that the amount of displacement L of the CF 113R can take is made larger by taking into account also a case where emission light from the luminescence section 127 is incident on the side surface of the CF 113a. In FIG. 24, it is assumed that light is emitted from one point of the center of the luminescence surface of the luminescence section 127; however, if also a case where light is emitted from other parts in the luminescence surface is taken into account like in the consideration in (4. With regard to amount of misalignment of CF) above, the range that the amount of displacement L of the CF 113R can take can be expressed by Mathematical Formula (9) below, in the end. In other words, in the present modification example, if the amount of misalignment L of the CF 113R is set so as to satisfy Mathematical Formula (9) below, a viewing angle of $\theta_0$ can be obtained for emission light from the display surface 201. Note that, in practice, if emission light from the luminescence section 127 is not incident on "the vicinity of the upper end" of the side surface of the CF 113a, the emission light does not pass through the CF 113a and color conversion is not performed appropriately; hence, in Mathematical Formula (9) below, a case where emission light from the luminescence section 127 is incident on "the upper end" of the side surface of the CF 113a, that is, a case where L is equal to the upper limit value is excluded.

[Math. 9]

$$g_1 \tan(\theta_1) - \frac{w_2}{2} - \frac{w_1}{2} \leq L \leq g_1 \tan(\theta_1) + h_2 \tan(\theta_1) + \frac{w_2}{2} + \frac{w_1}{2} \tag{9}$$

Note that, instead of analytically setting the amount of misalignment L as described hereinabove, an optimum amount of misalignment and an optimum misalignment direction of the CF 113a, and an optimum distribution of CFs 113a in the display surface may be found in a trial and error manner by repeatedly performing an optical simulation and an experiment using a sample fabricated on the basis of the simulation result, as another method for setting the amount of misalignment L of the CF 11.3a.

6. SPECIFIC CONFIGURATION EXAMPLE OF DISPLAY DEVICE

More specific configuration examples of the display devices according to the respective embodiments and the respective modified examples described above will be described. Here, a specific configuration example of the display device 1i according to the third embodiment will be described as an example with reference to FIG. 25. Here, specific configurations of the display device according to another embodiment and the display device according to each modified example of each embodiment may be similar to that of the display device illustrated in FIG. 25 to be described below except for the difference from the display device 1i according to the third embodiment described above.

Figure 25:
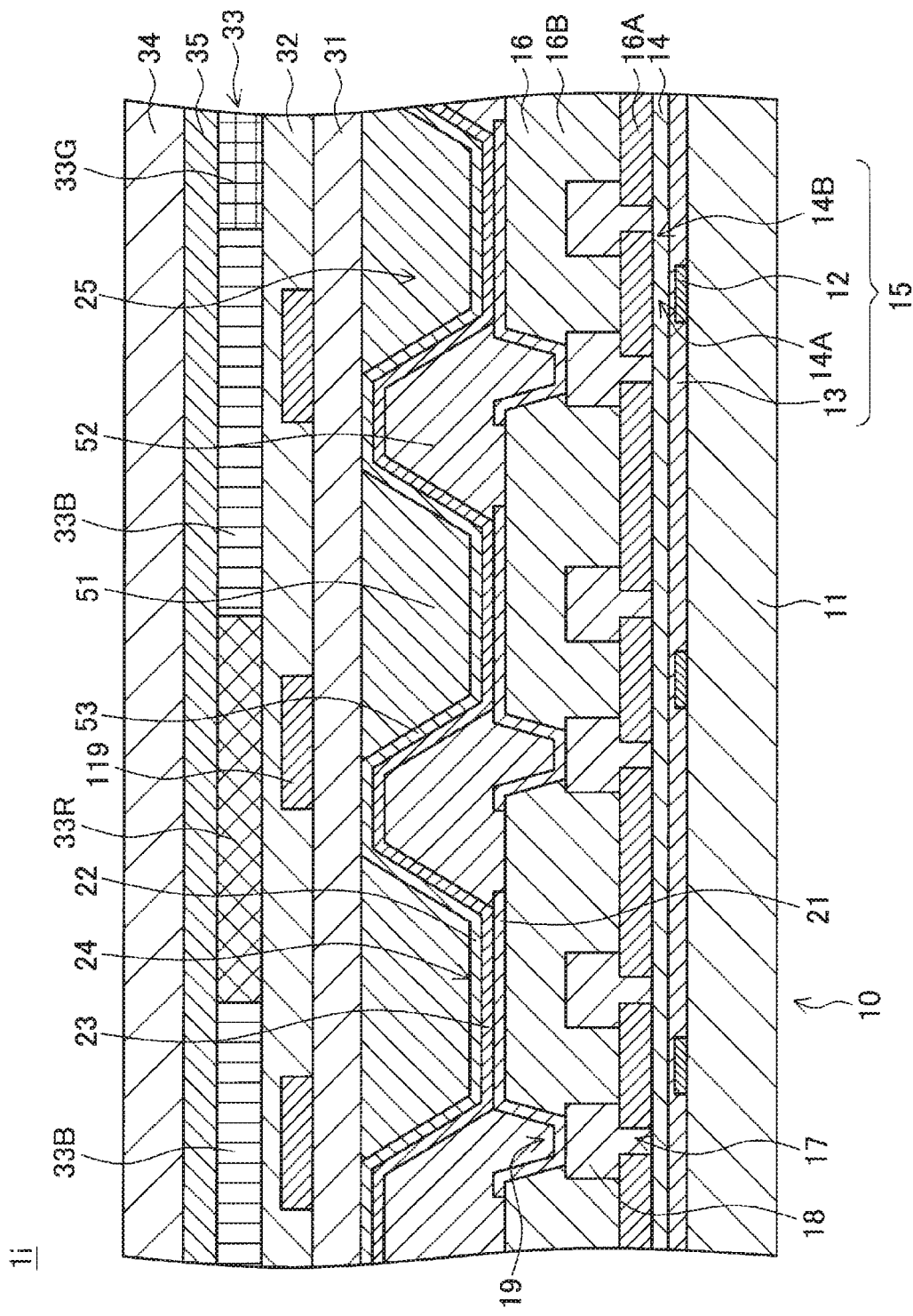
FIG. 25 is a cross-sectional view showing a specific configuration example of a display device according to the third embodiment.

FIG. 25 is a cross-sectional view illustrating a specific configuration example of the display device 1i according to the third embodiment. FIG. 25 illustrates a partial sectional view of the display device 1i.

Referring to FIG. 25, a display device 1i according to the third embodiment includes, on a first substrate 11, a plurality of light emitting elements 10 each of which includes an OLED and emits white light, and a CF layer 33 that is provided on the light emitting elements 10 and in which CFs of some colors are formed to correspond to the light emitting elements 10. Further, a second substrate 34 containing a material transparent to the light from the light emitting element 10 is placed on the CF layer 33. A first substrate 11, a light emitting element 10, a CF layer 33, and a second substrate 34 correspond to the first substrate 101, the light emitting element 103, the CF layer 113, and the second substrate 117, respectively.

Further, on the first substrate 11, TFTs 15 for driving the light emitting elements 10 are provided to correspond to the light emitting elements 10. An arbitrary light emitting element 10 is selectively driven by the TFT 15, then light from the driven light emitting element 10 passes through the corresponding CF, and the color of the light is converted appropriately and the converted light is emitted from the upper side via the second substrate 34; thereby, desired images, characters, etc. are displayed.

(First Substrate and Second Substrate)

In the illustrated configuration example, the first substrate 11 includes a silicon substrate. Further, the second substrate 34 contains quartz glass. However, the third embodiment is not limited to this example, and various publicly-known materials may be used as the first substrate 11 and the second substrate 34. For example, each of the first substrate 11 and the second substrate 34 may include a high strain point glass substrate, a soda-lime glass (a mixture of $Na_2O$, CaO, and $SiO_2$) substrate, a borosilicate glass (a mixture of $Na_2O$, $B_2O_3$, and $SiO_2$) substrate, a forsterite ($Mg_2SiO_4$) substrate, a lead glass (a mixture of $Na_2O$, PbO, and $SiO_2$) substrate, various glass substrates in which an insulating film is formed on a surface, a quartz substrate, a quartz substrate in which an insulating film is formed on a surface, a silicon substrate in which an insulating film is formed on a surface, or an organic polymer substrate (for example, polymethyl methacrylate (PMMA), polyvinyl alcohol (PVA), polyvinylphenol (PVP), a polyether sulfone (PES), a polyimide, a polycarbonate, polyethylene terephthalate (PET), or the like). The materials contained in the first substrate 11 and the second substrate 34 may be the same, or may be different. However, since the display device 1i is of the top emission type, the second substrate 34 preferably contains a material type with a high transmittance that can transmit the light from light emitting element 10 favorably.

(Light Emitting Element and Second Member)

The light emitting element 10 includes a first electrode 21, an organic layer 23 provided on the first electrode 21, and a second electrode 22 formed on the organic layer 23. More specifically, a second member 52 in which openings 25 are provided so as to expose at least parts of the first electrode 21 is stacked on the first electrode 21, and the organic layer 23 is provided on portions of the first electrode 21 that are exposed at the bottoms of the openings 25. That is, the light emitting element 10 has a configuration in which the first electrode 21, the organic layer 23, and the second electrode 22 are stacked in this order in the opening 25 of the second member 52. This stacked structure functions as a luminescence section 24 of each pixel. That is, a portion of the light emitting element 10 falling under the opening 25 of the second member 52 serves as a luminescence surface. Further, the second member 52 functions as a pixel defining film that is provided between pixels and partitions the area of the pixel. The second member 52 corresponds to the pixel defining film 105a described above.

The organic layer 23 includes a luminescence layer containing an organic luminescent material, and can emit white light. The specific configuration of the organic layer 23 is not limited, and may be various publicly-known configurations. For example, the organic layer 23 may have a stacked structure of a hole transport layer, a luminescence layer, and an electronic transport layer, a stacked structure of a hole transport layer and a luminescence layer that serves also as an electronic transport layer, a stacked structure of a hole injection layer, a hole transport layer, a luminescence layer, an electronic transport layer, and an electron injection layer, or the like. Further, in a case where each of these stacked structures or the like is used as a "tandem unit," the organic layer 23 may have a tandem structure of two stages in which a first tandem unit, a connection layer, and a second tandem unit are stacked. Alternatively, the organic layer 23 may have a tandem structure of three or more stages in which three or more tandem units are stacked. In a case where the organic layer 23 includes a plurality of tandem units, an organic layer 23 that emits white light as a whole can be obtained by assigning red, green, and blue to the luminescent colors of the luminescence layers of the tandem units.

In the illustrated configuration example, the organic layer 23 is formed by depositing an organic material by vacuum vapor deposition. However, the third embodiment is not limited to this example, and the organic layer 23 may be formed by various publicly-known methods. For example, as the method for forming the organic layer 23, physical vapor deposition methods (PVD methods) such as the vacuum vapor deposition method, printing methods such as the screen printing method and the inkjet printing method, a laser transfer method in which a stacked structure of a laser absorbing layer and an organic layer formed on a substrate for transfer is irradiated with laser light to separate the organic layer on the laser absorbing layer and the organic layer is transferred, various application methods, etc. may be used.

The first electrode 21 functions as an anode. Since the display device 1i is of the top emission type, the first electrode 21 contains a material capable of reflecting the light from the organic layer 23. In the illustrated configuration example, the first electrode 21 contains an alloy of aluminum and neodymium (Al—Nd alloy). Further, the film thickness of the first electrode 21 is approximately 0.1 µm to 1 µm, for example. However, the third embodiment is not limited to this example, and the first electrode 21 may contain various publicly-known materials used as the material of an electrode on the light reflection side that functions as an anode in a common organic EL display. Further, the film thickness of the first electrode 21 is not limited to the above example either, and the first electrode 21 may be formed in film thickness ranges commonly employed in organic EL displays, as appropriate.

For example, the first electrode 21 may contain a metal with a high work function, such as platinum (Pt), gold (Au), silver (Ag), chromium (Cr), tungsten (W), nickel (Ni), copper (Cu), iron (Fe), cobalt (Co), or tantalum (Ta), or an alloy with a high work function (for example, a Ag—Pd—Cu alloy containing silver as a main component and containing 0.3 mass % to 1 mass % of palladium (Pd) and 0.3 mass % to 1 mass % of copper, an Al—Nd alloy, or the like). Alternatively, the first electrode 21 may contain an electrically conductive material having a small work function value and a high light reflectance, such as aluminum or an alloy containing aluminum. In this case, it is preferable to improve hole injection properties by providing an appropriate hole injection layer on the first electrode 21, or the like. Alternatively, the first electrode 21 may have a structure in which a transparent electrically conductive material excellent in hole injection characteristics, such as an oxide of indium and tin (ITO) or an oxide of indium and zinc (IZO), is stacked on a reflective film with high light reflectivity such as a dielectric multiple-layer film or aluminum.

The second electrode 22 functions as a cathode. Since the display device is of the top emission type, the second electrode 22 contains a material capable of transmitting the light from the organic layer 23. In the illustrated configuration example, the second electrode 22 contains an alloy of magnesium and silver (Mg—Ag alloy). Further, the film thickness of the second electrode 22 is approximately 10 nm, for example. However, the third embodiment is not limited to this example, and the second electrode 22 may contain various publicly-known materials used as the material of an electrode on the light transmission side that functions as a cathode in a common organic EL display. Further, the film thickness of the second electrode 22 is not limited to the above example either, and the second electrode 22 may be formed in film thickness ranges commonly employed in organic EL displays, as appropriate.

For example, the second electrode 22 may contain aluminum, silver, magnesium, calcium (Ca), sodium (Na), strontium (Sr), an alloy of an alkali metal and silver, an alloy of an alkaline earth metal and silver (for example, an alloy of magnesium and silver (Mg—Ag alloy)), an alloy of magnesium and calcium (Mg—Ca alloy), an alloy of aluminum and lithium (Al—Li alloy), or the like. In a case where each of these materials is used in a single layer, the film thickness of the second electrode 22 is approximately 4 nm to 50 nm, for example. Alternatively, the second electrode 22 may have a structure in which a layer of any of the materials described above and a transparent electrode containing, for example, ITO or IZO (with a thickness of, for example, approximately 30 nm to 1 µm) are stacked from the organic layer 23 side. In a case where such a stacked structure is used, the thickness of the layer of any of the materials described above may be as thin as approximately 1 nm to 4 nm, for example. Alternatively, the second electrode 22 may include only a transparent electrode. Alternatively, the second electrode 22 may be provided with a bus electrode (auxiliary electrode) containing a low resistance material, such as aluminum, an aluminum alloy, silver, a silver alloy, copper, a copper alloy, gold, or a gold alloy, to reduce the resistance of the second electrode 22 as a whole.

In the illustrated configuration example, each of the first electrode 21 and the second electrode 22 is formed by forming a material as a film with a prescribed thickness by the vacuum vapor deposition method and then patterning the film by the etching method. However, the third embodiment is not limited to this example, and the first electrode 21 and the second electrode 22 may be formed by various publicly-known methods. Examples of the method for forming the first electrode 21 and the second electrode 22 include vapor deposition methods including the electron beam vapor deposition method, the hot filament vapor deposition method, and the vacuum vapor deposition method, the sputtering method, the chemical vapor deposition method (CVD method), the metal organic chemical vapor deposition method (MOCVD method), a combination of the ion plating method and the etching method, various printing methods (for example, the screen printing method, the inkjet printing method, the metal mask printing method, etc.), plating methods (the electroplating method, the electroless plating method, etc.), the lift-off method, the laser ablation method, the sol-gel method, etc.

The second member 52 is formed by forming $SiO_2$ as a film with a prescribed film thickness by the CVD method and then patterning the $SiO_2$ film using photolithography technology and etching technology. However, the material of the second member 52 is not limited to this example, and various materials having insulating properties may be used as the material of the second member 52. Examples of the material contained in the second member 52 include $SiO_2$, MgF, LiF, a polyimide resin, an acrylic resin, a fluorine resin, a silicone resin, a fluorine-based polymer, a silicone-based polymer, etc. However, as described later, the second member 52 contains a material having a lower refractive index than the material of a first member 51.

(Configuration of Parts Below Light Emitting Element)

On the first substrate 11, the first electrode 21 included in the light emitting element 10 is provided on an interlayer insulating layer 16 containing SiON. Then, the interlayer insulating layer 16 covers a light emitting element driving section formed on the first substrate 11.

The light emitting element driving section includes a plurality of TFTs 15. In the illustrated example, one TFT 15 is provided for one light emitting element 10. The TFT 15 includes a gate electrode 12 formed on the first substrate 11, a gate insulating film 13 formed on the first substrate 11 and the gate electrode 12, and a semiconductor layer 14 formed on the gate insulating film 13. A region of the semiconductor layer 14 located immediately above the gate electrode 12 functions as a channel region 14A, and regions located so as to sandwich the channel region 14A function as source/drain regions 14B. Note that, although in the illustrated example the TFT 15 is of a back gate type, the third embodiment is not limited to this example, and the TFT 15 may be of a bottom gate type.

An interlayer insulating layer 16 including two layers (a lower layer interlayer insulating layer 16A and an upper layer interlayer insulating layer 16B) is stacked on the semiconductor layer 14 by the CVD method. In this event, after the lower layer interlayer insulating layer 16A is stacked, contact holes 17 are provided in portions of the lower layer interlayer insulating layer 16A corresponding to the source/drain regions 14B so as to expose the source/drain regions 14B, by using photolithography technology and etching technology, for example, and an interconnection 18 containing aluminum is formed so as to fill the contact hole 17. The interconnections 18 are formed by combining the vacuum vapor deposition method and the etching method, for example. After that, the upper layer interlayer insulating layer 16B is stacked.

In a portion of the upper layer interlayer insulating layer 16B Where the interconnection 18 is provided, a contact hole 19 is provided so as to expose the interconnection 18, by using photolithography technology and etching technology, for example. Then, when forming the first electrode 21 of the light emitting element 10, the first electrode 21 is formed so as to be in contact with the interconnection 18 via the contact hole 19. Thus, the first electrode 21 of the light emitting element 10 is electrically connected to a source/drain region 14B of the TFT 15 via the interconnection 18. The gate electrode 12 of the TFT 15 is connected to a scanning circuit (not shown). Each TFT 15 is driven by a current being applied to the TFT 15 from the scanning circuit at an appropriate timing, and each light emitting element 10 emits light so that desired images, characters, etc. are displayed as a whole. Various publicly-known methods may be used as the method for driving the TFT 15 to obtain appropriate display (that is, the method for driving the display device 1*i*), and hence a detailed description is omitted herein.

Note that, although in the above example the interlayer insulating layer 16 contains SiON, the third embodiment is not limited to this example. The interlayer insulating layer 16 may contain various publicly-known materials that can be used as an interlayer insulating layer in a common organic EL display. For example, as the material contained in the interlayer insulating layer 16, $SiO_2$-based materials (for example, $SiO_2$, BPSG, PSG, BSG, AsSG, PbSG, SiON, spin-on glass (SOG), low melting point glass, a glass paste, and the like), SiN-based materials, and insulating resins (for example, a polyimide resin, a novolac-based resin, an acrylic-based resin, polybenzoxazole, and the like) may be used singly or in combination, as appropriate. Further, the method for forming the interlayer insulating layer 16 is not limited to the above example either, and publicly-known methods such as the CVD method, the application method, the sputtering method, and various printing methods may be used for the formation of the interlayer insulating layer 16. Furthermore, although in the above example the interconnection 18 is formed by forming aluminum as a film and patterning the film by the vacuum vapor deposition method and the etching method, the third embodiment is not limited to this example. The interconnection 18 may be formed by forming, as a film, any of various materials that are used as an interconnection in a common organic EL display and patterning the film by various methods.

(Configuration of Parts Above Light Emitting Element 10)

The opening 25 provided in the second member 52 of the light emitting element 10 is formed so as to have a tapered shape in which the side wall of the opening 25 is inclined such that the opening area increases with proximity to the bottom. Then, a first member 51 is put in the opening 25. That is, the first member 51 is a layer that is provided immediately above the luminescence surface of the light emitting element 10 and that propagates emission light from the light emitting element upward. Further, by forming the opening 25 of the second member 52 in the above manner, a cross-sectional shape in the stacking direction of the first member 51 (that is, the illustrated cross-sectional shape) has a substantially trapezoidal shape, and thus the first member 51 has a truncated conical or pyramidal shape in which the bottom surface faces up. The first member 51 corresponds to the first member 107 described above.

The first member 51 is formed by forming $Si_{1-x}N_x$ as a film by the vacuum vapor deposition method so as to fill the opening 25, and then planarizing the surface of the $Si_{1-x}N_x$ film by the chemical mechanical polishing method (CMP method) or the like. However, the material of the first member 51 is not limited to this example, and various materials having insulating properties may be used as the material of the first member 51. Examples of the material contained in the first member 51 include $Si_{1-x}N_x$, ITO, IZO, $TiO_2$, $Nb_2O_5$, a bromine-containing polymer, a sulfur-containing polymer, a titanium-containing polymer, a zirconium-containing polymer, etc. The method for forming the first member 51 is not limited to this example either, and various publicly-known methods may be used as the method for forming the first member 51.

However, in the third embodiment, as described above, the materials of the first member 51 and the second member 52 are selected such that the refractive index $n_1$ of the first member 51 and the refractive index $n_2$ of the second member 52 satisfy the relation of $n_1 > n_2$. By selecting the materials of the first member 51 and the second member 52 such that the refractive indices satisfy the relation mentioned above, at least a part of the light that has propagated through the first member 51 is reflected at a surface of the second member 52 facing the first member 51. More specifically, the organic layer 23 and the second electrode 22 of the light emitting element 10 are formed between the first member 51 and the second member 52, and therefore at least a part of the light that has propagated through the first member 51 is reflected at the interface between the second member 52 and the organic layer 23. That is, the surface of the second member 52 facing the first member 51 functions as a reflector 53.

In the third embodiment, the first member 51 is provided immediately above the luminescence surface of the light emitting element 10, as mentioned above. Then, the first member 51 has a truncated conical or pyramidal shape in which the bottom surface faces up, and therefore light emitted from the luminescence surface of the light emitting element 10 is reflected upward, which is the light emission direction, by the interface between the first member 51 and the second member 52, that is, the reflector 53. Thus, according to the third embodiment, the efficiency of extracting emission light from the light emitting element 10 can be improved by providing the reflector 53, and the luminance as the entire display device 1*i* can be improved.

Note that an investigation by the present inventors shows that, to improve the efficiency of extracting emission light from the light emitting element 10 more favorably, it is preferable that the refractive indices of the first member 51 and the second member 52 satisfy the relation of $n_1 - n_2 \geq 0.20$. It is more preferable that the refractive indices of the first member 51 and the second member 52 satisfy the relation of $n_1 - n_2 \geq 0.30$. Furthermore, to further improve the efficiency of extracting emission light from the light emitting element 10, it is preferable that the shape of the first member 51 satisfy the relations of $0.5 \leq R_1/R_2 \leq 0.8$ and $0.5 \leq H/R_1 0.8$. Here, $R_1$ represents the diameter of the light incidence surface of the first member 51 (that is, a surface facing down in the stacking direction and facing the luminescence surface of the light emitting element 10), $R_2$ represents the diameter of the light emitting surface of the first member 51 (that is, a surface facing up in the stacking direction), and H represents the distance between the bottom surface and the upper surface (the height in the stacking direction) in a case where the first member 51 is regarded as a truncated cone or pyramid.

A protection film 31 is stacked on a planarized first member 51. The protection film 31 corresponds to the protection film 109 described above. For example, the protection film 31 is formed by depositing $Si_{1-y}N_y$, at a predetermined thickness (about 3.0 µm) through a vacuum evaporation technique. Here, a material and a film thickness of the protection film 31 are not limited to this example, and the protection film 31 may be appropriately formed to have a film thickness commonly employed in an organic EL display using various publicly-known materials used as a protection film of a common organic EL display.

A reflector 119 is formed on the protection film 31, corresponding to each pixel. The reflector 119 has a structure in which the recursive structure of the prism type is formed toward the lower surface serving as the reflective surface. The recursive structure of the prism type can be realized, for example, by arranging right triangular pyramids having a substantially equilateral triangle shape at a plan view consecutively. The reflector 119 having the recursive structure of the prism type can be formed, for example, by applying a technique of forming an opening in a film by etching so that a side wall has a tapered shape in a semiconductor process and processing a film (for example, a metallic film) made of a material having an appropriate reflectance in a prism shape using a photolithography technique and an etching technique.

Here, the third embodiment is not limited to this example, and the reflector 119 may have another configuration or may be formed by another processing technique. For example, the reflector 119 having the recursive structure of the prism type may be formed by manufacturing a master on which a structure obtained by inverting the prism shape is formed on a surface and transferring a shape of a surface of the master onto a surface of a film made of a material having an appropriate reflectance (for example, a metallic film).

Alternatively, for example, the reflector 119 may have the recursive structure of the bead type instead of the prism type. The reflector 119 having the recursive structure of the bead type can be formed, for example, by processing a resist material in a spherical or hemispherical shape through a photolithography technique. As the processing method, for example, various publicly-known methods used for forming an on-chip lens (OCL) in a field of imager can be applied.

Alternatively, for example, the reflector 119 having the recursive structure of the bead type may be formed by arranging beads (particles) made of glass, plastic, or the like dispersedly inside the resin layer. According to this configuration, since the reflector 119 can be formed merely by dispersedly arranging commercially available beads in an appropriate resin layer, the reflector 119 can be formed more easily at a lower cost.

Further, the reflector 119 may not be formed directly on the protection film 31, and for example, the reflector 119 may be formed above the protection film 31 by boding a separately prepared reflector 119 to a predetermined position on the protection film 31. Further, the recursive structure formed in the reflector 119 is not limited to the above example, and various publicly-known structures may be applied as the recursive structure.

Further, in the third embodiment, the lower surface of the reflector 119 need not be necessarily a recursive reflector. For example, the lower surface of the reflector 119 may be a mirror or a scatterer. Even in a case in which the lower surface of the reflector 119 is a mirror or a scatterer, some components of light incident on the reflector 119 can be reflected toward the luminescence surface of the light emitting element 10, and thus a constant effect related to the improvement of the light extraction efficiency can be obtained. Here, in a case in which the lower surface of the reflector 119 is a recursive reflector, it is possible to more efficiently reflect the light incident on the reflector 119 toward the luminescence surface of the light emitting element 10, and thus in order to more remarkably obtain the effect of improving the light extraction efficiency, it is more preferable to configure the lower surface of the reflector 119 with the recursive reflector.

The reflector 119 in which the lower surface is a mirror or a scatterer may be formed by various methods. For example, as the method of forming the reflector 119 in which the lower surface is a mirror or a scatterer, for example, a method in which an appropriate material is deposited by vapor deposition or sputtering to form a film, an appropriate material (a resist material) is formed in a film form by a lithography technique, a mirror or scatterer is bonded onto the protection film 31, and a surface shape of a master having a surface shape of a separately prepared mirror or scatterer is transferred onto the film of the appropriate material, or a material functioning a mirror or a scatterer is coated when it has a film form.

After the reflector 119 is formed on the protection film 31, a planarizing film 32 is laminated. The planarizing film 32 corresponds to the planarizing film 111 described above. The planarizing film 32 is formed, for example, by depositing $SiO_2$ at a predetermined film thickness (about 2.0 µm) through a CVD technique and planarizes the surface thereof through a CMP technique or the like. However, the materials and the film thicknesses of the planarizing film 32 are not limited to these examples, and the planarizing film 32 may contain various publicly-known materials used as a planarizing film of a common organic EL display so as to have film thicknesses commonly employed in an organic EL display, as appropriate.

Here, in the third embodiment, it is preferable that the material of the protection film 31 be selected such that the refractive index $n_3$ of the protection film 31 is equal to the refractive index $n_1$ of the first member 51 or smaller than the refractive index $n_1$ of the first member 51. Furthermore, the materials of the protection film 31 and the planarizing film 32 are selected such that the absolute value of the difference between the refractive index $n_3$ of the protection film 31 and the refractive index $n_4$ of the planarizing film 32 is preferably less than or equal to 0.30 and more preferably less than or equal to 0.20. By thus selecting the materials of the protection film 31 and the planarizing film 32, the reflection or scattering of emission light from the light emitting element 10 at the interface between the first member 51 and the protection film 31 and the interface between the protection film 31 and the planarizing film 32 can be suppressed, and light extraction efficiency can be further improved.

Note that, as the configuration from the first substrate 11 to the protection film 31 of the display device 1i, particularly as the configuration of the reflector 53, the configuration of a display device disclosed in JP 2013-191533A, which is a prior application by the present applicant, may be used, for example.

A CF layer 33 is formed on the planarizing film 32. The CF layer 33 corresponds to the CF layer 113 described above. The CF layer 33 is formed so that CFs of respective colors (a red CF 33R, a green CF 33P, and a blue CF 33B)

having a predetermined area are formed with respect to the respective light emitting elements 10. The CF layer 33 may be formed by performing exposure on a resist material into a prescribed configuration and performing development by photolithography technology, for example. The film thickness of the CF layer 33 is approximately 2 μm, for example. However, the material, the formation method, and the film thickness of the CF layer 33 are not limited to these examples, and the CF layer 33 may be formed so as to have a film thickness commonly employed in an organic EL display by using various publicly-known materials that are used as a CF layer of a common organic EL display and various publicly-known methods, as appropriate.

The second substrate 34 is stuck to the upper side of the CF layer 33 via, for example, a sealing resin film 35 of an epoxy resin or the like, and thereby the display device 1i is fabricated. Note that the material of the sealing resin film 35 is not limited to this example, and the material of the sealing resin film 35 may be selected in view of high transmissivity to the emission light from the light emitting element 10, excellence in adhesiveness to the CF layer 33 located on the lower side and the second substrate 34 located on the upper side, low reflectivity at the interface between the CF layer 33 located on the lower side and the second substrate 34 located on the upper side, etc., as appropriate.

The specific configuration example of the display device 1i according to the third embodiment has been described above. Further, the specific configuration examples of the display devices according to the respective embodiments and the respective modified examples of the present disclosure are not limited to the above examples. Various kinds of conditions commonly used for forming a layer can be used as a material, a film thickness, and a forming method of each of layers constituting the display device according to the respective embodiments and the respective modified examples.

7. APPLICATION EXAMPLES

An application example of the display devices according to the respective embodiments and the respective modified examples will be described. Here, several examples of electronic apparatuses to which the display devices according to the respective embodiments and the respective modified examples described above can be applied will be described.

Figure 26:
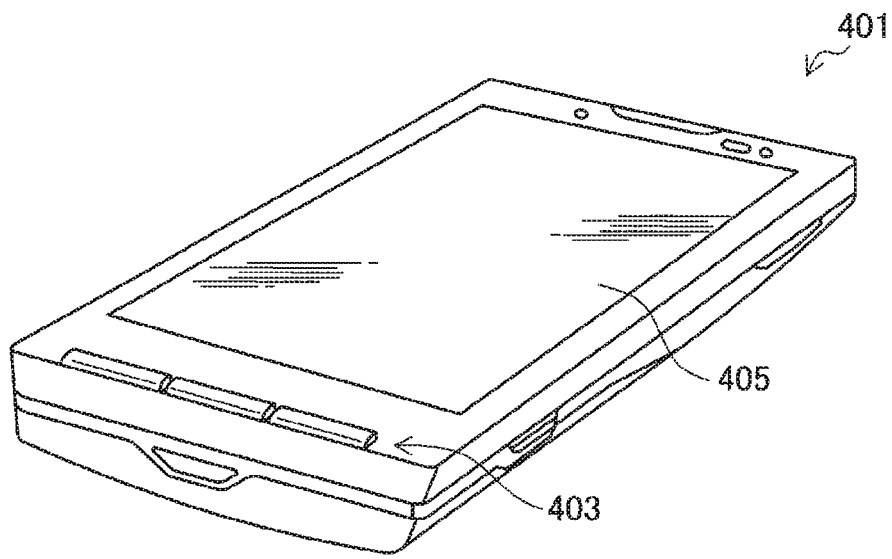
FIG. 26 is a diagram showing an external appearance of a smartphone that is an example of an electronic apparatus in which the display devices according to the embodiments and the modification examples can be used.

FIG. 26 is a diagram showing an external appearance of a smartphone that is an example of the electronic apparatus in which the display devices according to each of the embodiments and each of the modification examples can be used. As shown in FIG. 26, a smartphone 401 includes an operation section 403 that includes a button and accepts an operation input by the user and a display section 405 that displays various pieces of information. The display section 405 may include any of the display devices according to each of the embodiments and each of the modification examples.

Figure 27:
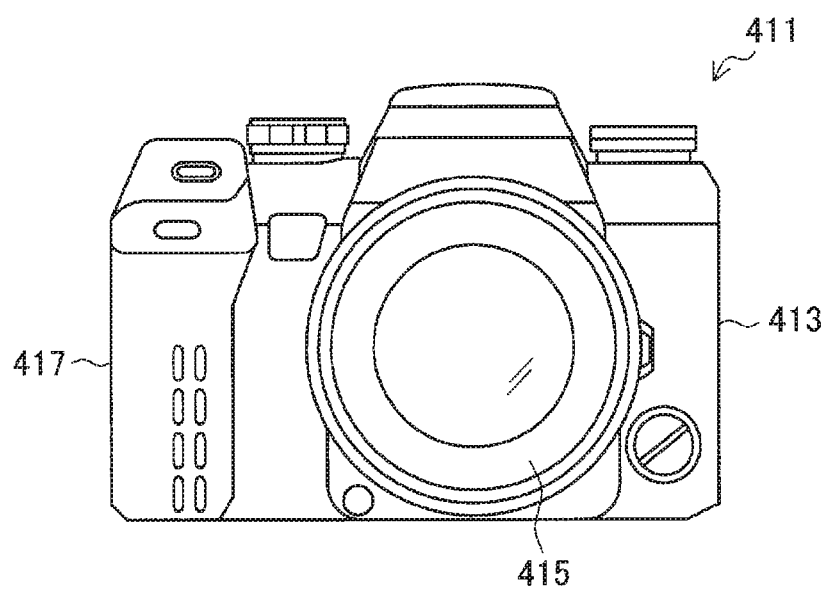
FIG. 27 is a diagram showing an external appearance of a digital camera that is another example of an electronic apparatus in which the display devices according to the embodiments and the modification examples can be used.
Figure 28:
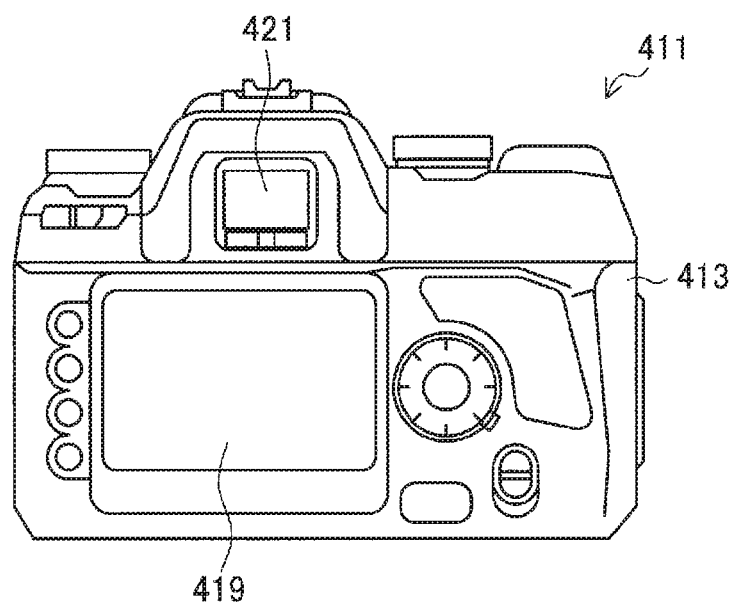
FIG. 28 is a diagram showing an external appearance of a digital camera that is another example of an electronic apparatus in which the display devices according to the embodiments and the modification examples can be used.

FIG. 27 and FIG. 28 are diagrams showing external appearances of a digital camera that is another example of the electronic apparatus in which the display devices according to each of the embodiments and each of the modification examples can be used. FIG. 27 shows an external appearance of a digital camera 411 as seen from the front side (the subject side), and FIG. 27 shows an external appearance of the digital camera 411 as seen from the rear side. As shown in FIG. 26 and FIG. 27, the digital camera 411 includes a main body section (camera body) 413, a replaceable lens unit 415, a grip section 417 that is gripped by the user during photographing, a monitor 419 that displays various pieces of information, and an EVF 421 that displays a through image that is observed by the user during photographing. The monitor 419 and the EVF 421 may include any of the display devices according to each of the embodiments and each of the modification examples.

Figure 29:
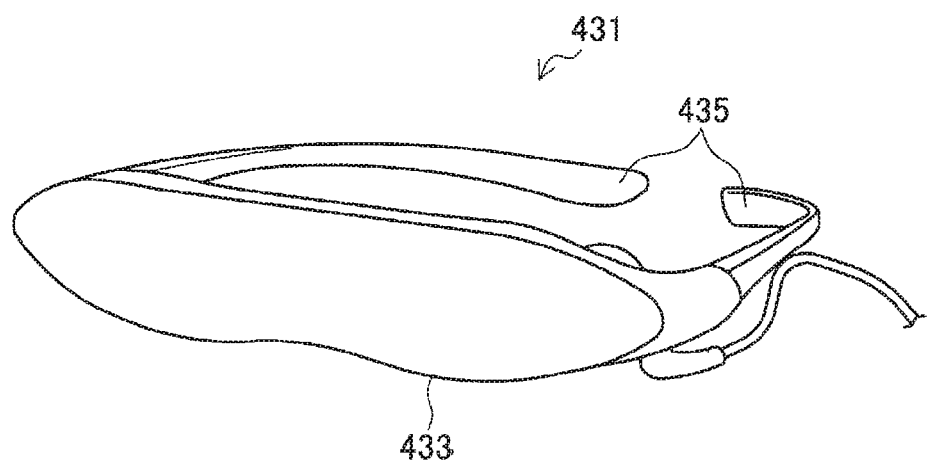
FIG. 29 is a diagram showing an external appearance of an HMD that is another example of an electronic apparatus in which the display devices according to the embodiments and the modification examples can be used.

FIG. 29 is a diagram showing an external appearance of an HMD that is another example of the electronic apparatus in which the display devices according to each of the embodiments and each of the modification examples can be used. As shown in FIG. 29, an HMD 431 includes an eyeglass-type display section 433 that displays various pieces of information and ear-fixing sections 435 that are fixed to the user's ears during wearing. The display section 433 may include any of the display devices according to each of the embodiments and each of the modification examples.

Hereinabove, some examples of the electronic apparatus in which the display devices according to each of the embodiments and each of the modification examples can be used are described. Note that the electronic apparatus in which the display devices according to each of the embodiments and each of the modification examples can be used is not limited to those described above as examples, and the display device can be used for display devices that are mounted on electronic apparatuses in all fields that perform display on the basis of an image signal inputted from the outside or an image signal generated in the inside, such as a television device, an electronic book, a PDA, a notebook PC, a video camera, an HMD, and a game apparatus.

8. SUPPLEMENT

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

For example, the configurations that the display device according to each of the embodiments can have and the configurations that the display devices according to the modification examples can have, which are described hereinabove, may be used in combination with each other within the extent of feasibility. For example, the methods described above may be combined in order to create a relative misalignment between the light emitting element and the CF, as appropriate. Further, for example, a reflector structure may be formed in the display devices according to the first embodiment and the modified example thereof. In other words, in the display device in which the reflector is formed in at least some pixels, a reflector structure may be formed without causing the relative misalignment between the light emitting element and the reflector.

Further, although in each of the embodiments described hereinabove the display device 1 has a configuration in which one pixel includes sub-pixels of four colors of a red pixel, a green pixel, a blue pixel, and a white pixel, the present disclosure is not limited to this example. By applying configurations similar to those of the display devices according to the respective embodiments to display devices having other pixel configurations, similar effects can be obtained. Further, the method for arranging pixels is not limited to the delta arrangement described above, either. For example, similar effects can be obtained also by other pixel arrangements such as a stripe arrangement, a diagonal arrangement, and a rectangle arrangement.

For example, although in the above an embodiment in which the display device is an organic EL display is described as an example of the present disclosure, the present disclosure is not limited to this example. The display device that is an object of the present disclosure may be various display devices as long as they are display devices that can achieve color display by using CFs, such as a liquid crystal display, a plasma display, and an electronic paper device. When the light emitting section and the reflector are arranged in the other display devices in a state in which the center of the reflector is shifted from the center of the luminescence surface of the light emitting section in a plane perpendicular to the stacking direction so that the light emitted in a direction other than a desired direction among the emission light from the light emitting section is reflected in at least a partial region in the display surface, effects similar to those of the respective embodiments described above can be obtained. Here, the light emitting section is a part that is included in each pixel of the display device and that emits light toward the outside. For example, in an organic EL display like each of the embodiments described hereinabove, the light emitting section corresponds to a light emitting element. Further, for example in a liquid crystal display, the light emitting section corresponds to a region corresponding to one pixel of a liquid crystal panel. Further, for example in a plasma display, the light emitting section corresponds to a region corresponding to one discharge cell of a plasma display panel.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

A display device, including:
 a plurality of light emitting sections formed on a substrate; and
 reflectors provided above the light emitting sections with respect to the plurality of light emitting sections positioned in at least a partial region of a display surface, lower surfaces of the reflectors reflecting part of emission light from the light emitting sections,
 in which the light emitting sections and the reflectors are arranged in a state in which centers of the reflectors are shifted from centers of luminescence surfaces of the light emitting sections in a plane perpendicular to a stacking direction so that light emitted in a direction other than a desired direction among the emission light from the light emitting sections is reflected.

(2)

The display device according to (1), further including:
 color filters provided above the light emitting sections, corresponding to the plurality of light emitting sections,
 in which the light emitting sections and the color filters are arranged so that relative misalignment occurs between the centers of the luminescence surfaces of the light emitting sections and centers of the color filters corresponding to the light emitting sections in a plane perpendicular to the stacking direction in at least the light emitting sections provided with the reflectors, and
 a misalignment direction of the centers of the reflectors with respect to the centers of the luminescence surfaces of the light emitting sections in the plane perpendicular to the stacking direction is a direction opposite to a misalignment direction of the centers of the color filters with respect to the centers of the luminescence surfaces of the light emitting sections in the plane perpendicular to the stacking direction.

(3)

The display device according to (1) or (2), in which reflective surfaces of the reflectors have a recursive structure.

(4)

The display device according to (3), in which the recursive structure has a configuration in which corner cube prisms are arranged.

(5)

The display device according to any one of (1) to (4), further including:
 color filters provided above the light emitting sections, corresponding to the plurality of light emitting sections,
 in which the reflectors are formed below the color filters.

(6)

The display device according to any one of (1) to (5), further including:
 a first member provided immediately above the light emitting section to be positioned below the reflector and having a substantially truncated conical or pyramidal shape in which a sectional area in a direction in the plane perpendicular to the stacking direction gradually increases upward, the first member propagating the emission light from the light emitting section; and
 a second member provided between the first members between adjacent light emitting sections,
 in which a refractive index of the first member is larger than a refractive index of the second member.

(7)

The display device according to any one of (1) to (6), in which an amount of misalignment and a misalignment direction of the center of the reflector with respect to the center of the luminescence surface of the light emitting section in the plane perpendicular to the stacking direction have a distribution in the display surface.

(8)

The display device according to any one of (1) to (7), in which an amount of misalignment of the center of the reflector with respect to the center of the luminescence surface of the light emitting section in the plane perpendicular to the stacking direction increases toward an outer edge of the display surface.

(9)

The display device according to any one of (1) to (8), in which an amount of misalignment and a misalignment direction of the center of the reflector with respect to the center of the luminescence surface of the light emitting section in the plane perpendicular to the stacking direction are set in accordance with a viewing angle required in a pixel constituted by the light emitting section provided with the reflector.

(10)

The display device according to any one of (1) to (9), in which a misalignment direction of the center of the reflector with respect to the center of the luminescence surface of the light emitting section in the plane perpendicular to the stacking direction is a direction opposite to a direction from a center of the display surface to a position at which the light emitting section provided with the reflector exists in the display surface.

(11)

The display device according to (2), in which the relative misalignment between the center of the luminescence surface of the light emitting section and the center of the color filter in the plane perpendicular to the stacking direction is caused by areas of the plurality of color filters having a distribution in the display surface.

(12)

The display device according to (11), in which a plurality of regions are set in the display surface and an area of the color filter positioned between the adjacent regions is different from an area of another color filter, so that the relative misalignment is caused between the center of the luminescence surface of the light emitting section and the center of the color filter in the plane perpendicular to the stacking direction, with the amount of misalignment different for each region.

(13)

The display device according to (11), in which areas of the plurality of color filters gradually change in the display surface, so that the relative misalignment is caused between the center of the luminescence surface of the light emitting section and the center of the color filter in the plane perpendicular to the stacking direction.

(14)

The display device according to (2), in which a pitch at which the light emitting sections are arranged on the substrate is different from the pitch in another region in at least a partial region, so that the relative misalignment is caused between the center of the luminescence surface of the light emitting section and the center of the color filter in the plane perpendicular to the stacking direction.

(15)

The display device according to any one of (2) and (10) to (13), in which an amount of misalignment of the center of the color filter with respect to the center of the luminescence surface of the light emitting section in the plane perpendicular to the stacking direction increases toward an outer edge of the display surface.

(16) The display device according to any one of (2) and (11) to (15), in which an amount of misalignment of the center of the color filter with respect to the center of the luminescence surface of the light emitting section in the plane perpendicular to the stacking direction and a misalignment direction of the center of the color filter with respect to the center of the luminescence surface of the light emitting section in the plane perpendicular to the stacking direction are set in accordance with a viewing angle required in a pixel constituted by the light emitting section and the color filter in which the relative misalignment between the center of the luminescence surface of the light emitting section and the center of the color filter in the plane perpendicular to the stacking direction is caused.

(17)

The display device according to any one of (2) and (11) to (16), in which a misalignment direction of the center of the color filter with respect to the center of the luminescence surface of the light emitting section in the plane perpendicular to the stacking direction is a direction from a center of the display surface to a position at which the light emitting section and the color filter in which the relative misalignment between the center of the luminescence surface of the light emitting section and the center of the color in the plane perpendicular to the stacking direction is caused exist.

(18)

The display device according to any one of (1) to (17), in which the light emitting section is a light emitting element including an organic light emitting diode, and the display device is an organic EL display.

(19)

An electronic apparatus, including:

a display device configured to perform display on a basis of an image signal, in which the display device includes a plurality of light emitting sections formed on a substrate, and reflectors provided above the light emitting sections with respect to the plurality of light emitting sections positioned in at least a partial region of a display surface, lower surfaces of the reflectors reflecting part of emission light from the light emitting sections, and the light emitting sections and the reflectors are arranged in a state in which centers of the reflectors are shifted from centers of luminescence surfaces of the light emitting sections in a plane perpendicular to a stacking direction so that light emitted in a direction other than a desired direction among the emission light from the light emitting sections is reflected.

REFERENCE SIGNS LIST 1, 1a, 1b, 1c, 1d, 1e, 1f, 1g, 1h, 1i, 1i, 1k, 1l, 1m, 1n, 1p, 1q display device
10, 103 light emitting element
11, 101 first substrate
15 TFT
21 first electrode
22 second electrode
23 organic layer
24, 127 luminescence section
25 opening
31, 109 protection film
32, 111, 125 planarizing film
33, 113 CF layer
33R, 33G, 33B, 33a, 113R, 113б, 113B, 113a CF
34, 117 second substrate
35, 115 sealing resin film
51, 107 first member
52 second member
53 reflector
105, 105a pixel defining film
119 reflector
121 sealing material.
123 adhesive layer
201 display surface
401 smart phone (electronic apparatus)
411 digital camera (electronic apparatus)
431 HMD (electronic apparatus)

The invention claimed is:

1. A display device, comprising:
a plurality of light emitting elements provided above a substrate;
a reflector provided on a light extraction side of the plurality of light emitting elements,
a plurality of color filters provided on the light extraction side of the plurality of light emitting elements, and
a pixel defining film having a side wall disposed between two of the plurality of light emitting elements, wherein a light reflection surface is formed along the side wall of the pixel defining film, light emitted from one of the two of the plurality of light emitting elements is reflected toward the reflector by the light reflection surface, and wherein a relative misalignment exists between one or more of the plurality of light emitting elements and one or more of the plurality of color filters.

2. The display device according to claim 1, further comprising a planarization film provided between the plurality of color filters and the plurality of light emitting elements.

3. The display device according to claim 2, further comprising a protection film, wherein the reflector is provided between the protection film and the planarization film.

4. The display device according to claim 1, wherein the pixel defining film has openings corresponding to the plurality of light emitting elements.

5. The display device according to claim 1, further comprising a member covering the pixel defining film, wherein the member has a first refractive index that is different from a second refractive index of the pixel defining film.

6. The display device according to claim 1, wherein, in a plan view, two of the plurality of color filters overlap each of the plurality of light emitting elements.

7. The display device according to claim 1, wherein the reflector has a reflection surface facing one of the plurality of light emitting elements, and wherein a portion of the light reflected toward the reflector by the light reflection surface is reflected by the reflection surface.

8. An electronic device, comprising:
a display device including
a plurality of light emitting elements provided above a substrate;
a reflector provided on a light extraction side of the plurality of light emitting elements,
a plurality of color filters provided on the light extraction side of the plurality of light emitting elements, and
a pixel defining film having a side wall disposed between two of the plurality of light emitting elements,
wherein a light reflection surface is formed along the side wall of the pixel defining film,
light emitted from one of the two of the plurality of light emitting elements is reflected toward the reflector by the light reflection surface, and
wherein a relative misalignment exists between one or more of the plurality of light emitting elements and one or more of the plurality of color filters.

9. The electronic device according to claim 8, wherein the display device further includes a planarization film provided between the plurality of color filters and the plurality of light emitting elements.

10. The electronic device according to claim 9, wherein the display device further includes a protection film, and wherein the reflector is provided between the protection film and the planarization film.

11. The electronic device according to claim 8, wherein the pixel defining film has openings corresponding to the plurality of light emitting elements.

12. The electronic device according to claim 8, wherein the display device further includes a member covering the pixel defining film, wherein the member has a first refractive index that is different from a second refractive index of the pixel defining film.

13. The electronic device according to claim 8, wherein, in a plan view, two of the plurality of color filters overlap each of the plurality of light emitting elements.

14. The electronic device according to claim 8, wherein the reflector has a reflection surface facing one of the plurality of light emitting elements, and wherein a portion of the light reflected toward the reflector by the light reflection surface is reflected by the reflection surface.

* * * * *